United States Patent
McLaurin et al.

(10) Patent No.: US 11,569,637 B2
(45) Date of Patent: *Jan. 31, 2023

(54) MANUFACTURABLE LASER DIODE FORMED ON C-PLANE GALLIUM AND NITROGEN MATERIAL

(71) Applicant: KYOCERA SLD Laser, Inc., Goleta, CA (US)

(72) Inventors: Melvin McLaurin, Santa Barbara, CA (US); James W. Raring, Santa Barbara, CA (US); Alexander Sztein, Santa Barbara, CA (US); Po Shan Hsu, Goleta, CA (US)

(73) Assignee: KYOCERA SLD Laser, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/143,912

(22) Filed: Jan. 7, 2021

(65) Prior Publication Data

US 2021/0226421 A1 Jul. 22, 2021

Related U.S. Application Data

(63) Continuation of application No. 16/586,100, filed on Sep. 27, 2019, now Pat. No. 10,903,625, which is a
(Continued)

(51) Int. Cl.
*H01S 5/22* (2006.01)
*H01S 5/343* (2006.01)
(Continued)

(52) U.S. Cl.
CPC ........ *H01S 5/34333* (2013.01); *H01S 5/0087* (2021.01); *H01S 5/0215* (2013.01);
(Continued)

(58) Field of Classification Search
CPC .. H01S 5/34333; H01S 5/3205; H01S 5/0215; H01S 5/0217; H01S 5/2081;
(Continued)

(56) References Cited

U.S. PATENT DOCUMENTS

| 4,341,592 A | 7/1982 | Shortes et al. |
| 4,860,687 A | 8/1989 | Frijlink |

(Continued)

FOREIGN PATENT DOCUMENTS

| CN | 104836117 A | 8/2015 |
| CN | 104836118 A | 8/2015 |

(Continued)

OTHER PUBLICATIONS

Power Electronics, Retrieved from the internet: http://en.wikipedia.org/wiki/Power_electronics, Dec. 31, 2014, 24 pages.
(Continued)

*Primary Examiner* — Timor Karimy
(74) *Attorney, Agent, or Firm* — Kilpatrick Townsend & Stockton LLP

(57) ABSTRACT

A method for manufacturing a laser diode device includes providing a substrate having a surface region and forming epitaxial material overlying the surface region, the epitaxial material comprising an n-type cladding region, an active region comprising at least one active layer overlying the n-type cladding region, and a p-type cladding region overlying the active layer region. The epitaxial material is patterned to form a plurality of dice, each of the dice corresponding to at least one laser device, characterized by a first pitch between a pair of dice, the first pitch being less than a design width. Each of the plurality of dice are transferred to a carrier wafer such that each pair of dice is configured with a second pitch between each pair of dice, the second pitch being larger than the first pitch.

18 Claims, 46 Drawing Sheets

Related U.S. Application Data continuation of application No. 15/694,641, filed on Sep. 1, 2017, now Pat. No. 10,439,364, which is a continuation of application No. 15/177,710, filed on Jun. 9, 2016, now Pat. No. 9,774,170, which is a continuation of application No. 14/559,149, filed on Dec. 3, 2014, now Pat. No. 9,368,939, which is a continuation-in-part of application No. 14/480,398, filed on Sep. 8, 2014, now Pat. No. 9,520,695, and a continuation-in-part of application No. 14/312,427, filed on Jun. 23, 2014, now Pat. No. 9,379,525, and a continuation-in-part of application No. 14/176,403, filed on Feb. 10, 2014, now Pat. No. 9,362,715.

(60) Provisional application No. 61/892,981, filed on Oct. 18, 2013.

(51) Int. Cl.
*H01S 5/02* (2006.01)
*H01S 5/20* (2006.01)
*H01S 5/32* (2006.01)
*H01S 5/00* (2006.01)
*H01S 5/40* (2006.01)
*H01S 5/02325* (2021.01)
*H01S 5/02345* (2021.01)

(52) U.S. Cl.
CPC .......... *H01S 5/0217* (2013.01); *H01S 5/2081* (2013.01); *H01S 5/22* (2013.01); *H01S 5/3202* (2013.01); *H01S 5/3211* (2013.01); *H01S 5/32025* (2019.08); *H01L 2224/18* (2013.01); *H01L 2224/48091* (2013.01); *H01L 2224/48465* (2013.01); *H01L 2924/16152* (2013.01); *H01L 2924/3512* (2013.01); *H01S 5/005* (2013.01); *H01S 5/02325* (2021.01); *H01S 5/02345* (2021.01); *H01S 5/2009* (2013.01); *H01S 5/3214* (2013.01); *H01S 5/320225* (2019.08); *H01S 5/4043* (2013.01); *H01S 5/4093* (2013.01); *H01S 2301/173* (2013.01); *H01S 2301/176* (2013.01)

(58) Field of Classification Search
CPC ........ H01S 5/22; H01S 5/3202; H01S 5/3211; H01S 5/32025; H01S 5/005; H01S 5/02248; H01S 5/02276; H01S 5/2009; H01S 5/3214; H01S 5/4043; H01S 5/4093; H01S 2301/173; H01S 2301/176; H01L 2224/18; H01L 2224/4809; H01L 2224/48465; H01L 2924/16152; H01L 2924/3512
See application file for complete search history.

(56) References Cited

U.S. PATENT DOCUMENTS

| | | |
|---|---|---|
| 4,911,102 A | 3/1990 | Manabe et al. |
| 5,331,654 A | 7/1994 | Jewell et al. |
| 5,334,277 A | 8/1994 | Nakamura |
| 5,366,953 A | 11/1994 | Char |
| 5,474,021 A | 12/1995 | Tsuno et al. |
| 5,527,417 A | 6/1996 | Iida et al. |
| 5,562,127 A | 10/1996 | Fanselow et al. |
| 5,607,899 A | 3/1997 | Yoshida et al. |
| 5,632,812 A | 5/1997 | Hirabayashi |
| 5,696,389 A | 12/1997 | Ishikawa et al. |
| 5,710,057 A | 1/1998 | Kenney |
| 5,821,555 A | 10/1998 | Saito et al. |
| 5,888,907 A | 3/1999 | Tomoyasu et al. |
| 5,926,493 A | 7/1999 | O'Brien et al. |
| 5,951,923 A | 9/1999 | Horie et al. |
| 5,985,687 A | 11/1999 | Bowers et al. |
| 6,069,394 A | 5/2000 | Hashimoto et al. |
| 6,147,953 A | 11/2000 | Duncan |
| 6,153,010 A | 11/2000 | Kiyoku et al. |
| 6,239,454 B1 | 5/2001 | Glew et al. |
| 6,379,985 B1 | 4/2002 | Cervantes et al. |
| 6,451,157 B1 | 9/2002 | Hubacek |
| 6,489,636 B1 | 12/2002 | Goetz et al. |
| 6,562,127 B1 | 5/2003 | Kud et al. |
| 6,586,762 B2 | 7/2003 | Kozaki |
| 6,635,904 B2 | 10/2003 | Goetz et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,920,166 B2 | 7/2005 | Akasaka et al. |
| 7,009,199 B2 | 3/2006 | Hall |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,128,849 B2 | 10/2006 | Setlur et al. |
| 7,220,324 B2 | 5/2007 | Baker et al. |
| 7,303,630 B2 | 12/2007 | Motoki et al. |
| 7,312,156 B2 | 12/2007 | Granneman et al. |
| 7,323,723 B2 | 1/2008 | Ohtsuka et al. |
| 7,338,828 B2 | 3/2008 | Imer et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,470,555 B2 | 12/2008 | Matsumura |
| 7,483,466 B2 | 1/2009 | Uchida et al. |
| 7,489,441 B2 | 2/2009 | Scheible et al. |
| 7,555,025 B2 | 6/2009 | Yoshida |
| 7,691,658 B2 | 4/2010 | Kaeding et al. |
| 7,727,332 B2 | 6/2010 | Habel et al. |
| 7,733,571 B1 | 6/2010 | Li |
| 7,749,326 B2 | 7/2010 | Kim et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 8,017,932 B2 | 9/2011 | Okamoto et al. |
| 8,044,412 B2 | 10/2011 | Murphy et al. |
| 8,124,996 B2 | 2/2012 | Raring et al. |
| 8,126,024 B1 | 2/2012 | Raring |
| 8,143,148 B1 | 3/2012 | Raring et al. |
| 8,242,522 B1 | 8/2012 | Raring |
| 8,247,887 B1 | 8/2012 | Raring et al. |
| 8,252,662 B1 | 8/2012 | Poblenz et al. |
| 8,254,425 B1 | 8/2012 | Raring |
| 8,259,769 B1 | 9/2012 | Raring et al. |
| 8,294,179 B1 | 10/2012 | Raring |
| 8,314,429 B1 | 11/2012 | Raring et al. |
| 8,351,478 B2 | 1/2013 | Raring et al. |
| 8,355,418 B2 | 1/2013 | Raring et al. |
| 8,422,525 B1 | 4/2013 | Raring et al. |
| 8,563,343 B2 | 10/2013 | Motoda |
| 8,634,442 B1 | 1/2014 | Raring et al. |
| 9,209,596 B1 | 12/2015 | McLaurin et al. |
| 9,246,311 B1 | 1/2016 | Raring et al. |
| 9,362,715 B2 | 6/2016 | Sztein et al. |
| 9,368,939 B2 | 6/2016 | McLaurin et al. |
| 9,379,525 B2 | 6/2016 | McLaurin et al. |
| 9,401,584 B1 | 7/2016 | McLaurin et al. |
| 9,520,695 B2 | 12/2016 | Hsu et al. |
| 9,520,697 B2 | 12/2016 | Steigerwald et al. |
| 9,531,164 B2 | 12/2016 | Raring et al. |
| 9,543,738 B2 | 1/2017 | Raring et al. |
| 9,653,642 B1 | 5/2017 | Raring et al. |
| 9,666,677 B1 | 5/2017 | Raring et al. |
| 9,711,949 B1 | 7/2017 | Raring et al. |
| 9,755,398 B2 | 9/2017 | Sztein et al. |
| 9,762,032 B1 | 9/2017 | McLaurin et al. |

(56) References Cited

U.S. PATENT DOCUMENTS

| | | |
|---|---|---|
| 9,774,170 B2 | 9/2017 | McLaurin et al. |
| 9,871,350 B2 | 1/2018 | McLaurin et al. |
| 9,882,353 B2 | 1/2018 | Hsu et al. |
| 10,002,928 B1 | 6/2018 | Raring et al. |
| 10,141,714 B2 | 11/2018 | Sztein et al. |
| 10,193,309 B1 | 1/2019 | Raring et al. |
| 10,367,334 B2 | 7/2019 | McLaurin et al. |
| 10,439,364 B2 | 10/2019 | McLaurin et al. |
| 10,566,767 B2 | 2/2020 | Steigerwald et al. |
| 10,629,689 B1 | 4/2020 | Raring et al. |
| 10,658,810 B2 | 5/2020 | Sztein et al. |
| 10,720,757 B1 | 7/2020 | Raring et al. |
| 10,749,315 B2 | 8/2020 | McLaurin et al. |
| 10,854,776 B1 | 12/2020 | Raring et al. |
| 10,854,777 B1 | 12/2020 | Raring et al. |
| 10,854,778 B1 | 12/2020 | Raring et al. |
| 10,903,625 B2 * | 1/2021 | McLaurin ............ H01S 5/2201 |
| 2002/0050488 A1 | 5/2002 | Nikitin et al. |
| 2002/0085603 A1 | 7/2002 | Okumura |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0140846 A1 | 7/2003 | Biwa et al. |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0104391 A1 | 6/2004 | Maeda et al. |
| 2004/0112866 A1 | 6/2004 | Maleville et al. |
| 2004/0151222 A1 | 8/2004 | Sekine |
| 2004/0196877 A1 | 10/2004 | Kawakami et al. |
| 2004/0209402 A1 | 10/2004 | Chai et al. |
| 2004/0222357 A1 | 11/2004 | King et al. |
| 2004/0247275 A1 | 12/2004 | Vakhshoori et al. |
| 2004/0259331 A1 | 12/2004 | Ogihara et al. |
| 2004/0262624 A1 | 12/2004 | Akita et al. |
| 2005/0040384 A1 | 2/2005 | Tanaka et al. |
| 2005/0072986 A1 | 4/2005 | Sasaoka |
| 2005/0158896 A1 | 7/2005 | Hayashi et al. |
| 2005/0168564 A1 | 8/2005 | Kawaguchi et al. |
| 2005/0199893 A1 | 9/2005 | Lan et al. |
| 2005/0224826 A1 | 10/2005 | Keuper et al. |
| 2005/0229855 A1 | 10/2005 | Raaijmakers |
| 2005/0285128 A1 | 12/2005 | Scherer et al. |
| 2006/0030738 A1 | 2/2006 | Vanmaele et al. |
| 2006/0037529 A1 | 2/2006 | D'Evelyn et al. |
| 2006/0038193 A1 | 2/2006 | Wu et al. |
| 2006/0060131 A1 | 3/2006 | Atanackovic |
| 2006/0066319 A1 | 3/2006 | Dallenbach et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0110926 A1 | 5/2006 | Hu et al. |
| 2006/0118799 A1 | 6/2006 | D'Evelyn et al. |
| 2006/0126688 A1 | 6/2006 | Kneissl |
| 2006/0144334 A1 | 7/2006 | Mm et al. |
| 2006/0175624 A1 | 8/2006 | Sharma et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0216416 A1 | 9/2006 | Sumakeris et al. |
| 2006/0256482 A1 | 11/2006 | Araki et al. |
| 2006/0288928 A1 | 12/2006 | Eom et al. |
| 2007/0081857 A1 | 4/2007 | Yoon |
| 2007/0086916 A1 | 4/2007 | LeBoeuf et al. |
| 2007/0093073 A1 | 4/2007 | Farrell, Jr. et al. |
| 2007/0109463 A1 | 5/2007 | Hutchins |
| 2007/0110112 A1 | 5/2007 | Sugiura |
| 2007/0120141 A1 | 5/2007 | Moustakas et al. |
| 2007/0163490 A1 | 7/2007 | Habel et al. |
| 2007/0166853 A1 | 7/2007 | Guenther et al. |
| 2007/0217462 A1 | 9/2007 | Yamasaki |
| 2007/0242716 A1 | 10/2007 | Samal et al. |
| 2007/0252164 A1 | 11/2007 | Zhong et al. |
| 2007/0280320 A1 | 12/2007 | Feezell et al. |
| 2008/0087919 A1 | 4/2008 | Tysoe et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0138919 A1 | 6/2008 | Mueller et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1 | 8/2008 | Feezell et al. |
| 2008/0191223 A1 | 8/2008 | Nakamura et al. |
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0219309 A1 | 9/2008 | Hata et al. |
| 2008/0232416 A1 | 9/2008 | Okamoto et al. |
| 2008/0267238 A1 | 10/2008 | Takeuchi et al. |
| 2008/0285609 A1 | 11/2008 | Ohta et al. |
| 2008/0291961 A1 | 11/2008 | Kamikawa et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0058532 A1 | 3/2009 | Kikkawa et al. |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0141765 A1 | 6/2009 | Kohda et al. |
| 2009/0159869 A1 | 6/2009 | Ponce et al. |
| 2009/0173957 A1 | 7/2009 | Brunner et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0291518 A1 | 11/2009 | Kim et al. |
| 2009/0298265 A1 | 12/2009 | Fujiwara |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0320744 A1 | 12/2009 | D'Evelyn |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0006873 A1 | 1/2010 | Raring et al. |
| 2010/0008391 A1 | 1/2010 | Nakagawa et al. |
| 2010/0025656 A1 | 2/2010 | Raring et al. |
| 2010/0031875 A1 | 2/2010 | D'Evelyn |
| 2010/0044718 A1 | 2/2010 | Hanser et al. |
| 2010/0059790 A1 | 3/2010 | Takeuchi |
| 2010/0096615 A1 | 4/2010 | Okamoto et al. |
| 2010/0104495 A1 | 4/2010 | Kawabata et al. |
| 2010/0140745 A1 | 6/2010 | Khan et al. |
| 2010/0151194 A1 | 6/2010 | D'Evelyn |
| 2010/0195687 A1 | 8/2010 | Okamoto et al. |
| 2010/0220262 A1 | 9/2010 | DeMille et al. |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2010/0329297 A1 | 12/2010 | Rumpler et al. |
| 2011/0044022 A1 | 2/2011 | Ko et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0075694 A1 | 3/2011 | Yoshizumi et al. |
| 2011/0103418 A1 | 5/2011 | Hardy et al. |
| 2011/0133489 A1 | 6/2011 | Hemeury et al. |
| 2011/0164637 A1 | 7/2011 | Yoshizumi et al. |
| 2011/0164646 A1 | 7/2011 | Maeda et al. |
| 2011/0180781 A1 | 7/2011 | Raring et al. |
| 2011/0182056 A1 | 7/2011 | Trottier et al. |
| 2011/0186874 A1 | 8/2011 | Shum |
| 2011/0186887 A1 | 8/2011 | Trottier et al. |

(56) References Cited

U.S. PATENT DOCUMENTS

| | | |
|---|---|---|
| 2011/0204376 A1 | 8/2011 | Su et al. |
| 2011/0216795 A1 | 9/2011 | Hsu et al. |
| 2011/0233587 A1 | 9/2011 | Unno |
| 2011/0247556 A1 | 10/2011 | Raring et al. |
| 2012/0178198 A1 | 7/2012 | Raring et al. |
| 2012/0187412 A1 | 7/2012 | D'Evelyn et al. |
| 2012/0314398 A1 | 12/2012 | Raring et al. |
| 2013/0214284 A1 | 8/2013 | Holder et al. |
| 2013/0234111 A1 | 9/2013 | Pfister et al. |
| 2013/0313516 A1 | 11/2013 | David et al. |
| 2014/0023102 A1 | 1/2014 | Holder et al. |
| 2015/0111325 A1 | 4/2015 | Hsu et al. |
| 2015/0140710 A1 | 5/2015 | McLaurin et al. |
| 2015/0229100 A1 | 8/2015 | Sztein et al. |
| 2015/0229107 A1 | 8/2015 | McLaurin et al. |
| 2015/0229108 A1 | 8/2015 | Steigerwald et al. |
| 2016/0294162 A1 | 10/2016 | McLaurin et al. |
| 2016/0359294 A1 | 12/2016 | Sztein et al. |
| 2016/0372893 A1 | 12/2016 | McLaurin et al. |
| 2017/0063045 A1 | 3/2017 | McLaurin et al. |
| 2017/0063047 A1 | 3/2017 | Steigerwald et al. |
| 2017/0077677 A1 | 3/2017 | Hsu et al. |
| 2018/0013265 A1 | 1/2018 | McLaurin et al. |
| 2018/0159302 A1 | 6/2018 | McLaurin et al. |
| 2019/0109432 A1 | 4/2019 | Sztein et al. |
| 2020/0244046 A1 | 7/2020 | McLaurin et al. |
| 2020/0350740 A1 | 11/2020 | Sztein et al. |

FOREIGN PATENT DOCUMENTS

| | | |
|---|---|---|
| CN | 204732408 U | 10/2015 |
| CN | 204732675 U | 10/2015 |
| CN | 204760748 U | 11/2015 |
| CN | 204793617 U | 11/2015 |
| CN | 205508818 U | 8/2016 |
| CN | 205509229 U | 8/2016 |
| CN | 106165218 A | 11/2016 |
| DE | 102014223196 A1 | 8/2015 |
| EP | 3105829 A1 | 12/2016 |
| JP | H11-135891 A | 5/1999 |
| JP | 2000-228565 A | 8/2000 |
| JP | 2002-015965 A | 1/2002 |
| JP | 2007068398 A | 3/2007 |
| JP | 2007173467 A | 7/2007 |
| JP | 2007-200932 A | 8/2007 |
| JP | 2008-135418 A | 6/2008 |
| JP | 2008-252069 A | 10/2008 |
| JP | 2009-123939 A | 6/2009 |
| JP | 2011-009521 A | 1/2011 |
| JP | 2011-204983 A | 10/2011 |
| KR | 1020160121558 A | 10/2016 |
| WO | 2008/041521 A1 | 4/2008 |
| WO | 2015120118 A1 | 8/2015 |

OTHER PUBLICATIONS

Transistor, Retrieved from http://en.wikipedia.org/wiki/Transistor, Dec. 31, 2014, 25 pages.
U.S. Appl. No. 12/481,543, Non-Final Office Action dated Jun. 27, 2011, 10 pages.
U.S. Appl. No. 12/482,440, Final Office Action dated Aug. 12, 2011, 7 pages.
U.S. Appl. No. 12/482,440, Non-Final Office Action dated Feb. 23, 2011, 6 pages.
U.S. Appl. No. 12/484,924, Final Office Action dated Oct. 31, 2011, 11 pages.
U.S. Appl. No. 12/484,924, Non-Final Office Action dated Apr. 14, 2011, 12 pages.
U.S. Appl. No. 12/491,169, Final Office Action dated May 11, 2011, 10 pages.
U.S. Appl. No. 12/491,169, Non-Final Office Action dated Oct. 22, 2010, 10 pages.
U.S. Appl. No. 12/497,289, Non-Final Office Action dated Feb. 2, 2012, 7 pages.
U.S. Appl. No. 12/497,289, Notice of Allowance dated May 22, 2012, 7 pages.
U.S. Appl. No. 12/502,058, Final Office Action dated Aug. 19, 2011, 13 pages.
U.S. Appl. No. 12/502,058, Non-Final Office Action dated Dec. 8, 2010, 15 pages.
U.S. Appl. No. 12/502,058, Notice of Allowance dated Apr. 16, 2012, 10 pages.
U.S. Appl. No. 12/534,829, Non-Final Office Action dated Apr. 19, 2011, 9 pages.
U.S. Appl. No. 12/534,829, Notice of Allowance dated Dec. 21, 2011, 4 pages.
U.S. Appl. No. 12/534,829, Notice of Allowance dated Dec. 5, 2011, 7 pages.
U.S. Appl. No. 12/534,829, Notice of Allowance dated Oct. 28, 2011, 8 pages.
U.S. Appl. No. 12/573,820, Final Office Action dated Oct. 11, 2011, 23 pages.
U.S. Appl. No. 12/573,820, Non-Final Office Action dated Mar. 2, 2011, 19 pages.
U.S. Appl. No. 12/573,820, filed Oct. 5, 2009, 32 pages.
U.S. Appl. No. 12/727,148, filed Mar. 18, 2010, 41 pages.
U.S. Appl. No. 12/749,466, Final Office Action dated Feb. 3, 2012, 16 pages.
U.S. Appl. No. 12/749,466, Non-Final Office Action dated Jun. 29, 2011, 20 pages.
U.S. Appl. No. 12/749,466, Non-Final Office Action dated Jul. 3, 2012, 18 pages.
U.S. Appl. No. 12/749,466, Notice of Allowance dated Jan. 2, 2013, 8 pages.
U.S. Appl. No. 12/749,476, Final Office Action dated Nov. 8, 2011, 11 pages.
U.S. Appl. No. 12/749,476, Non-Final Office Action dated Apr. 11, 2011, 15 pages.
U.S. Appl. No. 12/749,476, Notice of Allowance dated May 4, 2012, 8 pages.
U.S. Appl. No. 12/749,476, Notice of Allowance dated Jun. 26, 2012, 8 pages.
U.S. Appl. No. 12/759,273, Non-Final Office Action dated Nov. 21, 2011, 10 pages.
U.S. Appl. No. 12/759,273, Non-Final Office Action dated Apr. 3, 2014, 15 pages.
U.S. Appl. No. 12/759,273, Non-Final Office Action dated Jan. 29, 2015, 15 pages.
U.S. Appl. No. 12/759,273, Non-Final Office Action dated Sep. 23, 2015, 17 pages.
U.S. Appl. No. 12/759,273, Final Office Action dated Mar. 29, 2016, 12 pages.
U.S. Appl. No. 12/759,273, Final Office Action dated Jun. 8, 2015, 17 pages.
U.S. Appl. No. 12/759,273, Final Office Action dated Oct. 24, 2014, 16 pages.
U.S. Appl. No. 12/759,273, Final Office Action dated Jun. 26, 2012, 10 pages.
U.S. Appl. No. 12/759,273 Notice of Allowance dated Aug. 19, 2016, 8 pages.
U.S. Appl. No. 12/762,269, Non-Final Office Action dated Oct. 12, 2011, 12 pages.
U.S. Appl. No. 12/762,269, Notice of Allowance dated Apr. 23, 2012, 8 pages.
U.S. Appl. No. 12/762,271, Final Office Action dated Jun. 6, 2012, 13 pages.
U.S. Appl. No. 12/762,271, Non-Final Office Action dated Dec. 23, 2011, 12 pages.
U.S. Appl. No. 12/762,271 Notice of Allowance dated Aug. 8, 2012, 8 pages.
U.S. Appl. No. 12/762,278, Notice of Allowance dated Nov. 7, 2011, 11 pages.
U.S. Appl. No. 12/778,718, Non-Final Office Action dated Nov. 25, 2011, 12 pages.

(56) References Cited

OTHER PUBLICATIONS

U.S. Appl. No. 12/778,718, Notice of Allowance dated Apr. 3, 2012, 14 pages.
U.S. Appl. No. 12/778,718, Notice of Allowance dated Jun. 13, 2012, 7 pages.
U.S. Appl. No. 12/868,441, Non-Final Office Action dated Apr. 30, 2012, 12 pages.
U.S. Appl. No. 12/868,441 Final Office Action dated Dec. 18, 2012, 33 pages.
U.S. Appl. No. 12/868,441 Notice of Allowance dated Sep. 18, 2013, 13 pages.
U.S. Appl. No. 12/873,820, Non-Final Office Action dated Oct. 4, 2012, 10 pages.
U.S. Appl. No. 12/880,803, Non-Final Office Action dated Feb. 22, 2012, 9 pages.
U.S. Appl. No. 12/880,889, filed Sep. 13, 2010, 18 pages.
U.S. Appl. No. 12/883,093, Final Office Action dated Aug. 3, 2012, 13 pages.
U.S. Appl. No. 12/883,093, Non-Final Office Action dated Mar. 13, 2012, 12 pages.
U.S. Appl. No. 12/883,093, Notice of Allowance dated Nov. 21, 2012, 12 pages.
U.S. Appl. No. 12/883,652, Non-Final Office Action dated Apr. 17, 2012, 8 pages.
U.S. Appl. No. 12/883,652, Non-Final Office Action dated May 14, 2014, 13 pages.
U.S. Appl. No. 12/883,652, Non-Final Office Action dated Jun. 3, 2015, 16 pages.
U.S. Appl. No. 12/883,652, Non-Final Office Action dated Apr. 5, 2016, 11 pages.
U.S. Appl. No. 12/883,652 Notice of Allowance dated Aug. 30, 2016, 7 pages.
U.S. Appl. No. 12/883,652, Final Office Action dated Jan. 11, 2013, 11 pages.
U.S. Appl. No. 12/883,652, Final Office Action dated Dec. 19, 2014, 16 pages.
U.S. Appl. No. 12/883,652, Final Office Action dated Oct. 26, 2015, 11 pages.
U.S. Appl. No. 12/884,993, Final Office Action dated Aug. 2, 2012, 15 pages.
U.S. Appl. No. 12/884,993, Non-Final Office Action dated Mar. 16, 2012, 15 pages.
U.S. Appl. No. 12/884,993, Notice of Allowance dated Nov. 26, 2012, 11 pages.
U.S. Appl. No. 13/014,622, Final Office Action dated Apr. 30, 2012, 14 pages.
U.S. Appl. No. 13/014,622, Final Office Action dated May 11, 2015, 14 pages.
U.S. Appl. No. 13/014,622, Non-Final Office Action dated Nov. 28, 2011, 14 pages.
U.S. Appl. No. 13/014,622, Non-Final Office Action dated Jun. 20, 2014, 15 pages.
U.S. Appl. No. 13/046,565, Final Office Action dated Feb. 2, 2012, 17 pages.
U.S. Appl. No. 13/046,565, Final Office Action dated Jul. 19, 2012, 23 pages.
U.S. Appl. No. 13/046,565, Non-Final Office Action dated Nov. 7, 2011, 17 pages.
U.S. Appl. No. 13/046,565, Non-Final Office Action dated Apr. 13, 2012, 40 pages.
U.S. Appl. No. 14/175,622, Non-Final Office Action dated Apr. 27, 2015, 13 pages.
U.S. Appl. No. 14/175,622, Notice of Allowance dated Aug. 10, 2015, 9 pages.
U.S. Appl. No. 14/175,622, Restriction Requirement dated Feb. 10, 2015, 8 pages.
U.S. Appl. No. 14/176,403, Corrected Notice of Allowability dated Mar. 28, 2016, 2 pages.
U.S. Appl. No. 14/176,403, Non-Final Office Action dated Sep. 11, 2015, 13 pages.
U.S. Appl. No. 14/176,403, Notice of Allowance dated Feb. 12, 2016, 8 pages.
U.S. Appl. No. 14/312,427, Corrected Notice of Allowability dated Mar. 31, 2016, 2 pages.
U.S. Appl. No. 14/312,427, Final Office Action dated Dec. 16, 2015, 18 pages.
U.S. Appl. No. 14/312,427, Non-Final Office Action dated Aug. 21, 2015, 13 pages.
U.S. Appl. No. 14/312,427, Notice of Allowance dated Mar. 4, 2016, 8 pages.
U.S. Appl. No. 14/312,427, Restriction Requirement dated May 18, 2015, 7 pages.
U.S. Appl. No. 14/480,398, Non-Final Office Action dated Mar. 17, 2016, 17 pages.
U.S. Appl. No. 14/480,398, Notice of Allowance dated Aug. 12, 2016, 9 pages.
U.S. Appl. No. 14/480,398, Restriction Requirement dated Oct. 22, 2015, 5 pages.
U.S. Appl. No. 14/534,636, Non-Final Office Action dated Jun. 3, 2015, 9 pages.
U.S. Appl. No. 14/534,636, Notice of Allowance dated Sep. 15, 2015, 11 pages.
U.S. Appl. No. 14/559,149, Corrected Notice of Allowability dated Mar. 21, 2016, 2 pages.
U.S. Appl. No. 14/559,149, Notice of Allowance dated Feb. 17, 2016, 10 pages.
U.S. Appl. No. 14/559,149, Restriction Requirement dated Oct. 29, 2015, 6 pages.
U.S. Appl. No. 14/580,693, Non-Final Office Action dated Jun. 16, 2016, 23 pages.
U.S. Appl. No. 14/580,693, Notice of Allowance dated Jan. 17, 2017, 8 pages.
U.S. Appl. No. 14/580,693, filed Dec. 23, 2014, 161 pages.
U.S. Appl. No. 14/600,506, Non-Final Office Action dated Mar. 8, 2016, 7 pages.
U.S. Appl. No. 14/600,506, Notice of Allowance dated on Aug. 9, 2016, 8 pages.
U.S. Appl. No. 14/600,506, Restriction Requirement dated Nov. 25, 2015, 6 pages.
U.S. Appl. No. 14/931,743, Notice of Allowance dated Mar. 31, 2016, 10 pages.
U.S. Appl. No. 14/968,710, First Action Interview Pilot Program Pre-Interview Communication dated Jan. 12, 2017, 3 pages.
U.S. Appl. No. 14/968,710, Notice of Allowance dated Mar. 3, 2017, 12 pages.
U.S. Appl. No. 14/968,710, filed Dec. 14, 2015, 78 pages.
U.S. Appl. No. 15/173,441, Non-Final Office Action dated Dec. 29, 2016, 6 pages.
U.S. Appl. No. 15/173,441, Notice of Allowance dated Apr. 13, 2017, 8 pages.
U.S. Appl. No. 15/173,441, filed Jun. 3, 2016, 43 pages.
U.S. Appl. No. 15/176,076, Non-Final Office Action dated Jun. 6, 2017, 14 pages.
U.S. Appl. No. 15/176,076, Restriction Requirement dated Dec. 30, 2016, 4 pages.
U.S. Appl. No. 15/176,076, Non-Final Office Action dated Apr. 30, 2018, 10 pages.
U.S. Appl. No. 15/176,076 Notice of Allowance dated Mar. 6, 2019, 7 pages.
U.S. Appl. No. 15/176,076 Final Office Action dated Dec. 8, 2017, 11 pages.
U.S. Appl. No. 15/176,076 Final Office Action dated Nov. 15, 2018, 10 pages.
U.S. Appl. No. 15/177,710, Corrected Notice of Allowability dated Aug. 16, 2017, 2 pages.
U.S. Appl. No. 15/177,710, Corrected Notice of Allowability dated May 31, 2017, 2 pages.
U.S. Appl. No. 15/177,710, Non-Final Office Action dated Dec. 30, 2016, 8 pages.
U.S. Appl. No. 15/177,710, Notice of Allowance dated May 2, 2017, 10 pages.
U.S. Appl. No. 15/180,737, Notice of Allowance dated Aug. 25, 2017, 11 pages.

(56) References Cited

OTHER PUBLICATIONS

U.S. Appl. No. 15/180,737, Restriction Requirement dated May 11, 2017, 7 pages.
U.S. Appl. No. 15/209,309, Notice of Allowance dated Dec. 19, 2016, 12 pages.
U.S. Appl. No. 15/209,309, filed Jul. 13, 2016, 192 pages.
U.S. Appl. No. 15/218,690, Non-Final Office Action dated Feb. 7, 2017, 9 pages.
U.S. Appl. No. 15/218,690 Notice of Allowance dated May 11, 2017, 10 pages.
U.S. Appl. No. 15/351,326, Non-Final Office Action dated Jul. 14, 2017, 15 pages.
U.S. Appl. No. 15/351,326, Final Office Action dated Jan. 18, 2018, 14 pages.
U.S. Appl. No. 15/351,326, Final Office Action dated Dec. 7, 2018, 16 pages.
U.S. Appl. No. 15/351,326, Non-Final Office Action dated Jun. 1, 2018, 13 pages.
U.S. Appl. No. 15/351,326, Ex Parte Quayle Action mailed on Jun. 25, 2019, 4 pages.
U.S. Appl. No. 15/351,326, Notice of Allowance dated Sep. 25, 2019, 8 pages.
U.S. Appl. No. 15/356,302, Non-Final Office Action dated May 5, 2017, 8 pages.
U.S. Appl. No. 15/356,302, Notice of Allowance dated Sep. 19, 2017, 8 pages.
U.S. Appl. No. 15/480,239, Non-Final Office Action dated Jul. 3, 2017, 13 pages.
U.S. Appl. No. 15/480,239, Final Office Action dated Oct. 24, 2017, 15 pages.
U.S. Appl. No. 15/480,239, Notice of Allowance dated Feb. 20, 2018, 8 pages.
U.S. Appl. No. 15/612,897 Non-Final Office Action dated Jun. 21, 2018, 5 pages.
U.S. Appl. No. 15/612,897 Notice of Allowance dated Sep. 12, 2018, 7 pages.
U.S. Appl. No. 15/675,532 Non-Final Office Action dated Dec. 18, 2017, 11 pages.
U.S. Appl. No. 15/675,532 Notice of Allowance dated Jul. 19, 2018, 7 pages.
U.S. Appl. No. 15/694,641, Non-Final Office Action dated Jan. 24, 2019, 9 pages.
U.S. Appl. No. 15/694,641 Notice of Allowance dated May 8, 2019, 9 pages.
U.S. Appl. No. 15/559,149, filed Jun. 9, 2016.
U.S. Appl. No. 15/820,160 Non-Final Office Action dated Nov. 20, 2019, 8 pages.
U.S. Appl. No. 15/820,160 Notice of Allowance dated Apr. 1, 2020, 9 pages.
U.S. Appl. No. 16/005,255 Notice of Allowance dated Dec. 17, 2019, 5 pages.
U.S. Appl. No. 16/199,974 Notice of Allowance dated Jan. 15, 2020, 8 pages.
U.S. Appl. No. 16/217,359 Non-Final Office Action dated Nov. 8, 2019, 8 pages.
U.S. Appl. No. 16/217,359 Notice of Allowance dated Mar. 10, 2020, 10 pages.
U.S. Appl. No. 16/586,100 Non-Final Office Action dated Jun. 8, 2020, 5 pages.
U.S. Appl. No. 16/586,100 Notice of Allowance dated Sep. 16, 2020, 9 pages.
U.S. Appl. No. 16/791,652 Non-Final Office Action dated Sep. 25, 2020, 8 pages.
U.S. Appl. No. 16/791,652 Notice of Allowance dated Jan. 13, 2021, 8 pages.
U.S. Appl. No. 16/796,154 Notice of Allowance dated Jul. 28, 2020, 9 pages.
U.S. Appl. No. 16/796,154 Ex Parte Quayle Action mailed Jul. 8, 2020, 6 pages.
U.S. Appl. No. 16/796,183 Non-Final Office Action dated Jul. 8, 2020, 8 pages.
U.S. Appl. No. 16/796,183 Notice of Allowance dated Jul. 31, 2020, 12 pages.
U.S. Appl. No. 16/835,082 Non-Final Office Action dated Jul. 9, 2020, 11 pages.
U.S. Appl. No. 16/835,082 Notice of Allowance dated Jul. 31, 2020, 9 pages.
U.S. Appl. No. 16/844,299 Non-Final Office Action dated Mar. 3, 2021, 10 pages.
U.S. Appl. No. 16/876,569 Non-Final Office Action dated Dec. 21, 2020, 8 pages.
Abare et al., Cleaved and Etched Facet Nitride Laser Diodes, IEEE Journal of Selected Topics in Quantum Electronics, vol. 4, No. 3, 1998, pp. 505-509.
Amano et al., P-Type Conduction in Mg-Doped GaN Treated with Low-Energy Electron Beam Irradiation (LEEBI), Japanese Journal of Applied Physics, vol. 28, No. 12, Dec. 1989, pp. L2112-L2114.
Aoki et al., InGaAs/InGaAsP MQW Electroabsorption Modulator Integrated with a DFB Laser Fabricated by Band-Gap Energy Control Selective Area MOCVD, IEEE Journal of Quantum Electronics, vol. 29, No. 6, Jun. 1993, pp. 2088-2096.
Asano et al., 100-mW Kink-Free Blue-Violet Laser Diodes with Low Aspect Ratio, IEEE Journal of Quantum Electronics, vol. 39, No. 1, Jan. 2003, pp. 135-140.
Bernardini et al., Spontaneous Polarization and Piezoelectric Constants of III-V Nitrides, Physical Review B, vol. 56, No. 16, Oct. 15, 1997, pp. 10024-10027.
Caneau et al., Studies on the Selective OMVPE of (Ga,In)/(As,P), Journal of Crystal Growth, vol. 124, Nov. 1, 1992, pp. 243-248.
Chen et al., Growth and Optical Properties of Highly Uniform and Periodic InGaN Nanostructures, Advanced Materials, vol. 19, 2007, pp. 1707-1710.
D'Evelyn et al., Bulk GaN Crystal Growth by the High-Pressure Ammonothermal Method, Journal of Crystal Growth, vol. 300, No. 1, Mar. 1, 2007, pp. 11-16.
European Application No. 15746370.4, Extended European Search Report dated Jul. 11, 2017, 11 pages.
Founta et al., Anisotropic Morphology of Nonpolar a-Plan GaN Quantum Dots and Quantum Wells, Journal of Applied Physics, vol. 102, No. 7, 2007, pp. 074304-1-074304-6.
Fujii et al., Increase in the Extraction Efficiency of GaN-Based Light-Emitting Diodes via Surface Roughening, Applied Physics Letters, vol. 84, No. 6, 2004, pp. 855-857.
Funato et al., Blue, Green, and Amber InGaN/GaN Light-Emitting Diodes on Semipolar {1122} GaN Bulk Substrates, Journal of Japanese Applied Physics, vol. 45, No. 26, 2006, pp. L659-L662.
Funato et al., Monolithic Polychromatic Light-Emitting Diodes Based on InGaN Microfacet Quantum Wells toward Tailor-Made Solid-State Lighting, Applied Physics Express, vol. 1, No. 1, 2008, pp. 011106-1-011106-3.
Gardner et al., Blue-Emitting InGaN—GaN Double-Heterostructure Light-Emitting Diodes Reaching Maximum Quantum Efficiency Above 200A/cm2, Applied Physics Letters, vol. 91, 2007, pp. 243506-1-243506-3.
Hiramatsu et al., Selective Area Growth and Epitaxial Lateral Overgrowth of GaN by Metalorganic Vapor Phase Epitaxy and Hydride Vapor Phase Epitaxy, Materials Science and Engineering: B, vol. 59, Issue 1-3, May 6, 1999, pp. 104-111.
Hjort, Sacrificial Etching of III-V Compounds for Micromechanical Devices, J. Micromech. Miroeng., vol. 6, 1996, pp. 370-375.
Holder et al., Demonstration of Nonpolar GaN-Based Vertical-Cavity Surface-Emitting Lasers, Appl. Phys. Express, vol. 5, No. 9, 2012, pp. 092104-1-092104-3.
Iso et al., High Brightness Blue InGaN/GaN Light Emitting Diode on Nonpolar m-Plane Bulk GaN Substrate, Japanese Journal of Applied Physics, vol. 46, No. 40, 2007, pp. L960-L962.
Kendall et al., Energy Savings Potential of Solid State Lighting in General Lighting Applications, Report for the Department of Energy, 2001, 35 pages.
Khan et al., Cleaved Cavity Optically Pumped InGaN—GaN Laser Grown on Spinel Substrates, Applied Physics Letters, vol. 69, No. 16, Oct. 14, 1996, pp. 2418-2420.

(56) References Cited

OTHER PUBLICATIONS

Kim et al., Improved Electroluminescence on Nonpolar m-Plane InGaN/GaN Qantum Well LEDs, Physica Status Solidi (RRL), vol. 1, No. 3, 2007, pp. 125-127.
Kuramoto et al., Novel Ridge-Type InGaN Multiple-Quantum-Well Laser Diodes Fabricated by Selective Area Re-Growth on n-GaN Substrates, Journal of Japanese Applied Physics, vol. 40, 2001, pp. L925-L927.
Lidow et al., Gallium Nitride (GaN) Technology Overview, EPC White Paper:WP001, 2012, pp. 1-6.
Lin et al., Influence of Separate Confinement Heterostructure Layer on Carrier Distribution in InGaAsP Laser Diodes with Nonidentical Multiple Quantum Wells, Japanese Journal of Applied Physics, vol. 43, No. 10, 2004, pp. 7032-7035.
Masui et al., Electrical Characteristics of Nonpolar InGaN-Based Light-Emitting Diodes Evaluated at Low Temperature, Japanese Journal of Applied Physics, vol. 46, No. 11, 2007, pp. 7309-7310.
Michiue et al., Recent Development of Nitride LEDs and LDs, Proceedings of SPIE, vol. 7216, 2009, pp. 72161Z-1-72161Z-6.
Nakamura et al., Candela-Class High-Brightness InGaN/AlGaN Double-Heterostructure Blue-Light-Emitting Diodes, Appl. Phys. Lett.,vol. 64, No. 13, 1994, pp. 1687-1689.
Nakamura et al., InGaN/GaN/AlGaN-Based Laser Diodes with Modulation-Doped Strained-Layer Superlattices Grown on an Epitaxially Laterally Overgrown GaN Substrate, Applied Physics Letters, vol. 72, No. 2, 1998, pp. 211-213.
Nakamura et al., P—GaN/n-InGaN/n-GaN Double-Heterostructure Blue-Light-Emitting Diodes, Jpn. J. Appl. Phys., vol. 32, 1993, pp. L8-L11.
Nam et al., Lateral Epitaxial Overgrowth of GaN Films on SiO2 Areas via Metalorganic Vapor Phase Epitaxy, Journal of Electronic Materials, vol. 27, No. 4, Apr. 1998, pp. 233-237.
Okamoto et al., Continuous-Wave Operation of m-Plane InGaN Multiple Quantum Well Laser Diodes, The Japan Society of Applied Physics JJap Express Letter, vol. 46, No. 9, 2007, pp. L187-L189.
Okamoto et al., High-Efficiency Continuous-Wave Operation of Blue-Green Laser Diodes Based on Nonpolar m-Plane Gallium Nitride, The Japan Society of Applied Physics, Applied Physics Express, vol. 1, Jun. 20, 2008, pp. 072201-1-072201-3.
Okamoto et al., Pure Blue Laser Diodes Based on Nonpolar m-Plane Gallium Nitride with InGaN Waveguiding Layers, Journal of Japanese Applied Physics, vol. 46, No. 35, 2007, pp. L820-L822.
Okubo, Nichia Develops Blue-green Semiconductor Laser w/ 488nm Wavelength, Tech-on, Retrieved from the internet: http://techon.nikkeibp.cojp/english/NEWS_EN/20080122/146009/?ST=english_PRINT, 2008, pp. 1-2.
Park , Crystal Orientation Effects on Electronic Properties of Wurtzite InGaN/GaN Quantum Wells, Journal of Applied Physics, vol. 91, No. 12, Jun. 15, 2002, pp. 9904-9908.
International Application No. PCT/US2009/046786, International Search Report and Written Opinion dated May 13, 2010, 8 pages.
International Application No. PCT/US2009/047107, International Search Report and Written Opinion dated Sep. 29, 2009, 10 pages.
International Application No. PCT/US2009/052611, International Search Report and Written Opinion dated Sep. 29, 2009, 11 pages.
International Application No. PCT/US2010/030939, International Search Report and Written Opinion dated Jun. 16, 2010, 9 pages.
International Application No. PCT/US2010/049172, International Search Report and Written Opinion dated Nov. 17, 2010, 7 pages.
International Application No. PCT/US2011/037792, International Search Report and Written Opinion dated Sep. 8, 2011, 9 pages.
International Application No. PCT/US2015/014567, International Preliminary Report on Patentability dated Aug. 25, 2016, 14 pages.
International Application No. PCT/US2015/014567, International Search Report and Written Opinion dated Jul. 8, 2015, 19 pages.
International Application No. PCT/US2015/014567, Invitation to Pay Add'l Fees and Partial Search Report dated May 1, 2015, 2 pages.
Purvis, Changing the Crystal Face of Gallium Nitride, The Advance Semiconductor Magazine, III-Vs Review, vol. 18, No. 8, Nov. 8, 2005, 3 pages.
Romanov et al., Strain-Induced Polarization in Wurtzite III-Nitride Semipolar Layers, J. Appl. Phys., vol. 100, Jul. 25, 2006, pp. 023522-1-023522-10.
Sato et al., High Power and High Efficiency Green Light Emitting Diode on Free-Standing Semipolar (1122) Bulk GaN Substrate, Physica Status Sol. (RRL), vol. 1, No. 4, Jun. 15, 2007, pp. 162-164.
Sato et al., Optical Properties of Yellow Light-Emitting-Diodes Grown on Semipolar (1122) Bulk GaN Substrate, Applied Physics Letter, vol. 92, No. 22, 2008, pp. 221110-1-221110-3.
Schmidt et al., Demonstration of Nonpolar m-Plane InGaN/GaN Laser Diodes, Japanese Journal of Applied Physics, vol. 46, No. 9, 2007, pp. L190-L191.
Schmidt et al., High Power and High External Efficiency m-Plane InGaN Light Emitting Diodes, Japanese Journal of Applied Physics, vol. 46, No. 7, Feb. 9, 2007, pp. L126-L128.
Schoedl et al., Facet Degradation of GaN Heterostructure Laser Diodes, Journal of Applied Physics, vol. 97, No. 12, 2005, pp. 123102-1-123102-8.
Shchekin et al., High Performance Thin-Film Flip-Chip InGaN—GaN Light-Emitting Diodes, Applied Physics Letters, vol. 89, Aug. 16, 2006, pp. 071109-1-071109-3.
Shen et al., Auger Recombination in InGaN Measured by Photoluminescence, Applied Physics Letters, vol. 91, Oct. 1, 2007, pp. 141101-1-141101-3.
Sink, Cleaved-Facet Group-III Nitride Lasers, University of California, Santa Barbara, Ph D. Dissertation, Dec. 2000, 251 pages.
Sizov et al., 500-nm Optical Gain Anisotropy of Semipolar (1122) InGaN Quantum Wells, Applied Physics Express, vol. 2, Jun. 19, 2009, pp. 071001-1-071001-3.
Tamboli, Photoelectrochemical Etching of Gallium Nitride for High Quality Optical Devices, Retrieved from the internet: http://adsabs.harvard.edu/abs/2009PhDT.. ...... 68T., 2009, 207 pages.
Tomiya et al., Dislocation Related Issues in the Degradation of GaN-Based Laser Diodes, IEEE Journal of Selected Topics in Quantum Electronics, vol. 10, No. 6, Nov.-Dec. 2004, pp. 1277-1286.
Tyagi et al., High Brightness Violet InGan/Gan Light EMitting Diodes on Semipolar (1011) Bulk Gan Substrates, Japanese Journal of Applied Physics, vol. 46, No. 7, Feb. 9, 2007, pp. L129-L131.
Uchida et al., Recent Progress in High-Power Blue-Violet Lasers, IEEE Journal of Selected Topics in Quantum Electronics, vol. 9, No. 5, 2003, pp. 1252-1259.
Waltereit et al., Nitride Semiconductors Free of Electrostatic Fields for Efficient White Light-Emitting Diodes, Nature, vol. 406, Aug. 24, 2000, pp. 865-868.
Wierer et al., High-Power AlGaInN Flip-Chip Light-Emitting Diodes, Applied Physics Letters, vol. 78, No. 22, 2001, pp. 3379-3381.
Wikipedia, Gallium Nitride, Gallium nitride, retrieved from http://en.wikipedia.org/wiki/Gallium_nitride, Dec. 31, 2014, 6 pages.
Wikipedia, Light-Emitting Diode, Retrieved from the internet: http://en.wikipedia.org/wiki/Light-emitting diode, Dec. 31, 2014, 44 pages.
Yamaguchi, Anisotropic Optical Matrix Elements in Strained GaN-Quantum Wells with Various Substrate Orientations, Physica Status Solidi (PSS), vol. 5, No. 6, May 2008, pp. 2329-2332.
Yang, Micromachining of Gan Using Photoelectrochemical Etching, Graduate Program in Electronic Engineering, Notre Dame, Indiana, 2005, 168 pages.
Yoshizumi et al., Continuous-Wave Operation of 520 nm Green InGaN-Based Laser Diodes on Semi-Polar {2021} GaN Substrates, Applied Physics Express, vol. 2, No. 9, Aug. 2009, pp. 1-3.
Yu et al., Multiple Wavelength Emission from Semipolar InGaN/GaN Quantum Wells Selectively Grown by MOCVD, Conference on Lasers and Electro-Optics/Quantum Electronics and Laser Science Conference and Photonic Applications Systems Technologies, OSA Technical Digest (CD), 2007, 2 pages.
Zhong et al., Demonstration of High Power Blue-Green Light Emitting Diode on Semipolar (1122) Bulk GaN Substrate, Electronics Letters, vol. 43, No. 15, Jul. 2007, pp. 825-826.

(56) References Cited

OTHER PUBLICATIONS

Zhong et al., High Power and High Efficiency Blue Light Emitting Diode on Freestanding Semipolar (1011) Bulk GaN Substrate, Applied Physics Letter, vol. 90, No. 23, 2007, pp. 233504-1-233504-3.
U.S. Appl. No. 16/876,569 Notice of Allowance dated Apr. 9, 2021, 9 pages.
U.S. Appl. No. 16/844,299 Notice of Allowance dated Jun. 11, 2021, 10 pages.
U.S. Appl. No. 17/318,896 Non-Final Office Action dated Oct. 6, 2022, 9 pages.
U.S. Appl. No. 17/377,835 Non-Final Office Action dated Nov. 15, 2022, 9 pages.
U.S. Appl. No. 17/477,016 Non-Final Office Action dated Nov. 29, 2022, 11 pages.

\* cited by examiner

| Wafer Size | 25.4 mm diameter | | 32 mm diameter | | 2x2 cm² | |
|---|---|---|---|---|---|---|
| Area [mm²] | 506.61189 | | 804.096 | | 400 | |
| LD length [mm] | die pitch [mm] | # of devices | | # of devices | | # of devices |
| 1 | 0.3 | 1689 | | 2680 | | 1333 |
| 1 | 0.2 | 2533 | | 4020 | | 2000 |
| 1 | 0.15 | 3377 | | 5361 | | 2667 |
| 1 | 0.1 | 5066 | | 8041 | | 4000 |
| 1 | 0.05 | 10132 | | 16082 | | 8000 |

| die pitch on susbtrate [mm] | LD length [mm] | Wafer Size | 25.4 mm diameter | 32 mm diameter | 2x2 cm² |
|---|---|---|---|---|---|
| | | Area [cm²] | 5.0661189 | 8.04096 | 4 |
| | | # of tranfers per 100 mm carrier | 9 | 7 | 12 |
| | | die pitch [mm] | # of devices | # of devices | # of devices |
| 0.05 | 1 | 0.3 | 15198 | 18762 | 16000 |
| 0.05 | 1 | 0.2 | 22798 | 28143 | 24000 |
| 0.05 | 1 | 0.15 | 30397 | 37524 | 32000 |
| 0.05 | 1 | 0.1 | 45595 | 56287 | 48000 |

Example of RGB laser chip

Example of RGB laser chip

Example of layout of multi die chip with carrier wafer containing metal-filled trough vias

MANUFACTURABLE LASER DIODE FORMED ON C-PLANE GALLIUM AND NITROGEN MATERIAL

CROSS-REFERENCE TO RELATED APPLICATIONS

The present application is a continuation of U.S. application Ser. No. 16/586,100, filed Sep. 27, 2019, which is a continuation of U.S. application Ser. No. 15/694,641, filed Sep. 1, 2017, which is a continuation of U.S. application Ser. No. 15/177,710, filed Jun. 9, 2016, which is a continuation of U.S. application Ser. No. 14/559,149, filed Dec. 3, 2014, which is a continuation-in-part of U.S. application Ser. No. 14/176,403, filed Feb. 10, 2014, and U.S. application Ser. No. 14/312,427, filed Jun. 23, 2014, each of which are incorporated herein by reference in their entirety for all purposes. U.S. application Ser. No. 14/559,149 is also a continuation in part of U.S. application Ser. No. 14/480,398, filed Sep. 8, 2014, which claims priority to U.S. Application No. 61/892,981, filed Oct. 18, 2013, both of which are incorporated herein by reference in their entirety for all purposes.

BACKGROUND

In 1960, the laser was first demonstrated by Theodore H. Maiman at Hughes Research Laboratories in Malibu. This laser utilized a solid-state flash lamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produced laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG), had wall plug efficiency of ~1%, and were more efficient than Ar-ion gas lasers, but were still too inefficient, large, expensive, and fragile for broad deployment outside of specialty scientific and medical applications. Additionally, the gain crystal used in the solid state lasers typically had energy storage properties that made the lasers difficult to modulate at high speeds, which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal, which lases at 1064 nm, 1064 nm goes into frequency conversion crystal which converts to visible 532 nm. The DPSS laser technology extended the life and improved the wall plug efficiency of the LPSS lasers to 5-10%, and further commercialization ensued into more high-end specialty industrial, medical, and scientific applications. However, the change to diode pumping increased the system cost and required precise temperature controls, leaving the laser with substantial size and power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature which limits their application.

Currently the only viable direct blue and green laser diode structures are fabricated from the wurtzite AlGaInN material system. The manufacturing of light emitting diodes from GaN related materials is dominated by the heteroepitaxial growth of GaN on foreign substrates such as Si, SiC and sapphire. Laser diode devices operate at such high current densities that the crystalline defects associated with heteroepitaxial growth are not acceptable. Because of this, very low defect-density, free-standing GaN substrates have become the substrate of choice for GaN laser diode manufacturing. Unfortunately, such substrates are costly and inefficient.

SUMMARY

Embodiments of the invention provide methods for fabricating semiconductor laser diodes. Typically these devices are fabricated using an epitaxial deposition, followed by processing steps on the epitaxial substrate and overlying epitaxial material. What follows is a general description of the typical configuration and fabrication of these devices.

In an example, the present invention provides a method for manufacturing a gallium and nitrogen containing laser diode device with low cost. The method includes providing a gallium and nitrogen containing substrate having a surface region and forming epitaxial material overlying the surface region, the epitaxial material comprising an n-type cladding region, an active region comprising at least one active layer overlying the n-type cladding region, and a p-type cladding region overlying the active region. The method includes patterning the epitaxial material to form a plurality of dice, each of the dice corresponding to at least one laser device, characterized by a first pitch between a pair of dice, the first pitch being less than a design width. The method includes transferring each of the plurality of dice to a carrier wafer such that each pair of dice is configured with a second pitch between each pair of dice, the second pitch being larger than the first pitch corresponding to the design width. The method includes singulating the carrier wafer into a plurality of laser diode devices on carrier chips. The carrier chips effectively serve as the submount of the laser diode device and can be integrated directly into a wide variety of package types.

In an example, using basic assumptions about processing and material costs, it can be shown that blue-light emitting, GaN-based laser device costs below $0.50 per optical Watt and could be as low as $0.10 per optical Watt by transferring die from 4.5 cm² GaN substrates to 200 mm SiC carriers. This price is highly competitive with state of the art light emitting diodes and could enable widespread penetration of laser light sources into markets currently served by LEDs such as general lighting.

In an example, the present die configured with carrier, which can serve as a submount, can be packaged into a module without any further liftoff process or the like. The process is efficient and uses conventional process technology. Depending upon the embodiment, these and other benefits may be achieved.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIG. 16 is a table showing number of laser devices that can be processed on a substrate at a given die pitch.

FIG. 18 is a table showing number of laser devices that can be processed on 50 micron wide die after epi transfer to a carrier.

DETAILED DESCRIPTION

Embodiments of the invention provide methods for fabricating semiconductor laser diodes. Typically these devices are fabricated using an epitaxial deposition, followed by processing steps on the epitaxial substrate and overlying epitaxial material. What follows is a general description of the typical configuration and fabrication of these devices.

Reference can be made to the following description of the drawings, as provided below.

Figure 1:
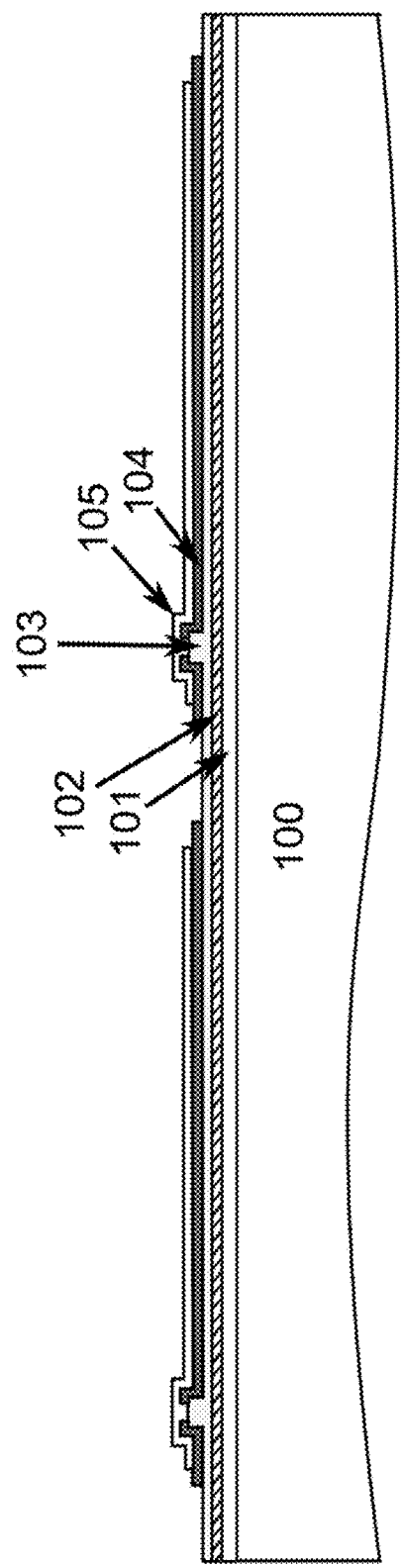
FIG. 1 is a simplified illustration of a laser diode according to an example of the present invention.

FIG. 1 is a side view illustration of a state of the art GaN based laser diode after processing. Laser diodes are fabricated on an original gallium and nitrogen containing epitaxial substrate 100, typically with epitaxial n-GaN and n-side cladding layers 101, active region 102, p-GaN and p-side cladding 103, insulating layers 104 and contact/pad layers 105. Laser die pitch is labeled. All epitaxy material not directly under the laser ridge is wasted in this device design. In an example, n-type cladding may be comprised of GaN, AlGaN, or InAlGaN.

Figure 2A:
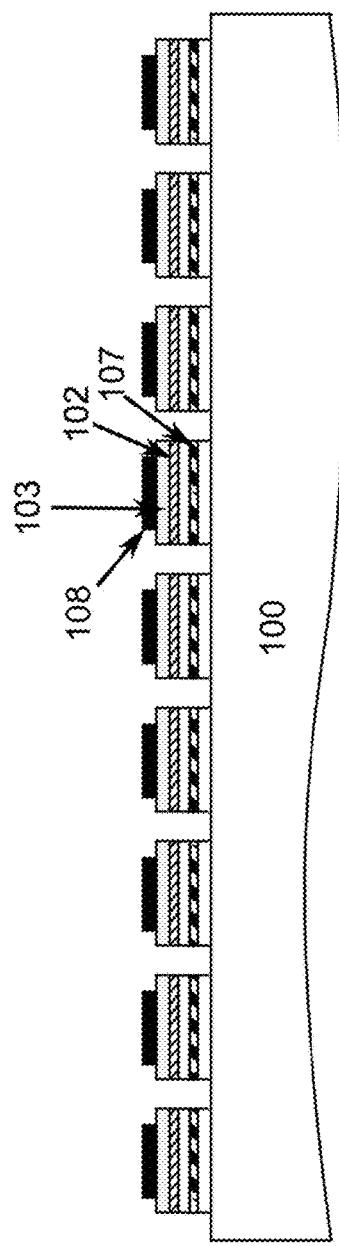
FIGS. 2a-2b are simplified illustrations of a die expanded laser diode according to an example of the present invention.
Figure 2B:
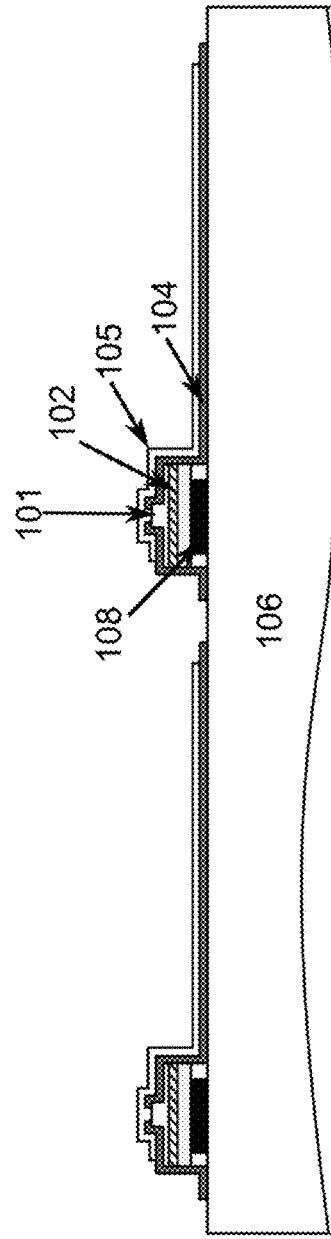

FIG. 2a is a side view illustration of gallium and nitrogen containing epitaxial wafer 100 before the die expansion process and FIG. 2b is a side view illustration of a carrier wafer 106 after the die expansion process. These figures demonstrates a roughly five times expansion and thus five times improvement in the number of laser diodes, which can be fabricated from a single gallium and nitrogen containing substrate and overlying epitaxial material. Typical epitaxial and processing layers are included for example purposes and include n-GaN and n-side cladding layers 101, active region 102, p-GaN and p-side cladding 103, insulating layers 104, and contact/pad layers 105. Additionally, a sacrificial region 107 and bonding material 108 are used during the die expansion process.

Figure 3:
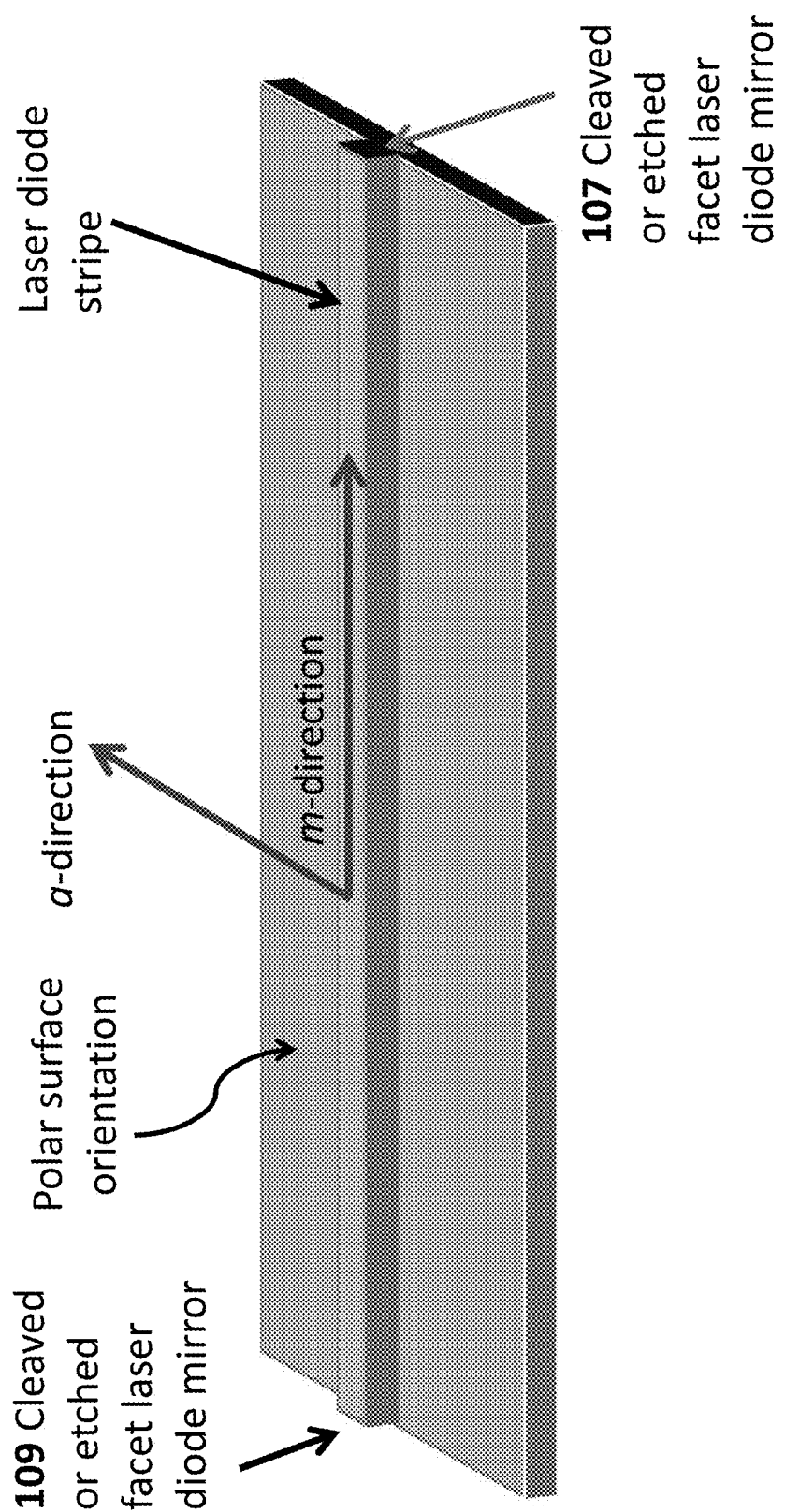
FIG. 3 is a schematic diagram of c-plane polar laser diode with the cavity aligned in the projection of m-direction with cleaved or etched mirrors in an example.

FIG. 3 is a schematic diagram of c-plane polar laser diode with the cavity aligned in the m-direction with cleaved or etched mirrors. Shown is a simplified schematic diagram of c-plane laser diode with the cavity aligned in the m-direction with cleaved or etched mirrors. The laser stripe region is characterized by a cavity orientation substantially in a projection of a in-direction, which is substantially normal to an a-direction. The laser strip region has a first end 107 and a second end 109 and is formed on an m-direction on a (0001) c-plane gallium and nitrogen containing substrate having a pair of cleaved mirror structures, which face each other.

Figure 4:
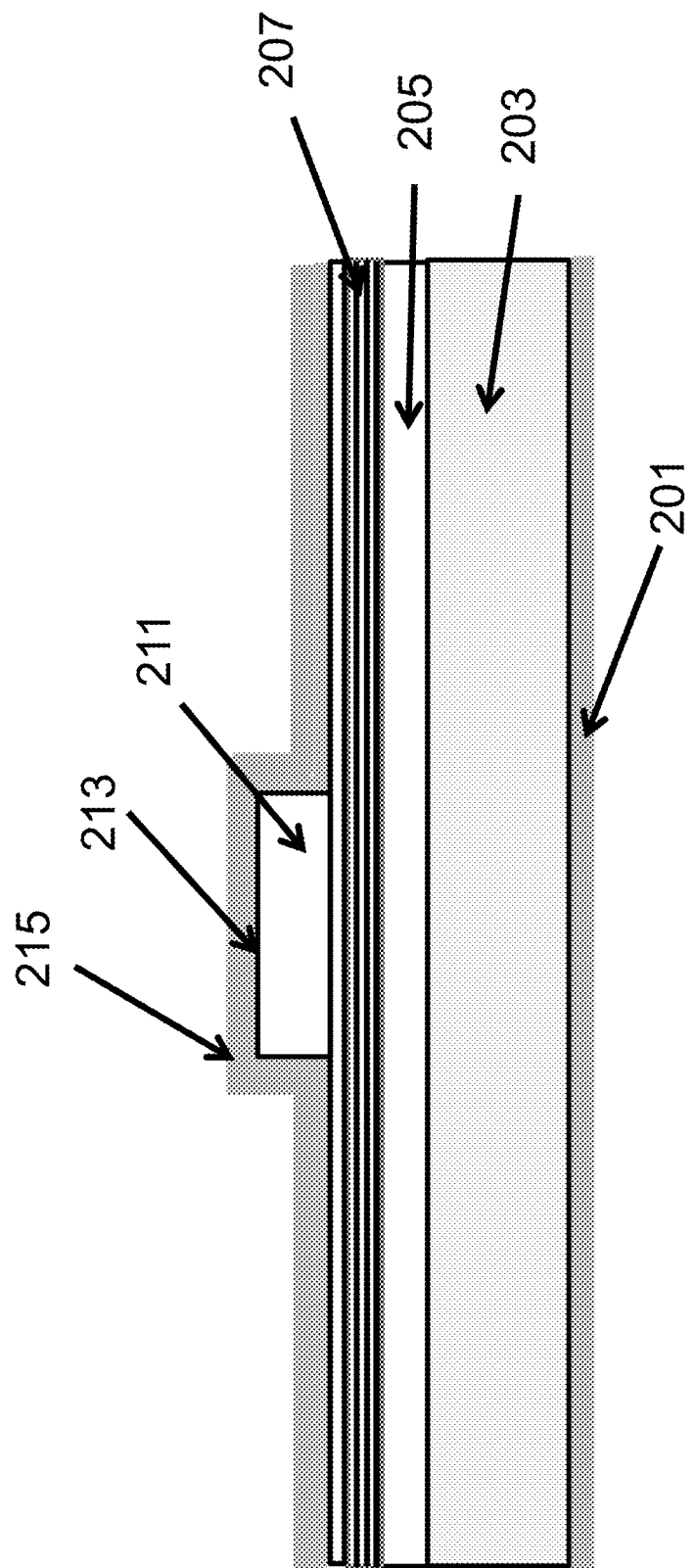
FIG. 4 is a schematic cross-section of ridge laser diode in an example.

FIG. 4 is a Schematic cross-section of ridge laser diode in an example, and shows a simplified schematic cross-sectional diagram illustrating a state of the art laser diode structure. This diagram is merely an example, which should not unduly limit the scope of the claims herein. As shown, the laser device includes gallium nitride substrate 203, which has an underlying n-type metal back contact region 201. In an embodiment, the metal back contact region is made of a suitable material such as those noted below and others. In an embodiment, the device also has an overlying n-type gallium nitride layer 205, an active region 207, and an overlying p-type gallium nitride layer structured as a laser stripe region 211. Additionally, the device may also include an n-side separate confinement heterostructure (SCH), p-side guiding layer or SCH, p-AlGaN EBL, among other features. In an embodiment, the device also has a p++ type gallium nitride material 213 to form a contact region. A p-contact or p-electrode 215 is formed over the contact region.

Figure 5:
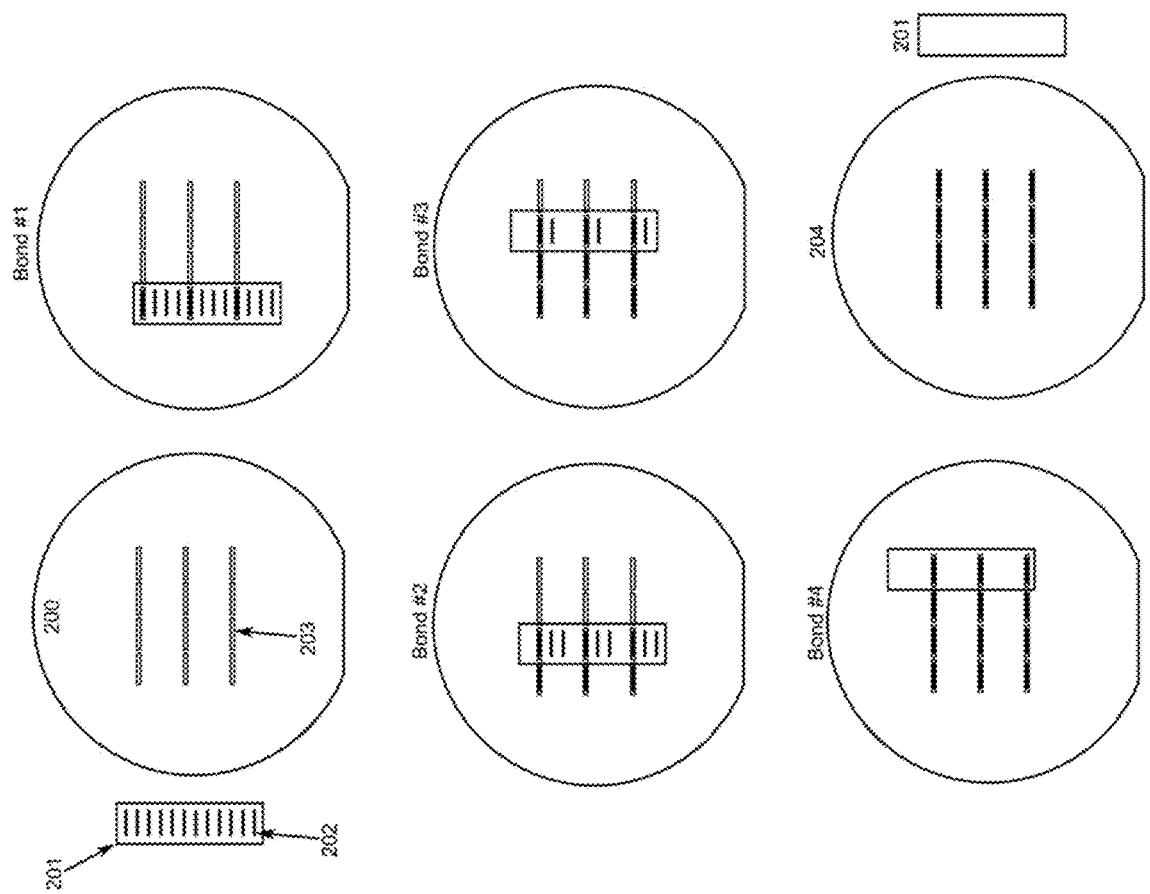
FIG. 5 is a top view of a selective area bonding process in an example.

FIG. 5 is a simplified top view of a selective area bonding process and illustrates a die expansion process via selective area bonding. The original gallium and nitrogen containing epitaxial wafer 201 has had individual die of epitaxial material and release layers defined through processing. Individual epitaxial material die are labeled 202 and are spaced at pitch 1. A round carrier wafer 200 has been prepared with patterned bonding pads 203. These bonding pads are spaced at pitch 2, which is an even multiple of pitch 1 such that selected sets of epitaxial die can be bonded in each iteration of the selective area bonding process. The selective area bonding process iterations continue until all epitaxial die have been transferred to the carrier wafer 204. The gallium and nitrogen containing epitaxy substrate 201 can now optionally be prepared for reuse.

Figure 6:
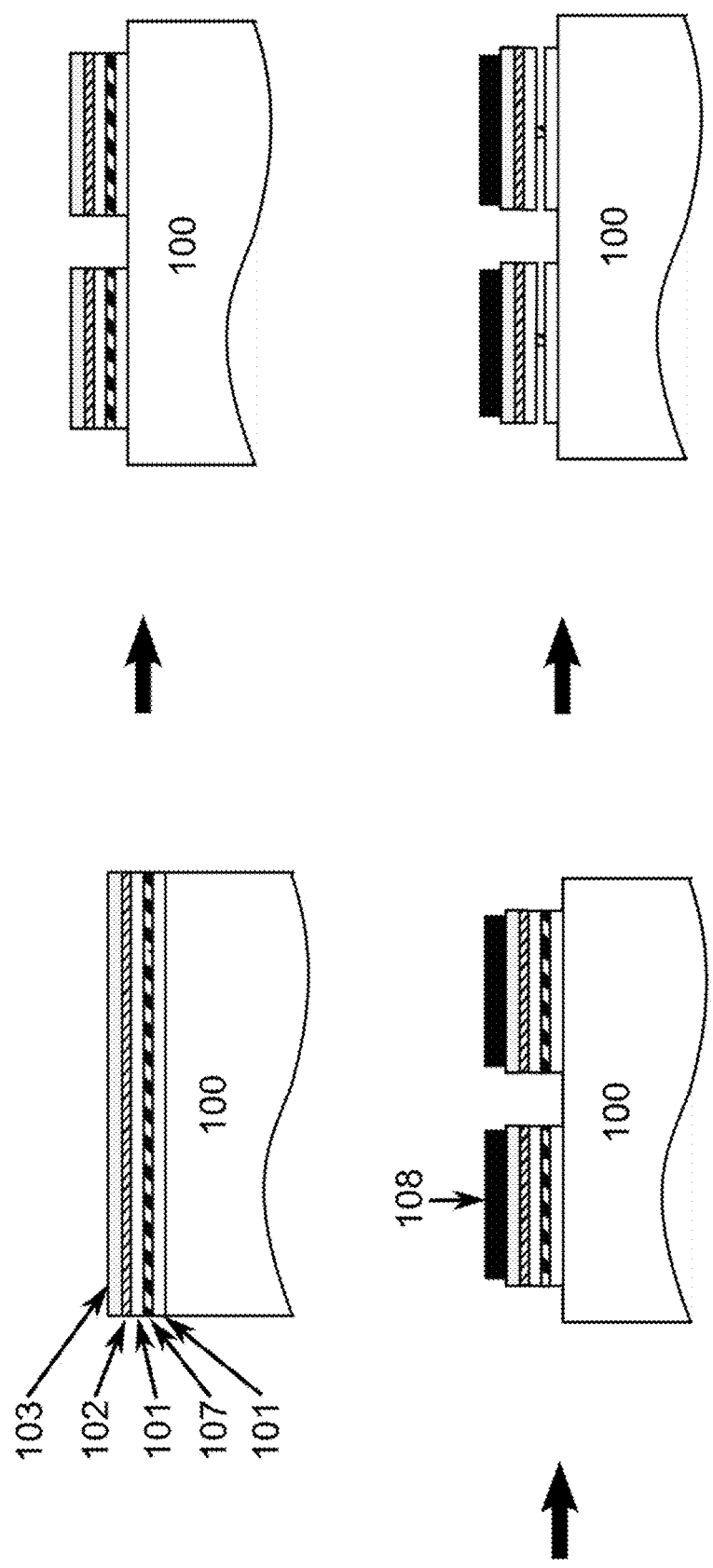
FIG. 6 is a simplified process flow for epitaxial preparation in an example.

In an example, FIG. 6 is a simplified diagram of process flow for epitaxial preparation including a side view illustration of an example epitaxy preparation process flow for the die expansion process. The gallium and nitrogen containing epitaxy substrate 100 and overlying epitaxial material are defined into individual die, bonding material 108 is deposited, and sacrificial regions 107 are undercut. Typical epitaxial layers are included for example purposes and are n-GaN and n-side cladding layers 101, active region 102, and p-GaN and p-side cladding 103.

Figure 7:
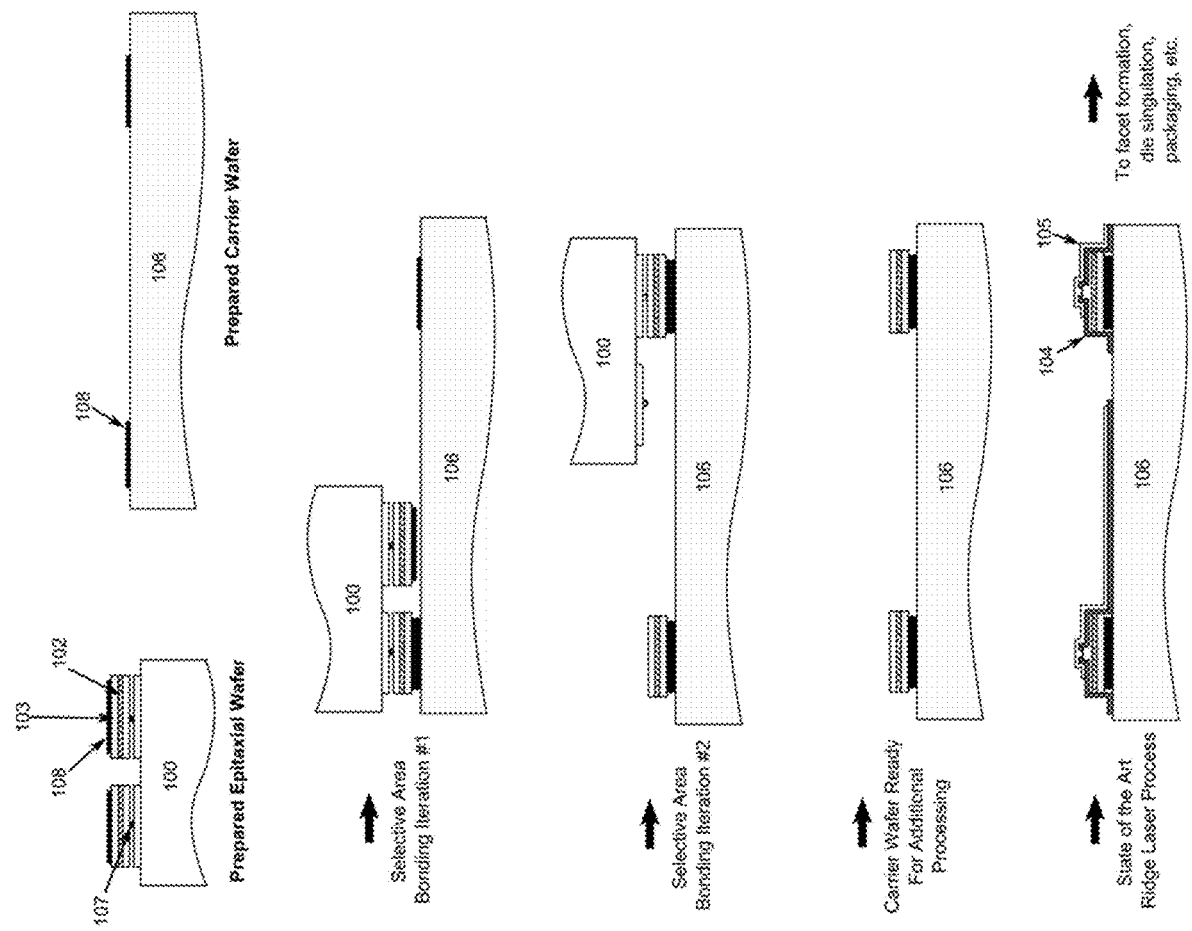
FIG. 7 is a simplified side view illustration of selective area bonding in an example.

In an example, FIG. 7 is a simplified illustration of a side view of a selective area bonding process in an example. Prepared gallium and nitrogen containing epitaxial wafer 100 and prepared carrier wafer 106 are the starting components of this process. The first selective area bonding iteration transfers a fraction of the epitaxial die, with additional iterations repeated as needed to transfer all epitaxial die. Once the die expansion process is completed, state of the art laser processing can continue on the carrier wafer. Typical epitaxial and processing layers are included for example purposes and are n-GaN and n-side cladding layers 101, active region 102, p-GaN and p-side cladding 103, insulating layers 104 and contact/pad layers 105. Additionally, a sacrificial region 107 and bonding material 108 are used during the die expansion process.

Figure 8:
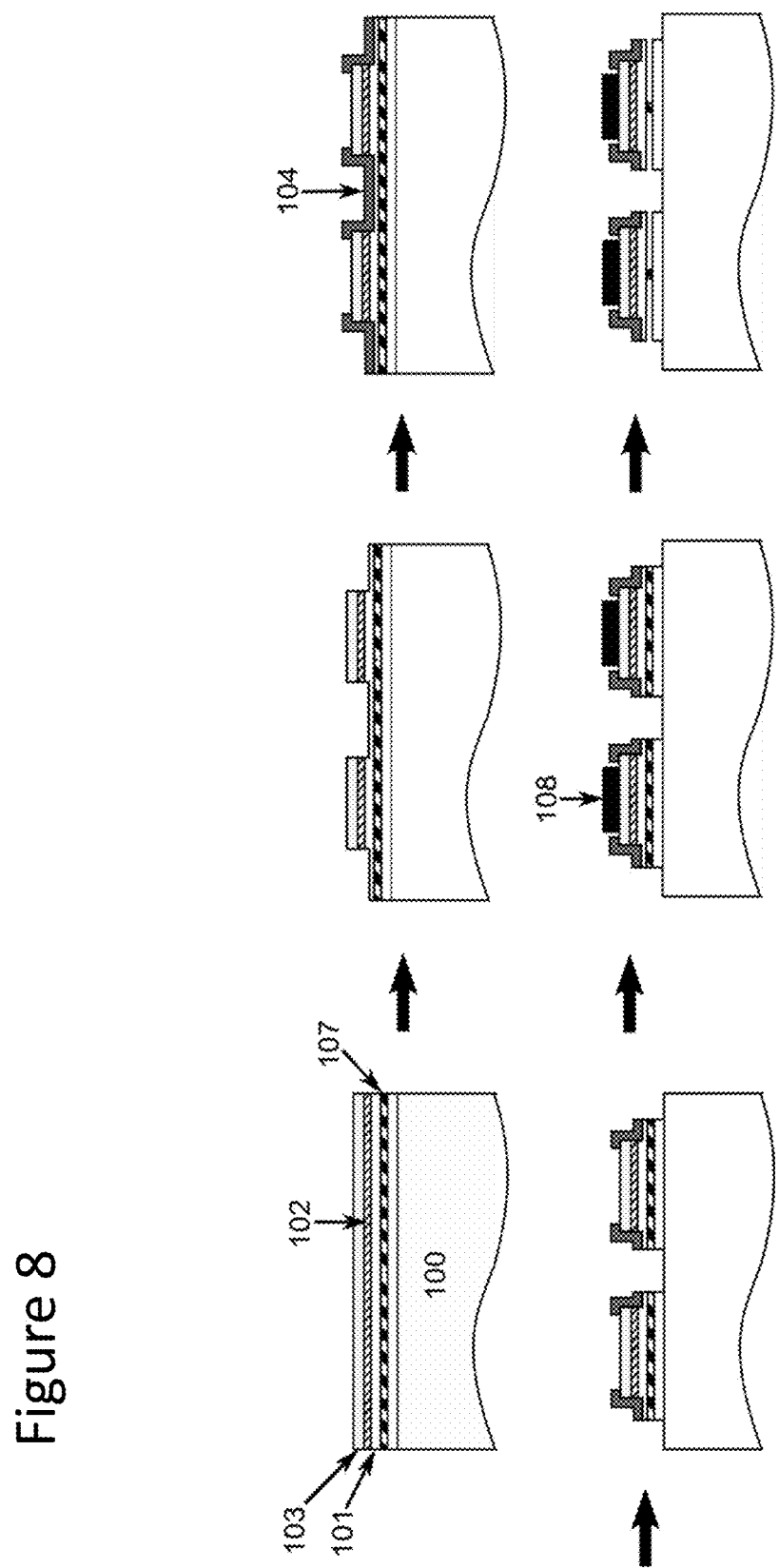
FIG. 8 is a simplified process flow of epitaxial preparation with active region protection in an example.

In an example, FIG. 8 is a simplified diagram of an epitaxy preparation process with active region protection. Shown is a side view illustration of an alternative epitaxial wafer preparation process flow during which sidewall passivation is used to protect the active region during any PEC undercut etch steps. This process flow allows for a wider selection of sacrificial region materials and compositions. Typical substrate, epitaxial, and processing layers are included for example purposes and are the gallium and nitrogen containing substrate 100, n-GaN and n-side cladding layers 101, active region 102, p-GaN and p-side cladding 103, insulating layers 104 and contact/pad layers 105. Additionally, a sacrificial region 107 and bonding material 108 are used during the die expansion process.

Figure 9:
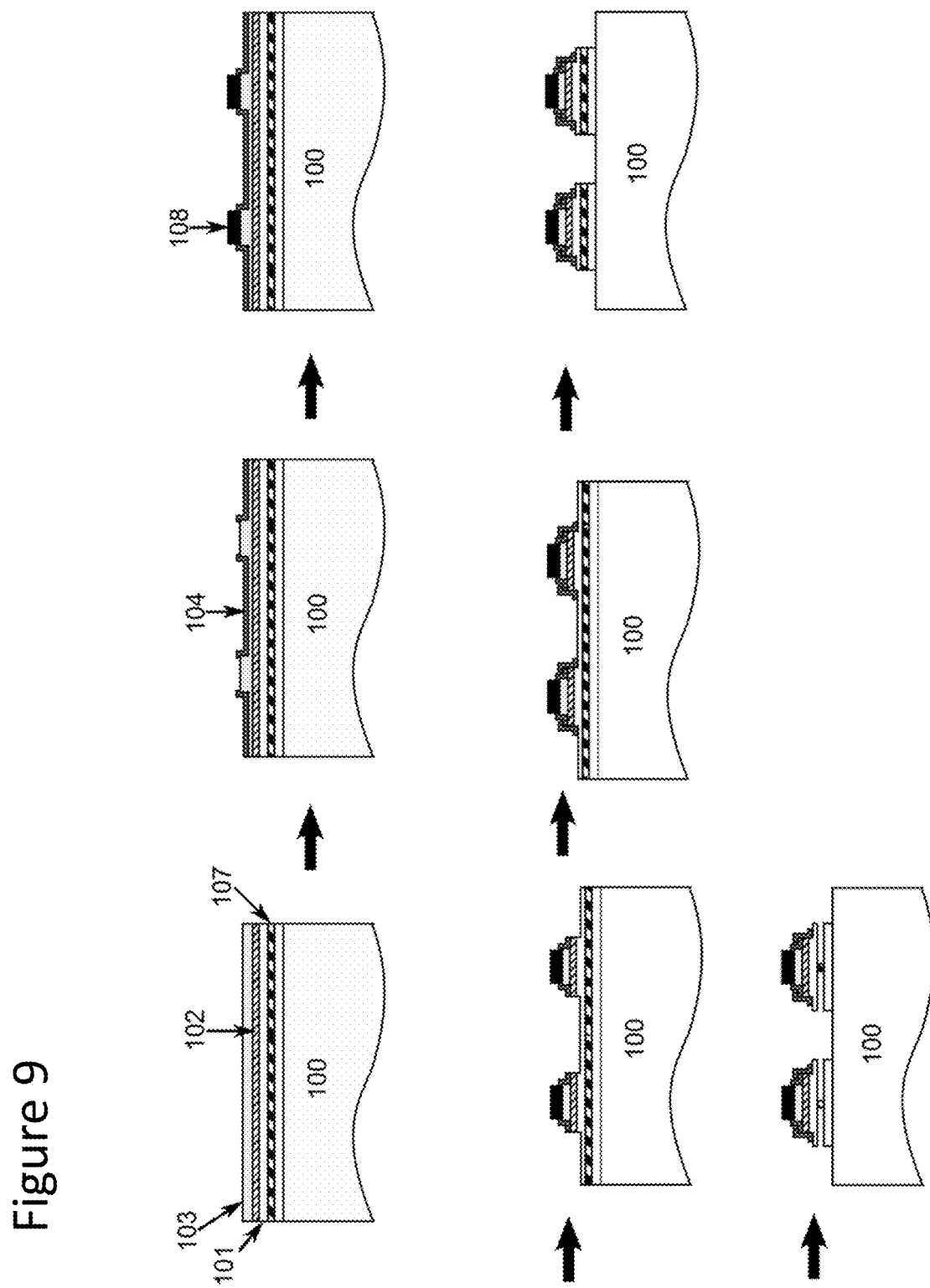
FIG. 9 is a simplified process flow of epitaxial preparation with active region protection and with ridge formation before bonding in an example.

In an example, FIG. 9 is a simplified diagram of epitaxy preparation process flow with active region protection and ridge formation before bonding. Shown is a side view illustration of an alternative epitaxial wafer preparation process flow during which sidewall passivation is used to protect the active region during any PEC undercut etch steps and laser ridges are defined on the denser epitaxial wafer before transfer. This process flow potentially allows cost saving by performing additional processing steps on the denser epitaxial wafer. Typical substrate, epitaxial, and processing layers are included for example purposes and are the gallium and nitrogen containing substrate 100, n-GaN and n-side cladding layers 101, active region 102, p-GaN and p-side cladding 103, insulating layers 104 and contact/pad layers 105. Additionally, a sacrificial region 107 and bonding material 108 are used during the die expansion process.

Figure 10A:
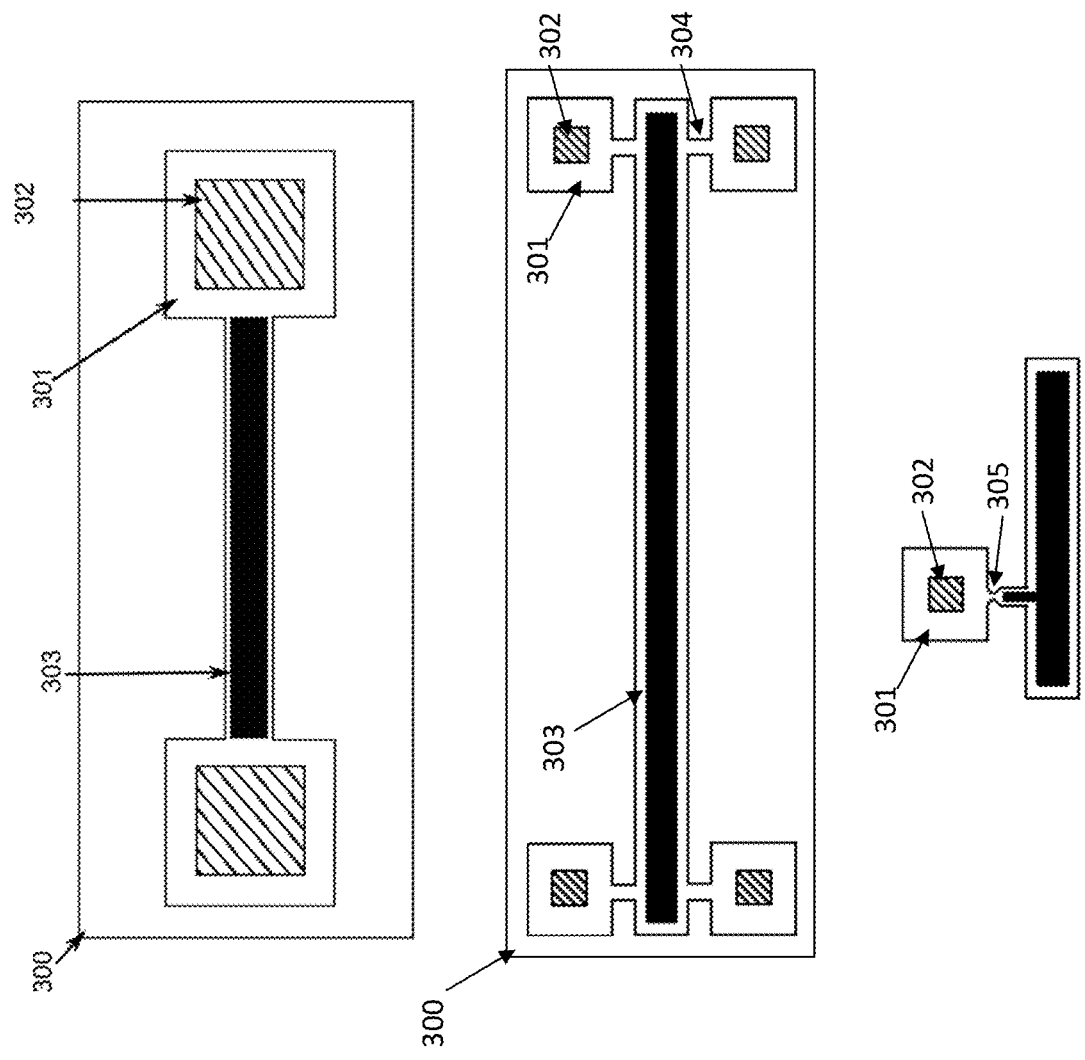
FIG. 10a is a simplified illustration of anchored PEC undercut (top-view) in an example.

FIG. 10a is a simplified example of anchored PEC undercut (top-view). Shown is a top view of an alternative release process during the selective area bonding of narrow mesas. In this embodiment a top down etch is used to etch away the area 300, followed by the deposition of bonding metal 303. A PEC etch is then used to undercut the region 301, which is wider than the lateral etch distance of the sacrificial layer. The sacrificial region 302 remains intact and serves as a mechanical support during the selective area bonding process. Anchors such as these can be placed at the ends of narrow mesas as in the "dog-bone" version. Anchors can also be placed at the sides of mesas (see peninsular anchor) such that they are attached to the mesa via a narrow connection 304 which is undercut and will break preferentially during transfer. Geometric features that act as stress concentrators 305 can be added to the anchors to further restrict where breaking will occur. The bond media can also be partially extended onto the anchor to prevent breakage near the mesa.

Figure 10B:
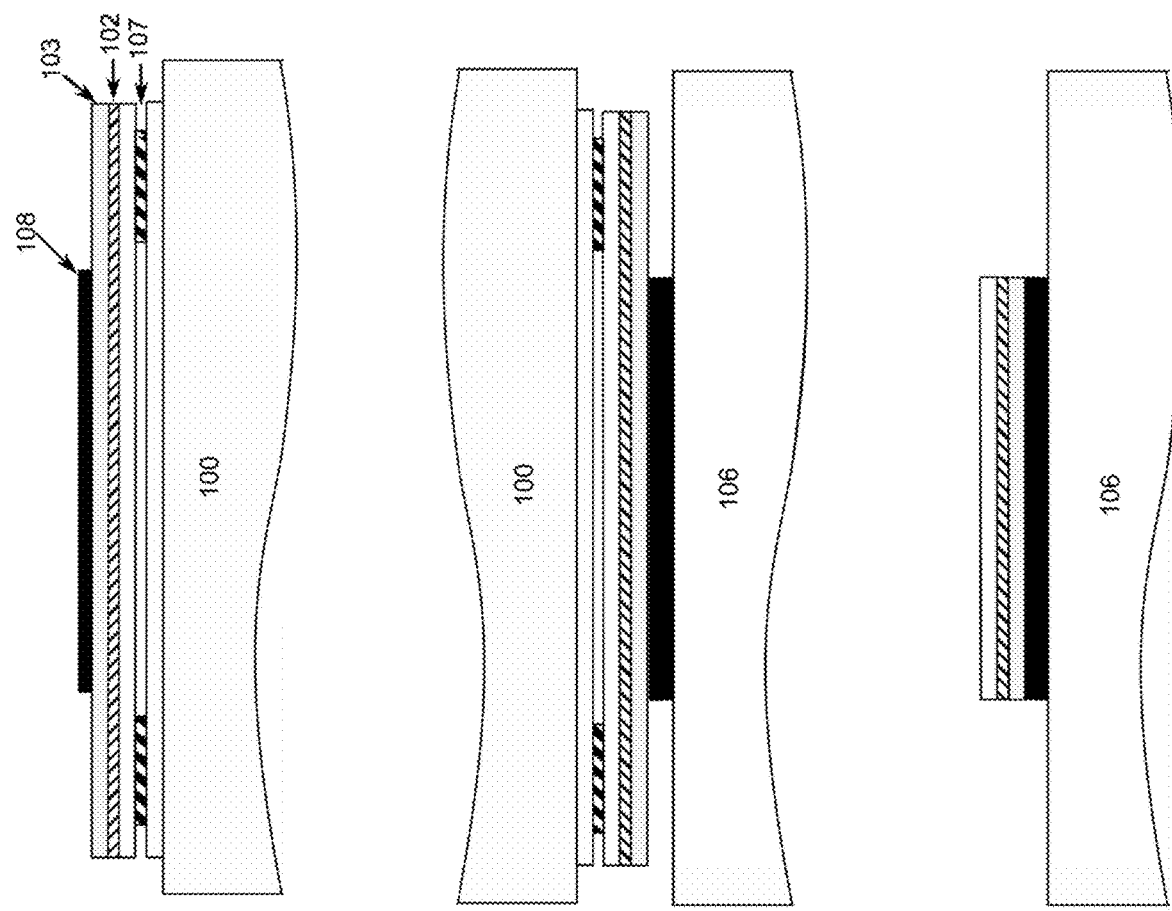
FIG. 10b is a simplified illustration of anchored PEC undercut (side-view) in an example.

FIG. 10b is a simplified view of anchored PEC undercut (side-view) in an example. Shown is a side view illustration of the anchored PEC undercut. Posts of sacrificial region are included at each end of the epitaxial die for mechanical support until the bonding process is completed. After bonding the epitaxial material will cleave at the unsupported thin film region between the bond pads and intact sacrificial regions, enabling the selective area bonding process. Typical epitaxial and processing layers are included for example purposes and are n-GaN and n-side cladding layers 101, active region 102, p-GaN and p-side cladding 103, insulating layers 104 and contact/pad layers 105. Additionally, a sacrificial region 107 and bonding material 108 are used during the die expansion process. Epitaxial material is transferred from the gallium and nitrogen containing epitaxial wafer 100 to the carrier wafer 106. Further details of the present method and structures can be found more particularly below.

Figure 11A:
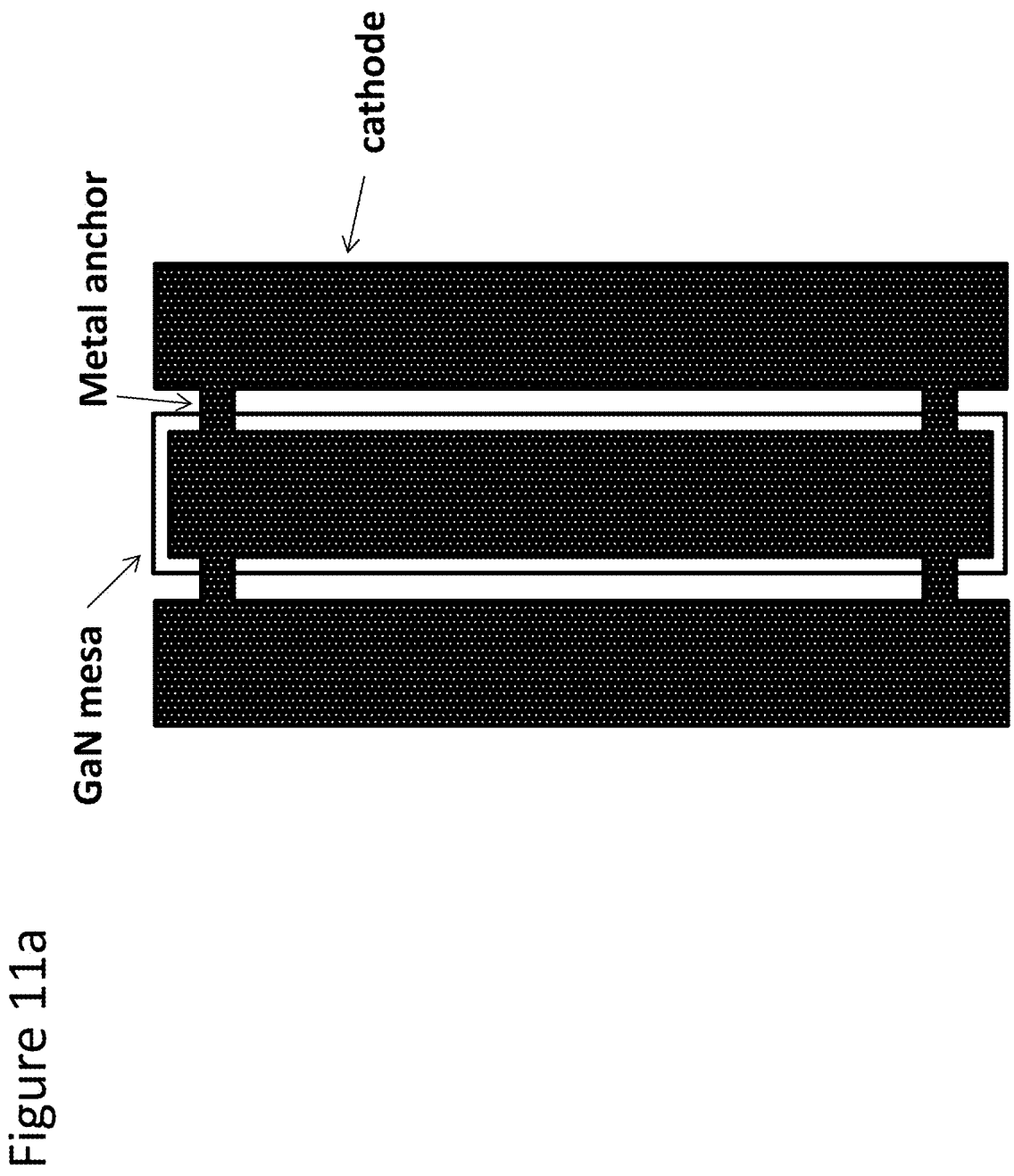
FIG. 11a is top view of transferrable mesa with metal anchors an example.

FIG. 11a shows a plan-view schematic of an example of a transferable mesa of GaN epitaxial material with a metal anchor bridging between the bond metal on the top of the mesa and the cathode metal in the etched field.

Figure 11B:
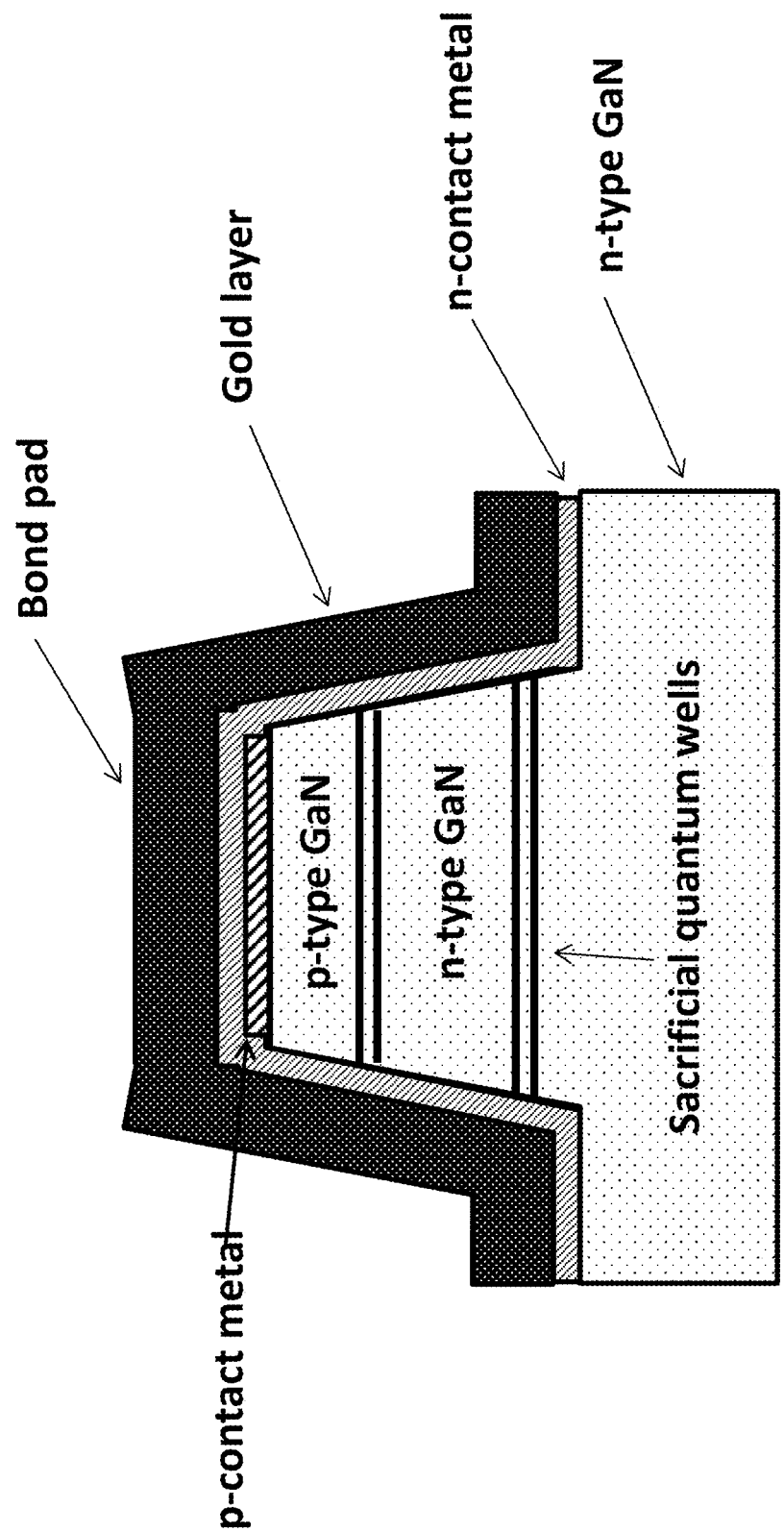
FIG. 11b is a cross sectional view of metal anchor in an example.

FIG. 11b presents a cross-sectional view of an example of a transferable GaN mesa at the location of a metal anchor. Here the mesa is formed by chemical etching and includes the p-type cladding layers, the light emitting layers of the optoelectronic device, the n-type cladding layers, the quantum wells comprising the sacrificial layer and a portion of the n-type GaN epitaxial layer beneath the sacrificial layer. A p-contact metal is first deposited on the p-type GaN in order to form a high quality electrical contact with the p-type GaN. A second metal stack is then patterned and deposited on the mesa, overlaying the p-contact metal. The second metal stack consists of an n-contact metal, forming a good electrical contact with the n-type GaN beneath the sacrificial layer, as well as a relatively thick metal layer that acts as both the mesa bond pad as well as the cathode metal. The bond/cathode metal also forms a thick layer overlaying the edge of the mesa and providing a continuous connection between the mesa top and the substrate. After the sacrificial layer is removed by selective photochemical etching the thick metal provides mechanical support to retain the mesa in position on the GaN wafer until the bonding to the carrier wafer is carried out.

Figure 11C:
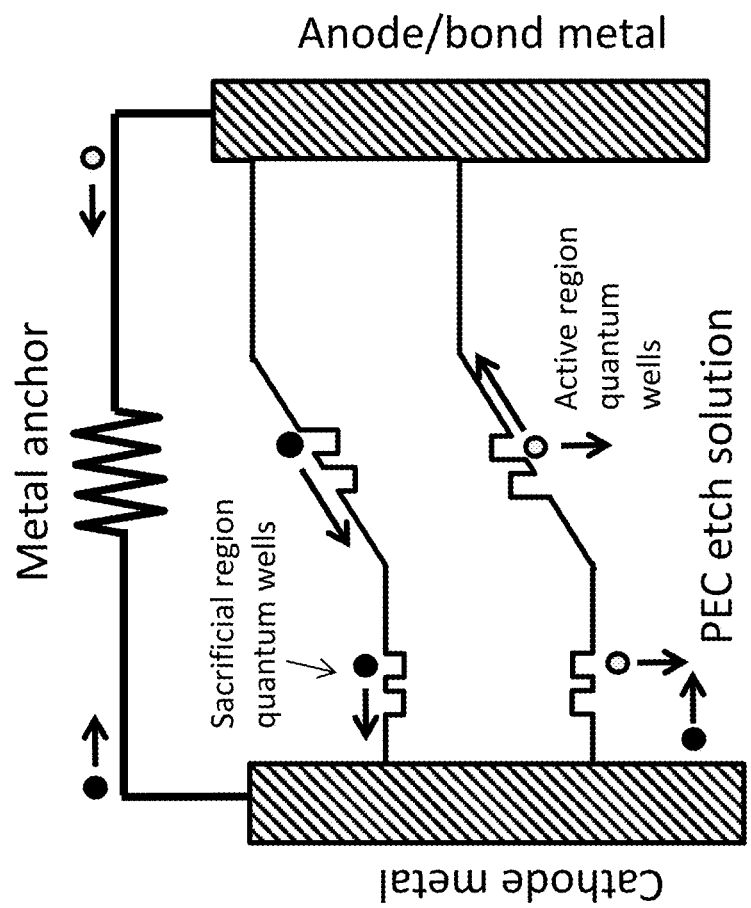
FIG. 11c is a schematic of electrical circuit formed during PEC etching with metal anchors in an example.

FIG. 11c is a schematic representation of charge flow in a device using a metal anchor during photoelectrochemical [PEC] etching of the sacrificial layer. It is possible to selectively etch the sacrificial layer even if the pump light is absorbed by the active region. Etching in the PEC process is achieved by the dissolution of AlInGaN materials at the wafer surface when holes are transferred to the etching solution. These holes are then recombined in the solution with electrons extracted at the cathode metal interface with the etching solution. Charge neutrality is therefore achieved. Selective etching is achieved by electrically shorting the anode to the cathode. Electron hole pairs generated in the device light emitting layers are swept out of the light emitting layers by the electric field of the of the p-n junction. Since holes are swept out of the active region, there is little or no etching of the light emitting layer. The buildup of carriers produces a potential difference that drives carriers through the metal anchors where they recombine. The flat band conditions in the sacrificial region result in a buildup of holes that result in rapid etching of the sacrificial layers.

Figure 12:
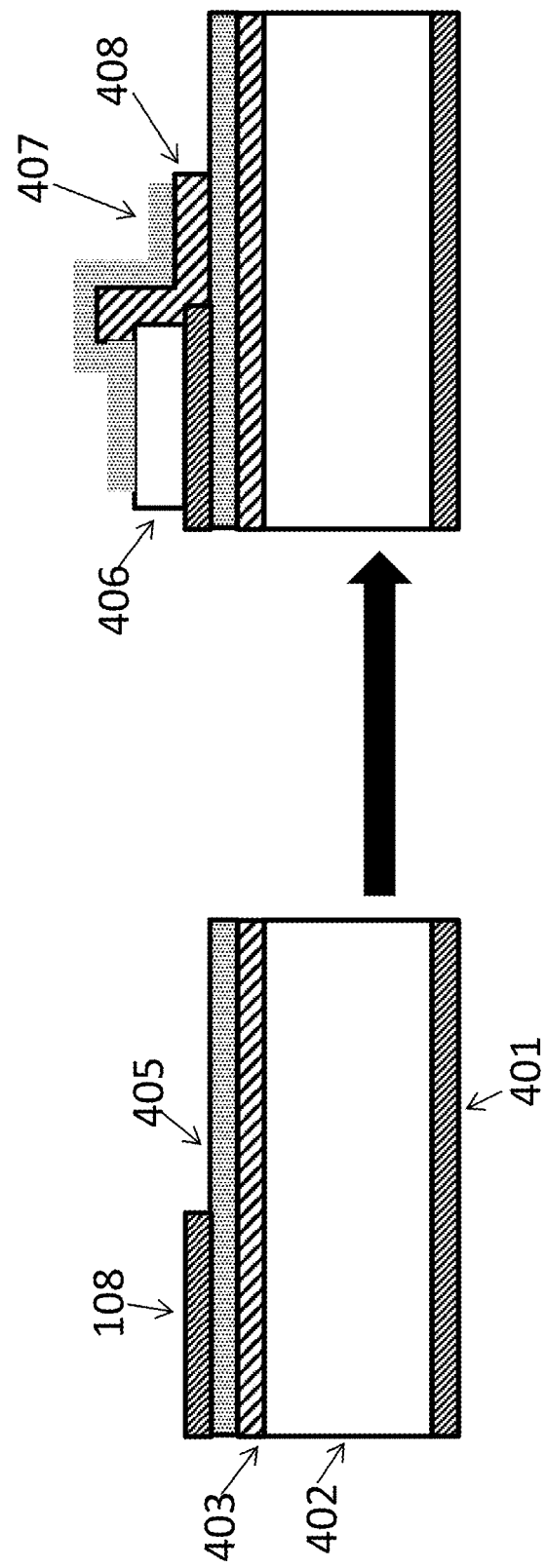
FIG. 12 is a simplified illustration of a carrier wafer processed to act as a submount.

FIG. 12 is a simplified illustration of a carrier wafer processed to act as a submount. The carrier wafer 402 is processed such that the backside contains a bonding media 401 which could be epoxy, gold-tin solder or the like. The carrier is also processed with a first passivating layer 403 that electrically isolates the carrier wafer from the overlaying layers. A conductive bond pad 405 overlays the passivating layer and allows for electrical access via a probe or wire bond to the bond pad 108 used during the laser die transfer process. After transfer of the laser die 406 a second electrical contact and bond-pad layer 407 is added overlaying both the laser device patterned on the die as well as part of the bottom side contact pad 405. A second passivating layer 408 separates the two bond pads.

Figure 13:
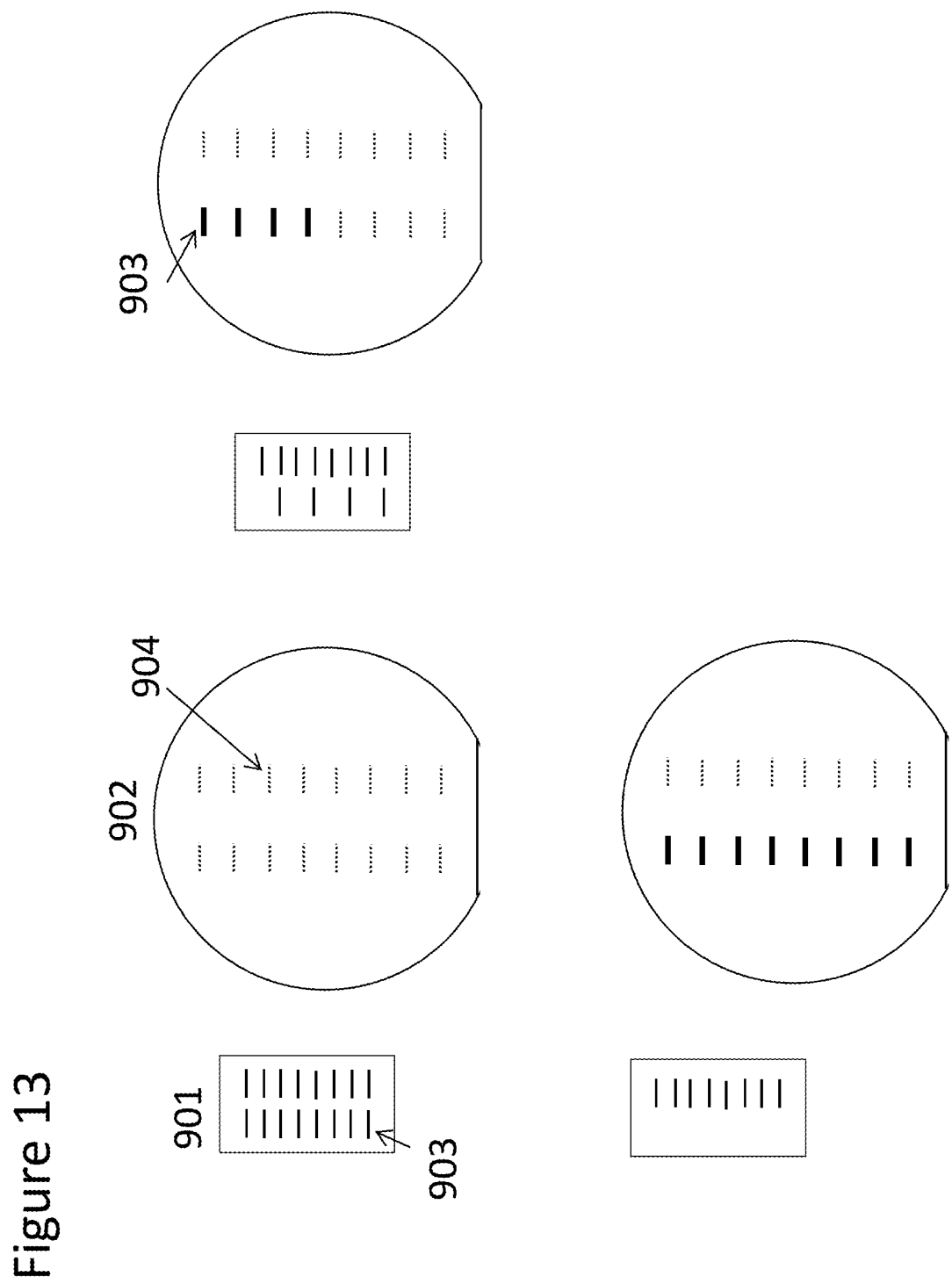
FIG. 13 is top view of a selective area bonding process with die expansion onto a carrier wafer in two dimensions in an example.

FIG. 13 is top view of a selective area bonding process with die expansion in two dimensions in an example. The substrate 901 is patterned with transferrable die 903. The carrier wafer 902 is patterned with bond pads 904 at both a second and fourth pitch that are larger than the die pitches on the substrate. After the first bonding, a subset of the laser die is transferred to the carrier. After the second bonding a complete row of die are transferred.

Figure 14:
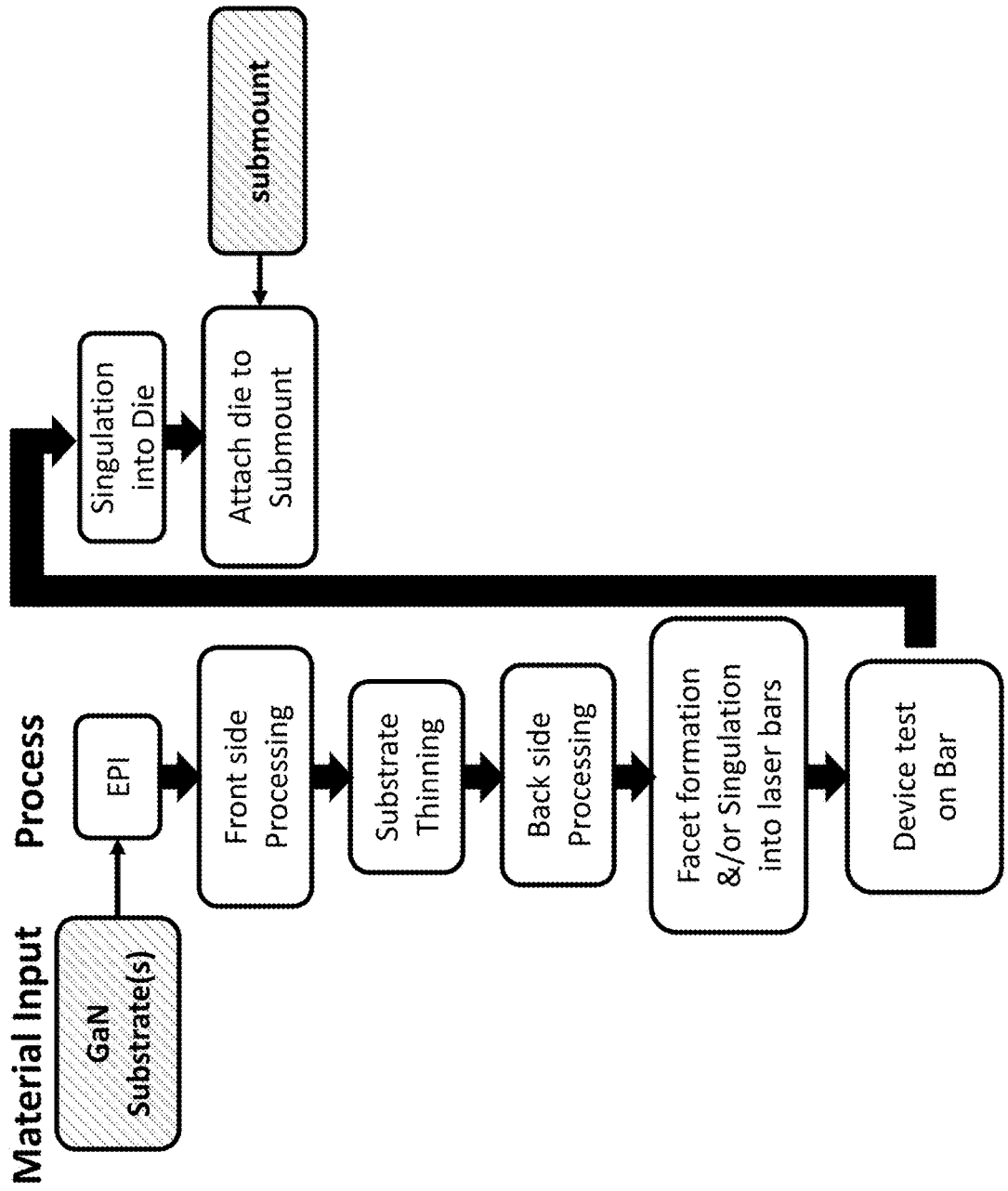
FIG. 14 is a flow diagram for processing steps and material inputs for a typical laser diode device in and example.

FIG. 14 is a flow diagram for processing steps and material inputs for a typical laser diode device in and example. Here GaN substrates are deposited on to form a LD device wafer. Laser ridges, along with passivation and electrical contact layers are fabricated on the wafer front side. The wafer is then thinned, which consumes most of the thickness of the wafer. The backside electrical contacts are processed. The wafer is then scribed and cleaved to form facets, facet coatings are added and the laser devices are tested for quality assurance. The laser bars are then singulated into individual die and attached to a submount. The process flow for a GaAsP based laser would be substantively similar.

Figure 15:
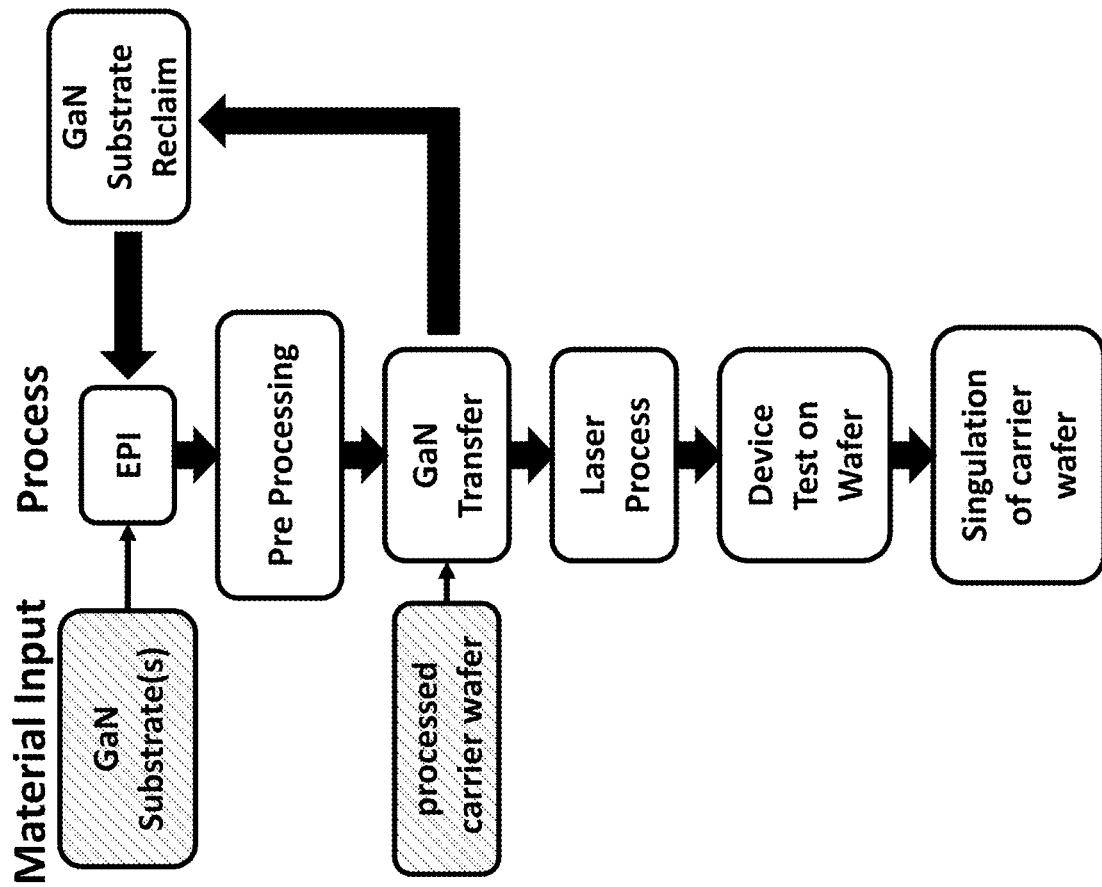
FIG. 15 is a flow diagram for processing steps and material inputs for a low cost laser device fabricated with epitaxial transfer to a carrier wafer in and example.

FIG. 15 is a flow diagram for processing steps and material inputs for a low cost GaN laser device fabricated with epitaxial transfer to a carrier wafer in and example. Here GaN substrates are deposited on to form a LD device wafer. Laser die are processed in preparation for transfer. The laser die are then transferred to a carrier wafer. Laser ridges, passivation layers and contacts are then fabricated on the die on the carrier. In the case where etched facets are used the devices are tested on wafer. The carrier is then singulated into individual die. The process flow for a GaAsP based laser would be substantively similar.

FIG. 16 is a table showing number of laser devices that can be processed on a substrate at a given die pitch. The table shows values for substrates of three geometries 25.4 mm, 32 mm diameter round wafers and 2×2 cm² square wafers. As the die pitch is decreased the density of devices that can be processed on a substrate increases dramatically.

Figure 17:
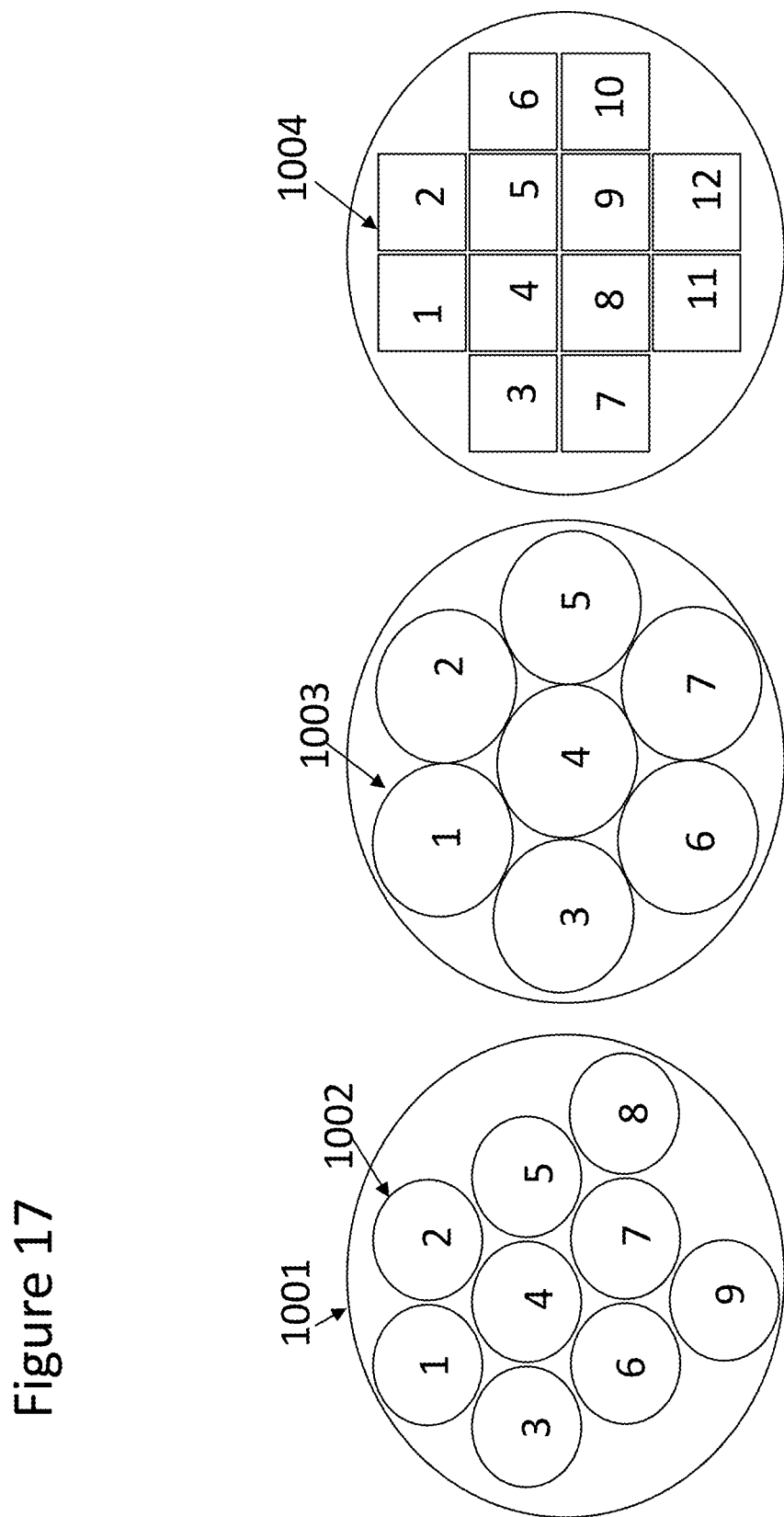
FIG. 17 is an illustration of bondable area for various substrate dimensions on a 100 mm diameter carrier wafer.

FIG. 17 is an illustration of bondable area for various substrate dimensions on a 100 mm diameter carrier wafer 1001. In this configuration die expansion is happening in one dimension only. The number of transfers possible is fixed by the size and shape of the substrate relative to the carrier. Several examples are shown, including 25.4 mm diameter wafers 1002, 32 mm diameter wafers 1003 and 2×2 cm² substrates 1004.

FIG. 18 is a table showing number of laser devices that can be processed on about 50 micron wide die after epi transfer to a carrier at various second pitches. The second pitch, e.g. the die pitch on the carrier, relative to the pitch on the substrate determines the fraction of die on the substrate that can be transferred in each transfer step. A carrier wafer may therefore contain die from multiple substrates, one substrate or only part of a single substrate depending on the sizes of the first and second pitches.

Figure 19:
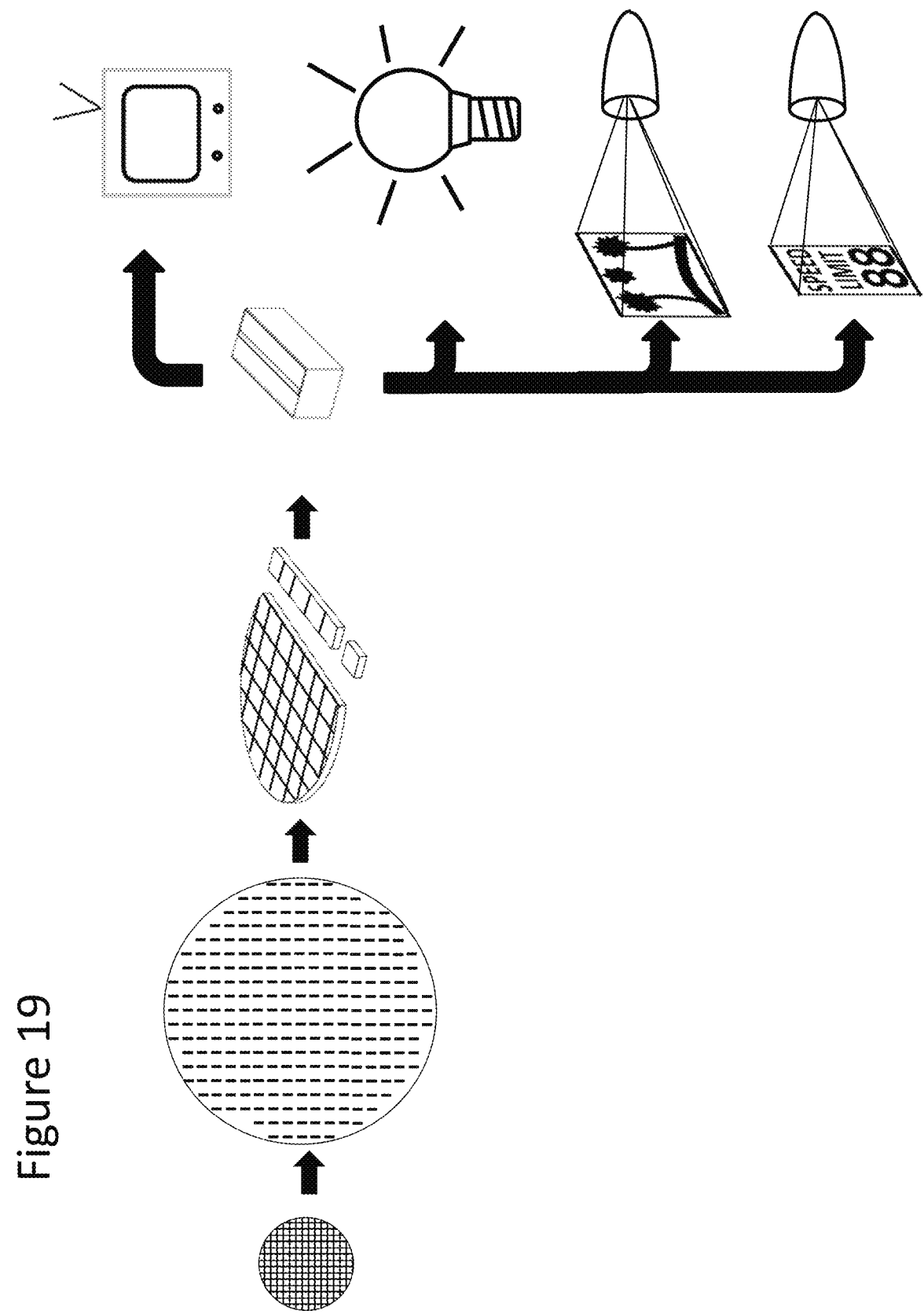
FIG. 19 is a diagram showing the process flow for fabrication of a small area GaN substrate into a chip scale package.

FIG. 19 shows a pictorial representation of the process flow for fabrication of GaN based laser diodes devices from epitaxial films on substrates to final applications. Die may be fabricated on 32 mm GaN wafers and then transferred to a 100 mm SiC substrate. After processing of the die into laser devices the SiC carrier is singulated into individual laser chips that are ready to be installed in various applications such as displays, light sources for general lighting, projectors and car headlamps among others. In this example, about 50 micron wide mesas with a first pitch of about 70 microns may be transferred to the carrier wafer at a second pitch of about 490 microns.

Figure 20:
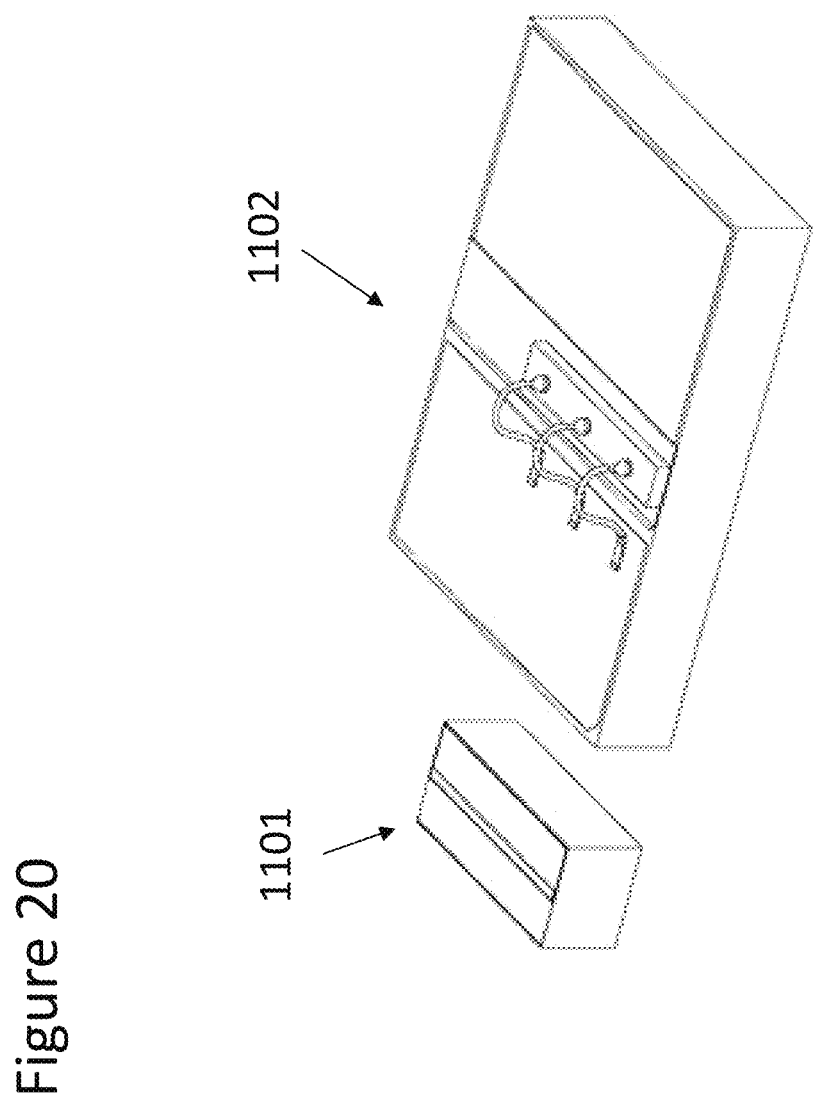
FIG. 20 is a schematic comparing a typical laser die fabricated from a GaN wafer to a laser device fabricated on a transferred laser die and singulated from a carrier wafer.

FIG. 20 shows a schematic representation of a typical laser die on submount 1102 and a device of this invention 1101. The die on submount may be about 1.2 mm long by about 30 micron wide laser ridge fabricated on a GaN substrate thinned to about 75 microns and cleaved into laser die about 1.2 mm long and about 150 microns wide. These die are then attached to a larger submount patterned with electrically isolated wire bond pads. The wire bond pads are connected electrically to the top and bottom of the laser die via wire bonds and a soldered connection respectively. In the chip-scale device, an array of about 50 micron wide by about 1.2 mm by about 2 micron thick laser die are transferred to a SiC carrier wafer, electrical connections and wire-bond pads are fabricated using wafer-scale lithographic processes. The resulting chip is about 1.2 mm by about 0.5 mm wide, however it should be noted that the size of the resulting chip can be scaled by adjusting the pitch of the laser die array on the carrier wafer. In both devices, electrical contact to the pads can be made either by wire bonds or via detachable connections such as pogo-pins, spring clips or the like.

With respect to AlInGaN laser devices, these devices include a gallium and nitrogen containing substrate (e.g., GaN) comprising a surface region oriented in a polar c-plane {0001} orientation, but can be others. The device also has a gallium and nitrogen containing material comprising InGaN overlying the surface region. As used herein, the term "substrate" can mean the bulk substrate or can include overlying growth structures such as a gallium and nitrogen containing epitaxial region, or functional regions such as n-type GaN, combinations, and the like.

GaN light emitting diodes (LEDs) and laser diodes (LDs) are typically produced on c-plane oriented substrates. In the case of LEDs these are typically GaN templates, i.e. thin GaN films grown heteroepitaxially on chemically dissimilar substrates. For example, GaN films may be grown on sapphire, SiC, silicon and spinel among others. In this case the orientation of the GaN film is determined by the crystal structure and orientation of the substrate and the defectivity of the GaN layer is determined by the lattice mismatch between GaN and the substrate as well as the particulars of the growth of the GaN layer. In the case of laser diodes, the high density of extended defects found in templates leads to unacceptably high failure rates. This was first solved by the use of lateral epitaxial overgrowth to produce templates with large regions of reduced defect density. Current state of the art is to use bulk GaN substrates produced by growth of reduced defect density boules either by hydride vapor phase epitaxy or ammonothermal growth. In both cases relatively large (e.g. typically two inch diameter or greater) GaN wafers can be produced which have relatively low density of uniformly distributed defects. Growth on c-plane wafers is advantageous to growth on non-polar and semi-polar oriented GaN wafers only in the aspect that two-inch and greater diameter c-plane wafers are currently available and non-polar and semi-polar orientations are generally restricted in size due to their being crosscut from c-plane oriented boules.

C-plane GaN wafers with no offcut are oriented primarily with the surface normal parallel to the [0001] direction of the wurtzite crystal lattice. The wafer may have an offcut, where the surface normal of the wafer is tilted towards one or a combination of the <11-20> or <10-10> directions. For an arbitrary offcut direction one would normally specify the tilt towards orthogonal pairs of directions found in the <11-20> and <10-10> families. For example, [10-10] and [1-210] are orthogonal and might be used to specify an arbitrary offcut. In general, offcuts will be predominantly towards only one of the <11-20> or <10-10> directions, with only relatively small deviations. For example, a c-plane wafer may have an offcut between 0.1 and 10 degrees towards the [10-10] direction or it may have an offcut between 0.1 and 10 degrees towards the [11-20] direction. Though larger and smaller offcuts would be possible, a wafer with an offcut less than 0.1 degrees would be considered to be nominally on-axis.

Wafer offcut is important because it will determine both the density of atomic steps on the wafer surface as well as the termination of the step edges. Because an arbitrarily oriented surface of a crystal is likely to have a high surface energy, a crystal will tend to form an approximation of an inclined face using a collection of low energy planes. In general, an offcut c-plane wafer would result in a stepped surface comprised of [0001] step surfaces and step-edges composed of prismatic planes (i.e. (11-20) or (10-10)). Due to anisotropy in the crystal structure the number and configuration of dangling bonds at (11-20) step edges will be different from those at a (10-10) step edge. Since the direction and magnitude of the offcut controls the density and orientation of the step edges, a large amount of control over the chemical character of the substrate can be affected by offcut. Many growth processes such as chemical ordering, incorporation of volatile species and formation of stacking faults can be linked to the way atoms incorporate at the edges of steps. Therefore, proper selection of substrate offcut is critical to achieving the best epitaxial film quality.

Though c-plane wafers are larger than non-polar and semi-polar oriented wafers and offer a cost advantage, they have a severe drawback. Typically c-plane lasers require the use of only a few narrow quantum wells due to the internal polarization fields that result in a spatial separation of electron and hole states within wide wells that negatively impacts the differential gain. Using few narrow wells has the negative effect of limiting the index contrast that can be achieved between the active region and GaN cladding layers. In order to increase the index contrast between the active region and the cladding layers and thereby increase the optical confinement, c-plane devices typically utilize aluminum containing cladding layers.

There are a number of disadvantages to using aluminum containing cladding. AlGaN layers tend to be more resistive than GaN, especially when doped p-type, adding to the total series resistance of the laser devices. AlGaN is also under tension when grown on unstrained GaN layers, which limits both the thickness and composition of the AlGaN cladding that can be grown before cracks or other extended defects form due to the tensile strain. High quality AlGaN growth also typically requires higher growth temperatures and slower growth rates than GaN. Aluminum containing precursors also react more readily in the gas phase than those of indium and gallium, resulting in the formation of more particles and related contamination of the epitaxial films during growth. Quaternary (AlInGaN) cladding is one possible alternative, however AlInGaN layers only solve the issues related to tensile strain while introducing more difficult growth control as the high temperatures required to grow high-quality AlInGaN also inhibit the incorporation of indium.

This invention in application to c-plane laser diode devices is advantageous in that it allows for the substitution of the thick relatively high aluminum content cladding layers by non-epitaxial or ex situ deposited materials with equivalent or lower refractive index. For example, a thin device structure consisting of several hundred nanometers of GaN cladding on either side of the InGaN quantum wells could be clad with high conductivity but low absorptivity TCO such as ZnO, ZnGaO, Ga2O3, ITO and the like. Since the refractive index of these materials is much lower than that of low composition AlGaN highly confining waveguides are easily made even with active regions that would otherwise not support a guided mode, and depending on design may have better optical confinement than a conventional device utilizing the thick and relatively high aluminum-content cladding layers. As an alternative to low index materials such as TCOs, highly reflective metals can be used to help confine the mode by using thin cladding regions without causing unacceptable levels of loss. Examples of such reflective metals include silver, aluminum, and gold. In certain embodiments the entire AlGaN cladding layers can be eliminated from the epitaxial structure and in other embodiments thinner and/or lower aluminum content cladding layers can coexist with the low index ex-situ deposited materials such as TCOs and/or the reflective metals. Using such a structure would also improve process cleanliness, increase throughput by reducing the growth time significantly and lower device resistivity.

Figure 21:
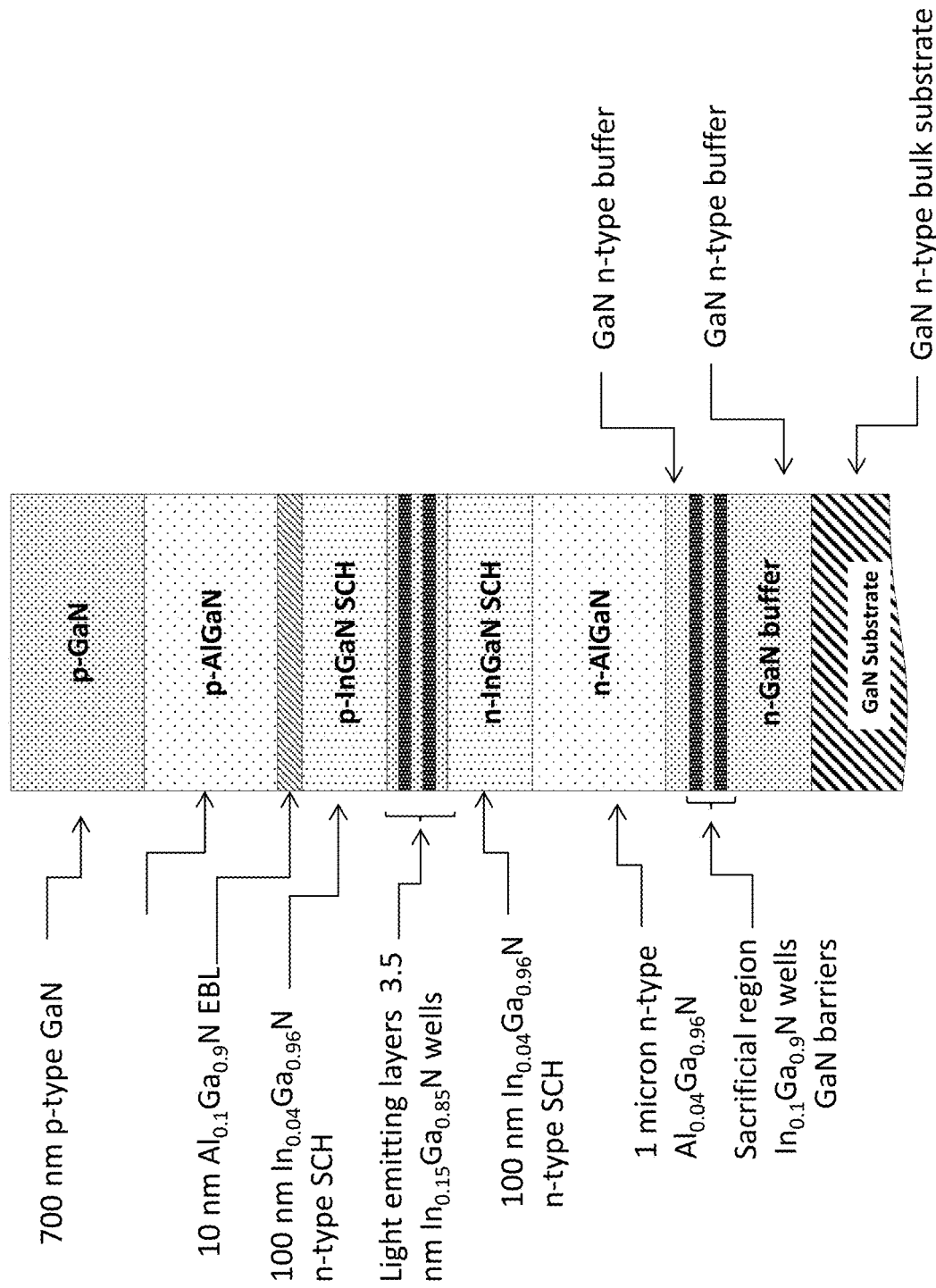
FIG. 21 is a schematic representation of a c-plane epitaxial structure for an embodiment of this invention where an otherwise conventional epitaxial design for a c-plane laser incorporates both a sacrificial layer and a n-contact layer, which facilitate transfer of the epitaxial device layers in accordance with this invention as well as making electrical contact to the exposed n-side surface of the transferred device.

In an embodiment, a sacrificial layer is grown along with an n-contact layer that will be exposed after transfer. Overlaying the n-contact layer are layers comprising a structure similar to that of a conventional c-plane laser diode. In this embodiment an n-type GaN buffer layer is grown on a c-plane oriented, bulk-GaN wafer. Overlaying the buffer layer is a sacrificial layer comprised by InGaN wells separated by GaN barriers with the well composition and thickness chosen to result in the wells absorbing light at wavelengths shorter than 450 nm, though in some embodiments the absorption edge would be as short as 400 nm and in other embodiments as long as 520 nm. Overlaying the sacrificial layer is an n-type contact layer consisting of GaN doped with silicon at a concentration of 5E18 cm-3, though in other embodiments the doping may range between 1E18 and 1E19 cm-3. Overlaying the contact layer is an n-type AlGaN cladding layer with a thickness of 1 micron with an average composition of 4% AlN, though in other embodiments the thickness may range from 0.25 to 2 microns with an average composition of 1-8% AlN. Overlaying the n-cladding is an n-type wave-guiding or separate confinement heterostructure (SCH) layer that helps provide index contrast with the cladding to improve confinement of the optical modes. The nSCH is InGaN with a composition of 4% InN and has a thickness of 100 nm, though in other embodiments the InGaN nSCH may range from 20 to 300 nm in thickness and from 0-8% InN and may be composed of several layers of varying composition and thickness. Overlaying the n-SCH are light emitting layers consisting of two 3.5 nm thick $In_{0.15}Ga_{0.85}N$ quantum wells separated by 4 nm thick GaN barriers, though in other embodiments there may 1 to five light emitting layers consisting of 1 nm to 6 nm thick quantum wells separated by by GaN or InGaN barriers of 1 nm to 25 nm thick. Overlaying the light emitting layers is an InGaN pSCH with a composition of 4% InN and has a thickness of 100 nm, though in other embodiments the nSCH may range from 20 to 300 nm in thickness and from 0-8% InN and may be composed of several layers of varying composition and thickness. Overlaying the pSCH is an AlGaN electron blocking layer [EBL] with a composition of 10% AlN, though in other embodiments the AlGaN EBL composition may range from 0% to 30% AlN. Overlaying the EBL a p-type AlGaN cladding layer with a thickness of 0.2 micron with an average composition of 4% AlN, though in other embodiments the thickness may range from 0.25 to 2 microns with an average composition of 1-8% AlN. Overlaying the p-AlGaN cladding is p-GaN cladding with a thickness of 700 nm, though in other embodiments the p-GaN cladding thickness may range from 0 nm to 1500 nm. The p-GaN cladding is terminated at the free surface of the crystal with a highly doped p++ or p-contact layer that enables a high quality electrical p-type contact to the device. This device is shown in schematic form in FIG. 21.

In another embodiment, low-refractive index TCO cladding layers are applied to both the p-type and n-type side of the laser diode to enhance the optical confinement of the structure. Because of this, low-refractive index aluminum containing layers are not necessary, which reduces the overall strain in the epitaxial structure, the time required for deposition of the device layers in the growth chamber and the series resistance of the device as relatively thick and resistive layers of AlGaN or AlInGaN are not present in the structure. In this embodiment an n-type GaN buffer layer is grown on a c-plane oriented, bulk-GaN wafer. Overlaying the buffer layer is a sacrificial layer comprised by InGaN wells separated by GaN barriers with the well composition and thickness chosen to result in the wells absorbing light at wavelengths shorter than 450 nm, though in some embodiments the absorption edge would be as short as 400 nm and in other embodiments as long as 520 nm. Overlaying the sacrificial layer is an n-type contact layer consisting of GaN doped with silicon at a concentration of 5E18 cm-3, though is other embodiments the doping may range between 1E18 and 1E19 cm-3. Overlaying the contact layer is an n-type GaN cladding layer with a thickness of 100 nanometers, though in other embodiments the thickness may range from 50 to 1000 nanometers and may be composed of alloys of InGaN ranging from 0.5-10% InN. Overlaying the n-GaN cladding is an n-type wave-guiding or separate confinement heterostructure (SCH) layer that helps provide index contrast with the cladding to improve confinement of the optical modes. The nSCH is InGaN with a composition of 4% InN and has a thickness of 100 nm, though in other embodiments the nSCH may range from 20 to 300 nm in thickness and from 0-8% InN and may be composed of several layers of varying composition and thickness. Overlaying the n-SCH are light emitting layers consisting of two 3.5 nm thick $In_{0.15}Ga_{0.85}N$ quantum wells separated by 4 nm thick GaN barriers, though in other embodiments there may 1 to five light emitting layers consisting of 1 nm to 6 nm thick quantum wells separated by GaN or InGaN barriers of 1 nm to 25 nm thick. Overlaying the light emitting layers is an InGaN pSCH with a composition of 4% InN and has a thickness of 100 nm, though in other embodiments the nSCH may range from 20 to 300 nm in thickness and from 0-8% InN and may be composed of several layers of varying composition and thickness. Overlaying the pSCH is an AlGaN electron blocking layer [EBL] with a composition of 10% AlN, though in other embodiments the AlGaN EBL can range in composition from 0% to 30% AlN. Overlaying the contact layer is a p-type GaN cladding layer with a thickness of 100 nanometers, though in other embodiments the thickness may range from 50 to 1000 nanometers and may be composed of alloys of InGaN ranging from 0.5-10% InN. The p-GaN cladding is terminated at the free surface of the crystal with a highly doped p++ or p-GaN contact layer that enables a high quality electrical p-type contact to the device. This device is shown in schematic form in FIG. 22.

Figure 23:
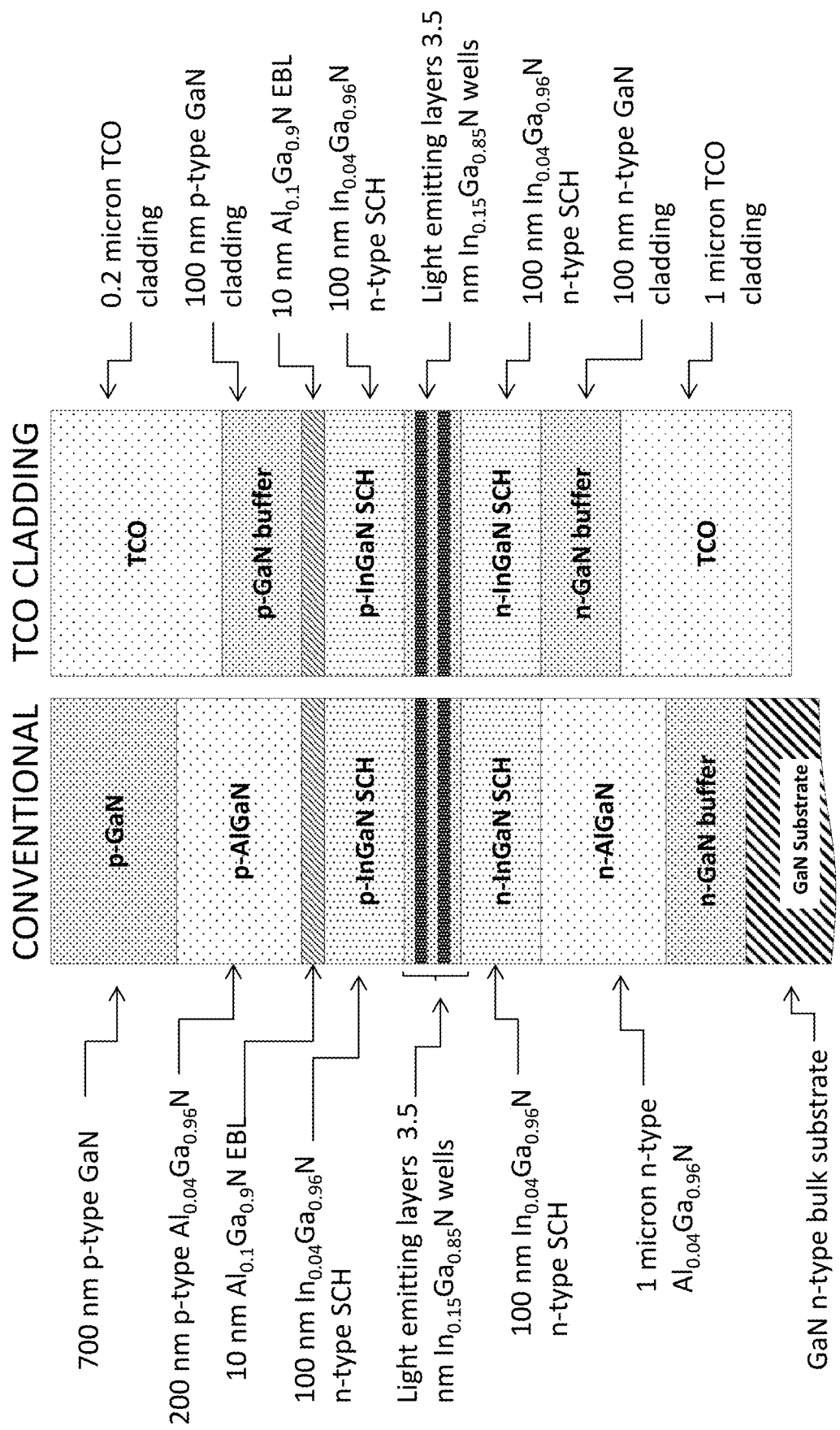
FIG. 23 is a schematic representation of epitaxial structures for a conventional c-plane laser diode utilizing AlGaN cladding for an embodiment of this invention and an example where thin epitaxial structures are transferred from the original substrate and non-epitaxial, low-refractive-index cladding is applied to both sides of the cavity by depositing transparent conducting oxide layers.
Figure 24:
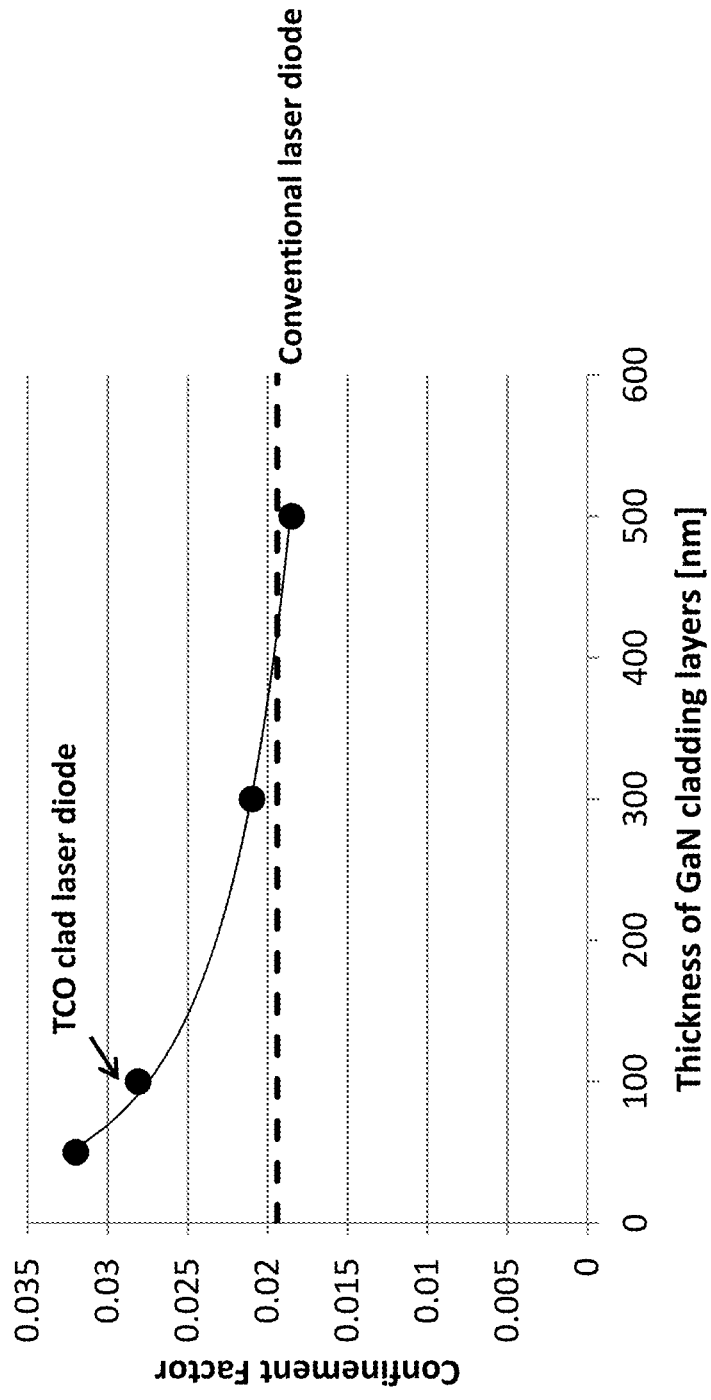
FIG. 24 shows a plot of confinement factors for a TCO clad c-plane laser simulated using a commercially available optical mode solving software package. The dashed line corresponds to the confinement factor found in a conventional c-plane laser diode structure. Both the TCO clad and c-plane data correspond to the structures shown in FIG. 23.

FIG. 23 shows a comparison of schematic representations of the final structure of a conventional c-plane laser diode to a transferred c-plane laser diode with low-index, TCO cladding on both sides of the diode. Metal contact layers, ridges and related structures, passivating oxides and other device specific features are not shown for clarity. Of note is the difference in total thickness of epitaxial material between the two types of devices. The TCO clad transferred device contains less than 0.5 microns of epitaxial material, whereas the conventional laser diode contains over two microns of epitaxial material, with the majority of the thickness of the device consisting of aluminum containing alloys that are typically grown with relatively low growth rates. Due to the thinness of the quantum wells in c-plane laser diodes it is not possible for high optical confinement factors to be achieved when relying only on the index contrast between the InGaN layers and GaN cladding layers. To provide sufficient optical confinement for high differential gain relatively low index AlGaN layers are added. As previously mentioned, these layers are typically more resistive than an equivalently doped GaN layer, with the difference being larger for p-type layers relative to n-type. Moreover, there are limits to how much optical confinement one can achieve with aluminum containing layers. In order to achieve high index contrast, layers with very high aluminum content must be grown. This, however, leads to both increased resistivity as well as increased tensile strain. In practice, it is not possible to confine the optical mode in a very small volume due to the lack of index contrast due to the relatively small difference in index contrast between AlN and GaN, which are about 2.2 and about 2.4, respectively, at 450 nanometers. Cladding the active region on both sides with transparent conductive oxide, however, allows for confinement of the optical mode into very small volumes, resulting in relatively high confinement factors. This is because TCOs tend to have relatively small refractive indices (e.g. on the order of 1.9-2.0). FIG. 24 shows results for simulations of the confinement factors for a conventional c-plane laser structure [dashed line] and a c-plane laser structure utilizing TCO cladding on both sides of the cavity [solid points and line]. These structures correspond to those shown in FIG. 23. The y-axis gives the simulated confinement factor, while the x-axis shows the thickness of GaN cladding in the TCO clad structure. As can be seen, for instances where the GaN cladding is below 300 nm in thickness the TCO clad structure has a higher confinement factor than the conventional c-plane laser diode. For very thin GaN claddings [i.e. very thin cavities] the confinement factor is as much as 50% higher than the conventional laser diode. This increased confinement factor leads directly to increased differential gain in the TCO clad structure.

Figure 22:
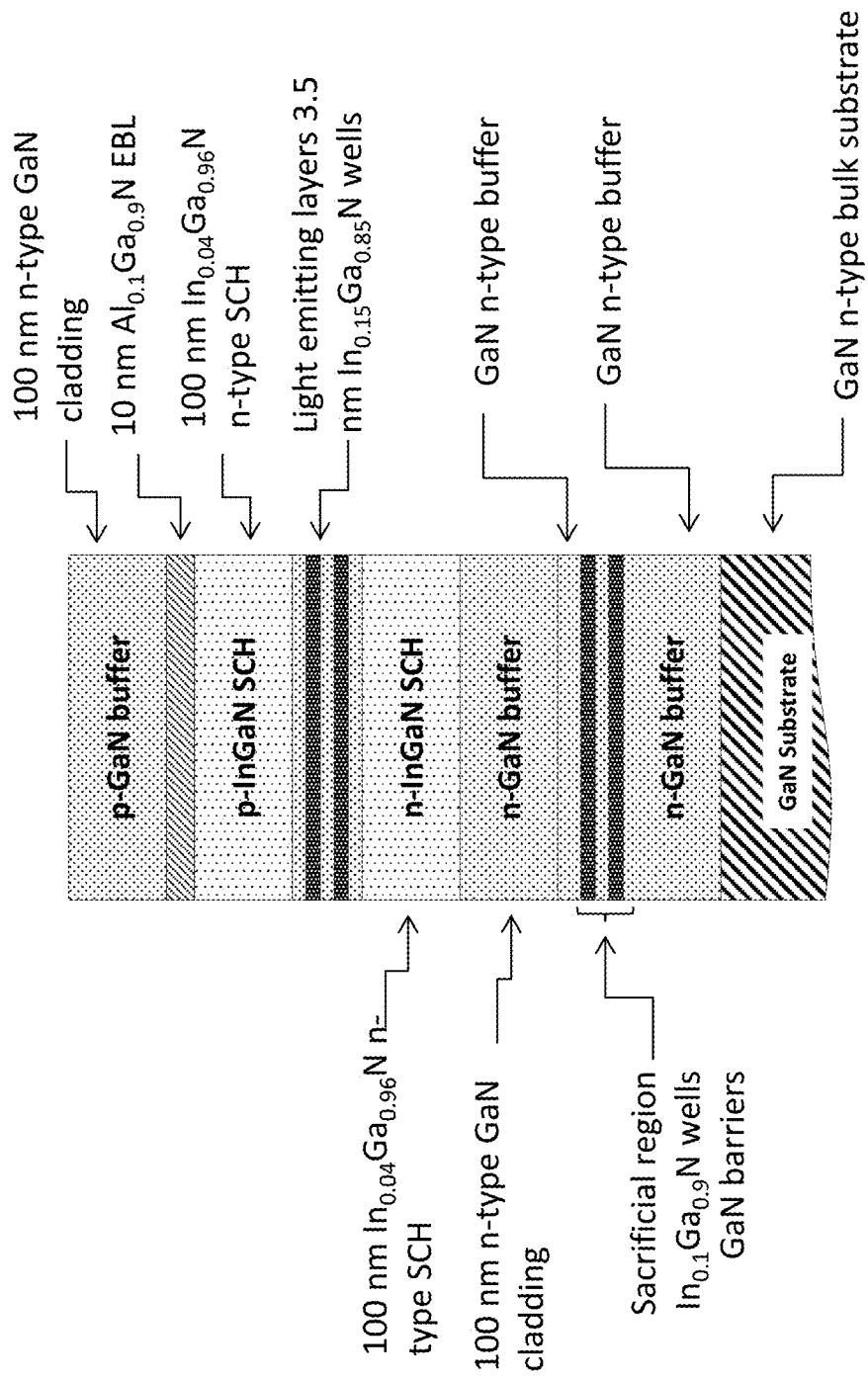
FIG. 22 is a schematic representation of a c-plane epitaxial structure for an embodiment of this invention where the transferred epitaxial device layers are intended to be clad on both sides with a transparent conductive oxide as shown in FIG. 23.

In yet another embodiment, the TCO layers depicted in FIG. 22 are replaced by reflective metals. As an example, aluminum could be used for the n-contact and silver could be used on the p-contact. In this embodiment the metal would serve to confine the optical mode without contributing an unacceptable amount of modal loss.

In an example, this method uses conventional planar growth of a LD epi-structure on a polar c-plane GaN substrate. A transparent conductive oxide (TCO) is then deposited on the free epitaxial surface to form a transparent, conductive contact layer with an index of refraction lower than GaN or AlGaN films of compositions that can be grown fully strained at the thicknesses needed to provide sufficient confinement of the optical mode. Two example TCOs are indium tin oxide (ITO) and zinc oxide (ZnO). ITO is the commercial standard for TCOs, and is used in a variety of fields including displays and solar cells where a semi-transparent electrical contact is desired. ZnO offers the advantage of being a direct gap semiconductor with the same crystal structure as GaN and can be grown epitaxially on GaN at temperatures relatively low compared to growth temperatures of AlInGaN alloys. The bandgap of ZnO is also sufficiently large and similar to GaN (approx. 3.3 eV) that it will exhibit negligible band-edge absorption of visible wavelengths of light. ZnO can be deposited in a variety of ways such as metal organic chemical vapor deposition, other vapor deposition techniques, and from a solution. In another example the TCO is replaced with a reflective metal such as aluminum, silver, gold or other. In yet another example a combination of a TCO and a reflective metal is employed.

The wafer is then bonded to a handle, with the free-surface of the TCO adjacent to the bonding interface. The bonding can either be direct, i.e. with the TCO in contact with the handle material, or indirect, i.e. with a bonding media disposed between the TCO and the handle material in order to improve the bonding characteristics. For example, this bonding media could be Au—Sn solder, CVD deposited SiO2, a polymer, CVD or chemically deposited polycrystalline semiconductor or metal, etc. Indirect bonding mechanisms may include thermocompression bonding, anodic bonding, glass frit bonding, bonding with an adhesive with the choice of bonding mechanism dependent on the nature of the bonding media.

Thermocompression bonding involves bonding of wafers at elevated temperatures and pressures using a bonding media disposed between the TCO and handle wafer. The bonding media may be comprised of a number of different layers, but typically contain at least one layer (the bonding layer) that is composed of a relatively ductile material with a high surface diffusion rate. In many cases this material is either Au, Al or Cu. The bonding stack may also include layers disposed between the bonding layer and the TCO or handle wafer that promote adhesion or act as diffusion barriers should the species in the TCO or handle wafer have a high solubility in the bonding layer material. For example an Au bonding layer on a Si wafer may result in diffusion of Si to the bonding interface, which would reduce the bonding strength. Inclusion of a diffusion barrier such as silicon oxide or nitride would limit this effect. Relatively thin layers of a second material may be applied on the top surface of the bonding layer in order to promote adhesion between the bonding layers disposed on the TCO and handle. Some bonding layer materials of lower ductility than gold (e.g. Al, Cu etc.) or which are deposited in a way that results in a rough film (for example electrolytic deposition) may require planarization or reduction in roughness via chemical or mechanical polishing before bonding, and reactive metals may require special cleaning steps to remove oxides or organic materials that may interfere with bonding.

Metal layer stacks may be spatially non-uniform. For example, the initial layer of a bonding stack may be varied using lithography to provide alignment or fiducial marks that are visible from the backside of the transparent substrate.

Thermocompressive bonding can be achieved at relatively low temperatures, typically below 500 degrees Celsius and above 200. Temperatures should be high enough to promote diffusivity between the bonding layers at the bonding interface, but not so high as to promote unintentional alloying of individual layers in each metal stack. Application of pressure enhances the bond rate, and leads to some elastic and plastic deformation of the metal stacks that brings them into better and more uniform contact. Optimal bond temperature, time and pressure will depend on the particular bond material, the roughness of the surfaces forming the bonding interface and the susceptibility to fracture of the handle wafer or damage to the device layers under load.

The bonding interface need not be composed of the totality of the wafer surface. For example, rather than a blanket deposition of bonding metal, a lithographic process could be used to deposit metal in discontinuous areas separated by regions with no bonding metal. This may be advantageous in instances where defined regions of weak or no bonding aid later processing steps, or where an air gap is needed. One example of this would be in removal of the GaN substrate using wet etching of an epitaxially grown sacrificial layer. To access the sacrificial layer one must etch vias into either of the two surfaces of the epitaxial wafer, and preserving the wafer for re-use is most easily done if the vias are etched from the bonded side of the wafer. Once bonded, the etched vias result in channels that can conduct etching solution from the edges to the center of the bonded wafers, and therefore the areas of the substrate comprising the vias are not in intimate contact with the handle wafer such that a bond would form.

The bonding media can also be an amorphous or glassy material bonded either in a reflow process or anodically. In anodic bonding the media is a glass with high ion content where mass transport of material is facilitated by the application of a large electric field. In reflow bonding the glass has a low melting point, and will form contact and a good bond under moderate pressures and temperatures. All glass bonds are relatively brittle, and require the coefficient of thermal expansion of the glass to be sufficiently close to the bonding partner wafers (i.e. the GaN wafer and the handle). Glasses in both cases could be deposited via vapor deposition or with a process involving spin on glass. In both cases the bonding areas could be limited in extent and with geometry defined by lithography or silk-screening process.

Direct bonding between TCO deposited on both the GaN and handle wafers, of the TCO to the handle wafer or between the epitaxial GaN film and TCO deposited on the handle wafer would also be made at elevated temperatures and pressures. Here the bond is made by mass transport of the TCO, GaN and/or handle wafer species across the bonding interface. Due to the low ductility of TCOs the bonding surfaces must be significantly smoother than those needed in thermocompressive bonding of metals like gold.

Figure 25:
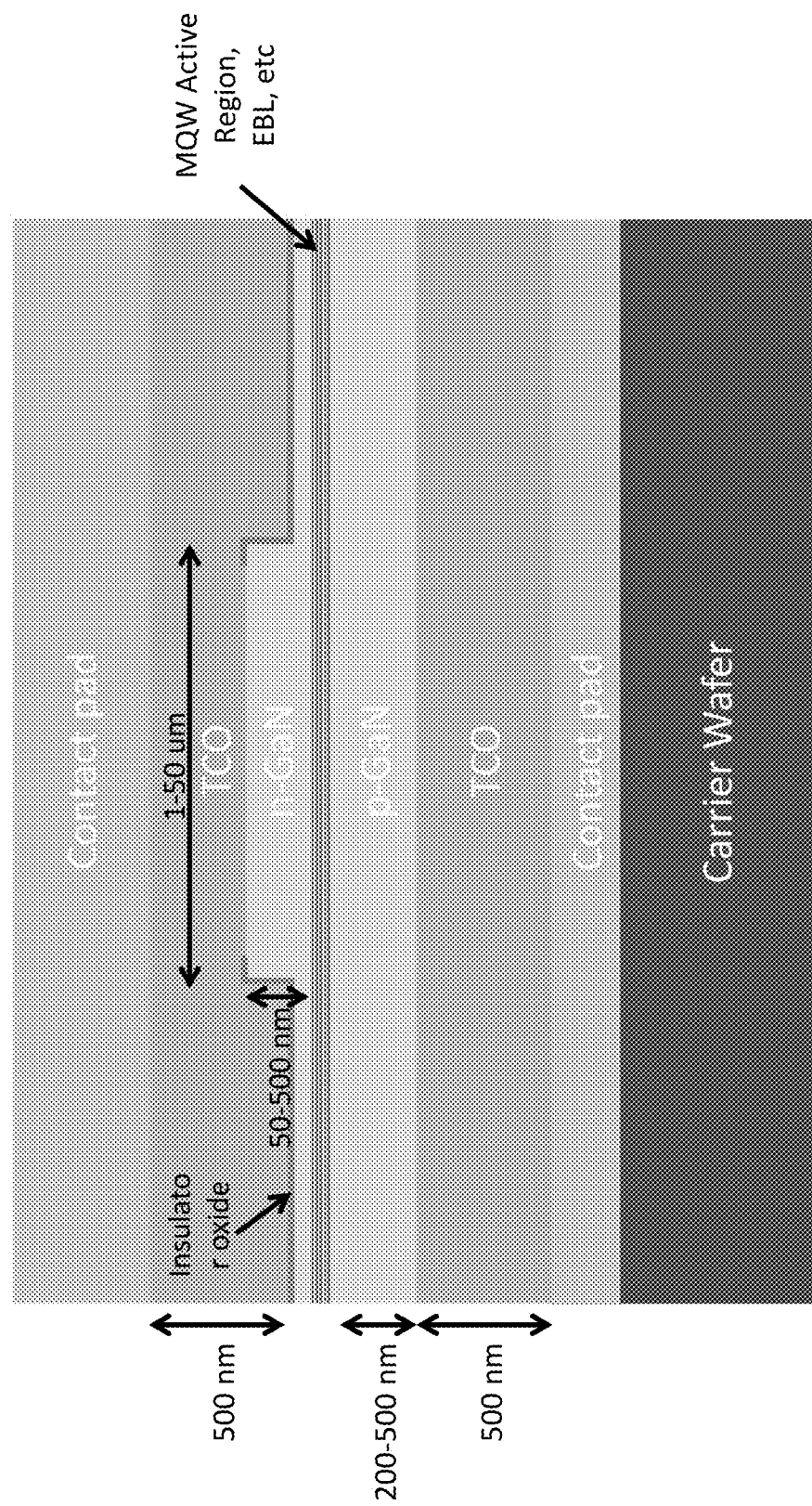
FIG. 25 is an example schematic cross section of laser waveguide with double conductive oxide cladding showing ridge formation in n-type gallium and nitrogen containing material such as GaN in an example.
Figure 26:
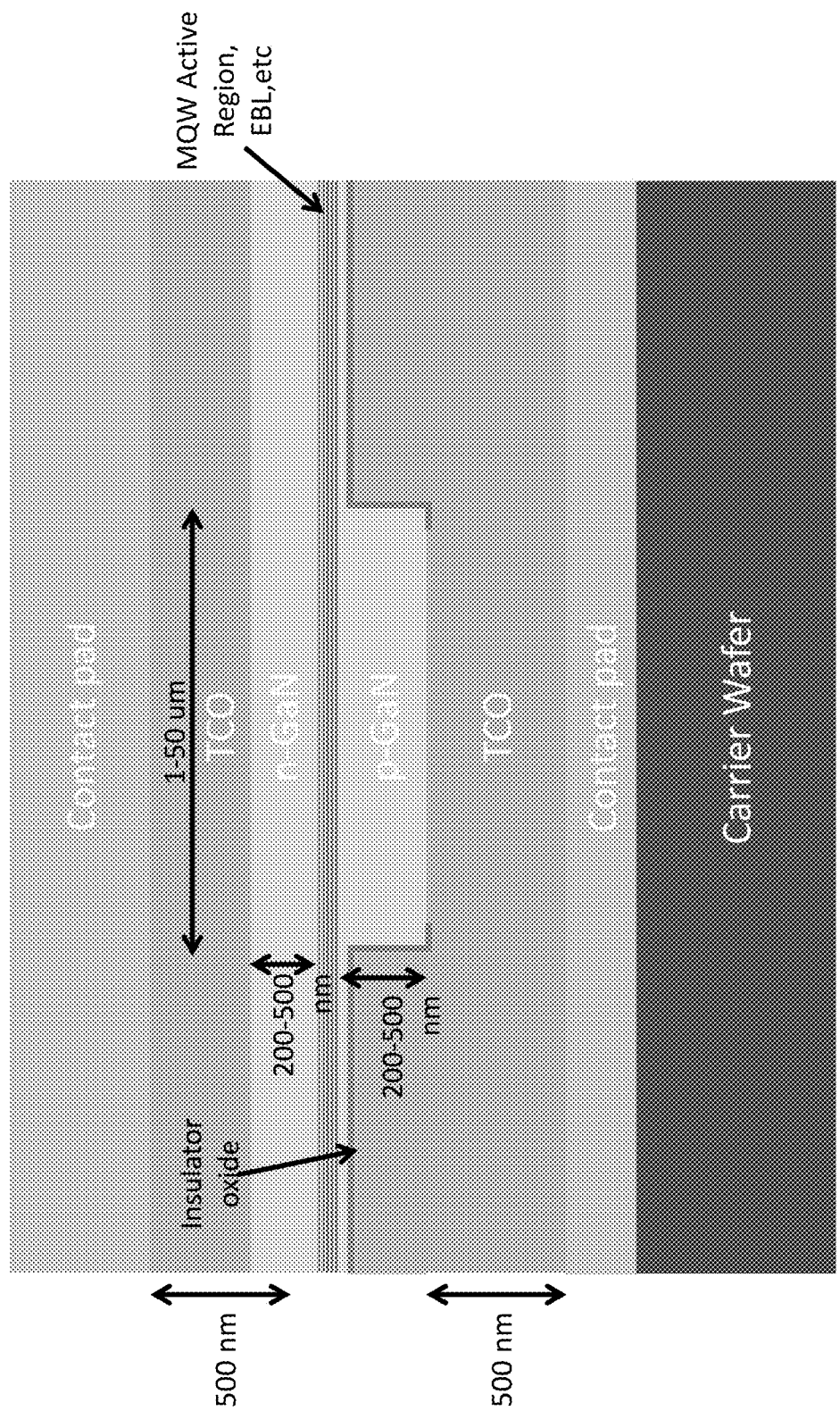
FIG. 26 is an example schematic cross section of laser waveguide with double conductive oxide cladding showing ridge formation in p-type gallium and nitrogen containing material such as GaN.
Figure 27:
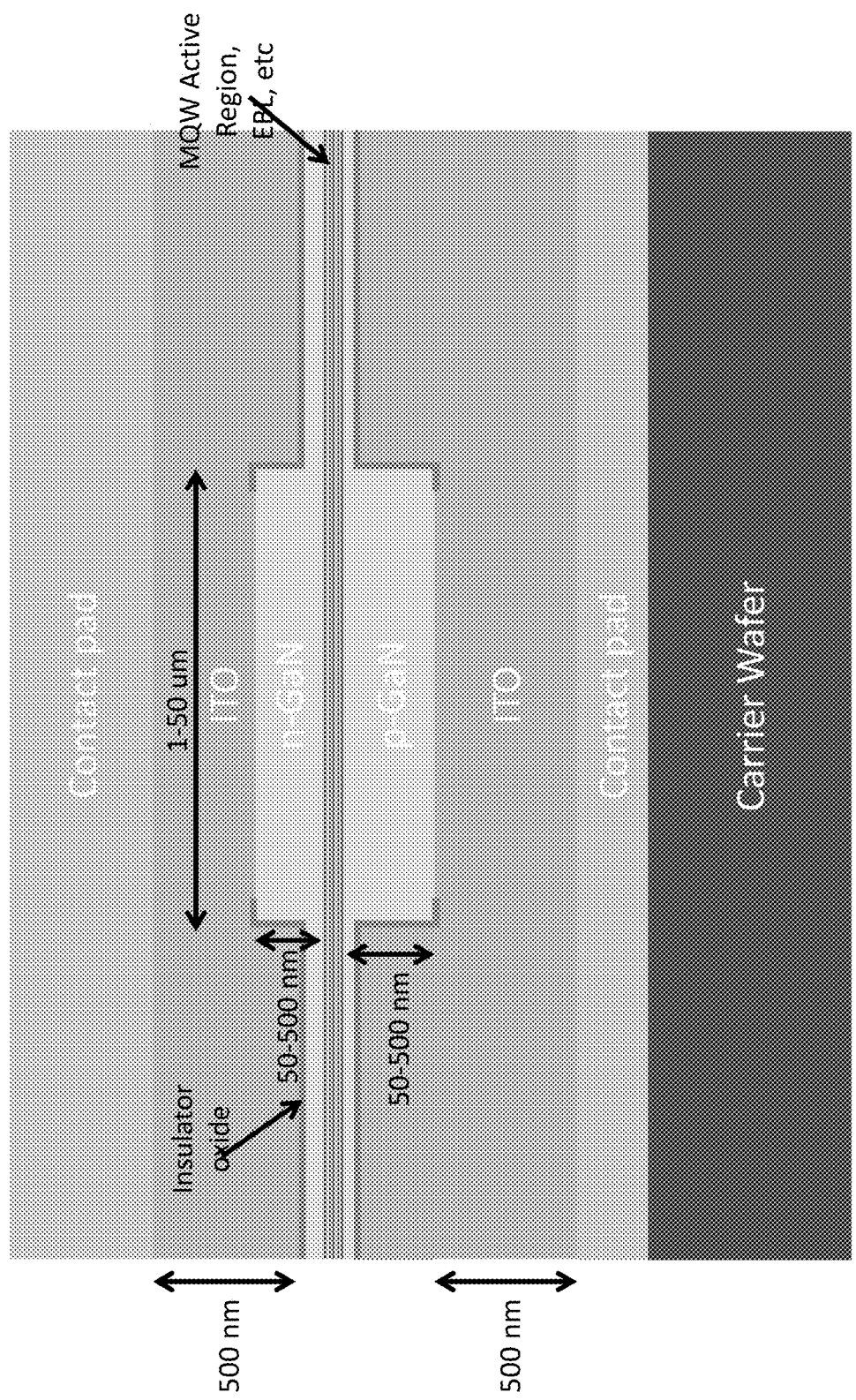
FIG. 27 is an example schematic cross section of laser waveguide with double conductive oxide cladding showing ridge formation in n-type and in p-type gallium and nitrogen containing material such as GaN.
Figure 28:
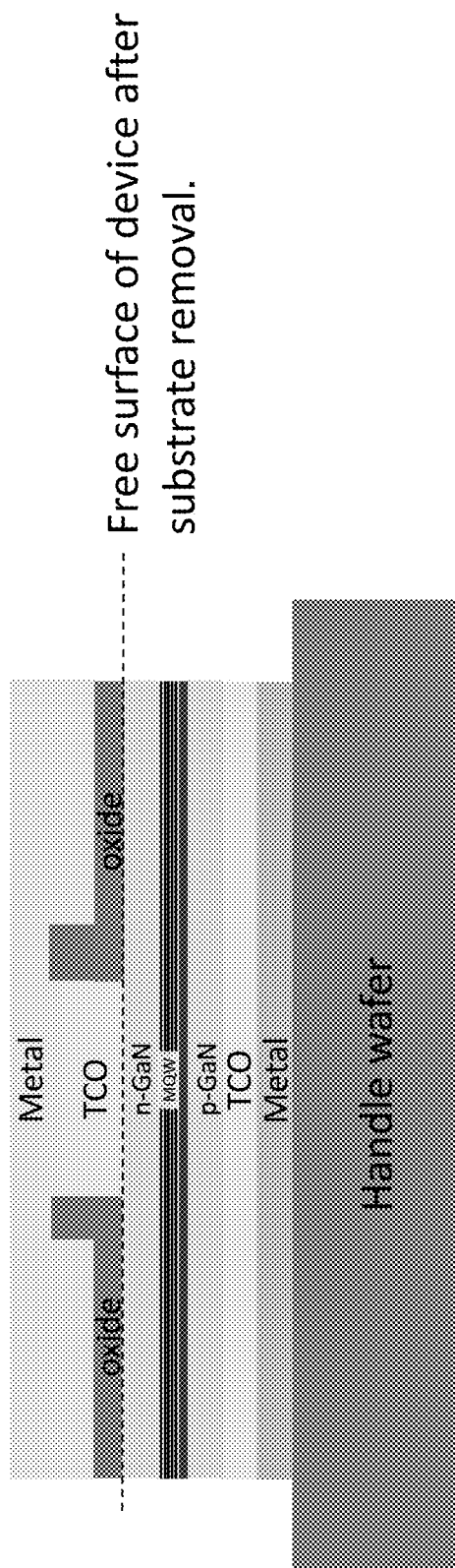
FIG. 28 is an example illustrating a ridge formed from TCO.

The embodiments of this invention will typically include a ridge of some kind to provide lateral index contrast that can confine the optical mode laterally. One embodiment would have the ridge etched into the epitaxially grown GaN cladding layers. In this case, it does not matter whether the ridge is etched into the p-type GaN layer before TCO deposition and bonding or into the n-type layer after bonding and removal of the substrate. FIG. 25 is an example schematic cross section of laser waveguide with double conductive oxide cladding showing ridge formation in n-type gallium and nitrogen containing material such as GaN in an example. FIG. 26 is an example schematic cross section of laser waveguide with double conductive oxide cladding showing ridge formation in p-type gallium and nitrogen containing material such as GaN. In this case, the TCO would have to be planarized somehow to provide a surface conducive to bonding unless a reflowable or plastically deformable bonding media is used which could accommodate large variations in height on the wafer surface. FIG. 27 is an example schematic cross section of laser waveguide with double conductive oxide cladding showing ridge formation in n-type and in p-type gallium and nitrogen containing material such as GaN. FIG. 28 is an example schematic cross section of laser waveguide where the lateral waveguide ridge is formed in the transparent conductive oxide. The lateral index contrast is provided by difference in index between n-side TCO and passivating oxide. This is best where the GaN cladding is thin or where the n-side GaN cladding is much thinner than the p-side GaN cladding.

Laser ablation is a process where an above-band-gap emitting laser is used to decompose an absorbing sacrificial (Al,In,Ga)N layer by heating and inducing desorption of nitrogen. The remaining Ga sludge is then etched away using aqua regia or HCl. This technique can be used similarly to PEC etching in which a sacrificial material between the epitaxial device and the bulk substrate is etched/ablated away resulting in separation of the epitaxial structure and the substrate. The epitaxial film (already bonded to a handling wafer) can then be lapped and polished to achieve a planar surface.

PEC etching is a photoassisted wet etch technique that can be used to etch GaN and its alloys. The process involves an above-band-gap excitation source and an electrochemical cell formed by the semiconductor and the electrolyte solution. In this case, the exposed (Al,In,Ga)N material surface acts as the anode, while a metal pad deposited on the semiconductor acts as the cathode. The above-band-gap light source generates electron-hole pairs in the semiconductor. Electrons are extracted from the semiconductor via the cathode while holes diffuse to the surface of material to form an oxide. Since the diffusion of holes to the surface requires the band bending at the surface to favor a collection of holes, PEC etching typically works only for n-type material although some methods have been developed for etching p-type material. The oxide is then dissolved by the electrolyte resulting in wet etching of the semiconductor. Different types of electrolyte including HCl, KOH, and $HNO_3$ have been shown to be effective in PEC etching of GaN and its alloys. The etch selectivity and etch rate can be optimized by selecting a favorable electrolyte. It is also possible to generate an external bias between the semiconductor and the cathode to assist with the PEC etching process.

Sacrificial layers for lift-off of the substrate via photochemical etching would incorporate at a minimum a low-bandgap or doped layer that would absorb the pump light and have enhanced etch rate relative to the surrounding material. The sacrificial layer can be deposited epitaxially and their alloy composition and doping of these can be selected such that hole carrier lifetime and diffusion lengths are high. Defects that reduce hole carrier lifetimes and diffusion length must can be avoided by growing the sacrificial layers under growth conditions that promote high material crystalline quality. An example of a sacrificial layer would be InGaN layers that absorb at the wavelength of an external light source. An etch stop layer designed with very low etch rate to control the thickness of the cladding material remaining after substrate removal can also be incorporated to allow better control of the etch process. The etch properties of the etch stop layer can be controlled solely by or a combination of alloy composition and doping. A potential etch stop layer would an AlGaN layer with a bandgap higher than the external light source. Another potential etch stop layer is a highly doped n-type AlGaN or GaN layer with reduce minority carrier diffusion lengths and lifetime thereby dramatically reducing the etch rate of the etch stop material.

In an embodiment, selective etching of the sacrificial region using photoelectrochemical (PEC) etching is achieved without the use of an active region protecting layer by electrically shorting the p-side of the laser diode pn-junction to the n-side. Etching in the PEC process is achieved by the dissolution of AlInGaN materials at the wafer surface when holes are transferred to the etching solution. These holes are then recombined in the solution with electrons extracted at the cathode metal interface with the etching solution. Charge neutrality is therefore achieved. Selective etching is achieved by electrically shorting the anode to the cathode. Electron hole pairs generated in the device light emitting layers are swept out of the light emitting layers by the electric field of the of the p-n junction. Since holes are swept out of the active region, there is little or no etching of the light emitting layer. The buildup of carriers produces a potential difference that drives carriers through the metal interconnects that short the anode and cathode where they recombine. The flat band conditions in the sacrificial region result in a buildup of holes that result in rapid etching of the sacrificial layers. In one embodiment, the metal interconnects to short the anode and cathode can be used as anchor regions to mechanically hold the gallium and nitrogen containing mesas in place prior to the bonding step.

The relative etch rates of the sacrificial and active regions are determined by a number of factors, but primarily it is determined by the density of holes found in the active region at steady state. If the metal interconnects or anchors are very resistive, or if either the cathode or anode electrical contacts to the p-type and n-type, respectively, cladding regions are too resistive or have large schottky barriers then it is possible for carriers to accumulate on either side of the pn-junction. These carriers will produce an electric field that acts against the field in the depletion region and will reduce the magnitude of the field in the depletion region until the rate of photo-generated carrier drift out of the active region is balanced by the recombination rate of carriers via the metal layers shorting the cathode and anode. Some recombination will take place via photochemical etching, and since this scales with the density of holes in the active region it is preferable to prevent the buildup of a photo-induced bias across the active region.

PEC etching can be done before or after direct/indirect bonding of the free surface of the TCO to the handle material. In one case, the PEC etching is done after bonding of the p-side TCO to the handle material and the PEC etch releases the III-nitride epitaxial material from the GaN substrate. In another case, PEC etching of the sacrificial layer is done before bonding such that the III-nitride epitaxial material is held mechanically stable on the GaN substrate via anchor regions formed from semiconductor, metal, or other materials. TCO is then deposited on the epitaxial material and the TCO free surface is bonded to a handle wafer that can be composed of various materials. After bonding, mechanical force is applied to the handle wafer and GaN substrate to complete the release of III-nitride epitaxial material from the GaN substrate.

Figure 29:
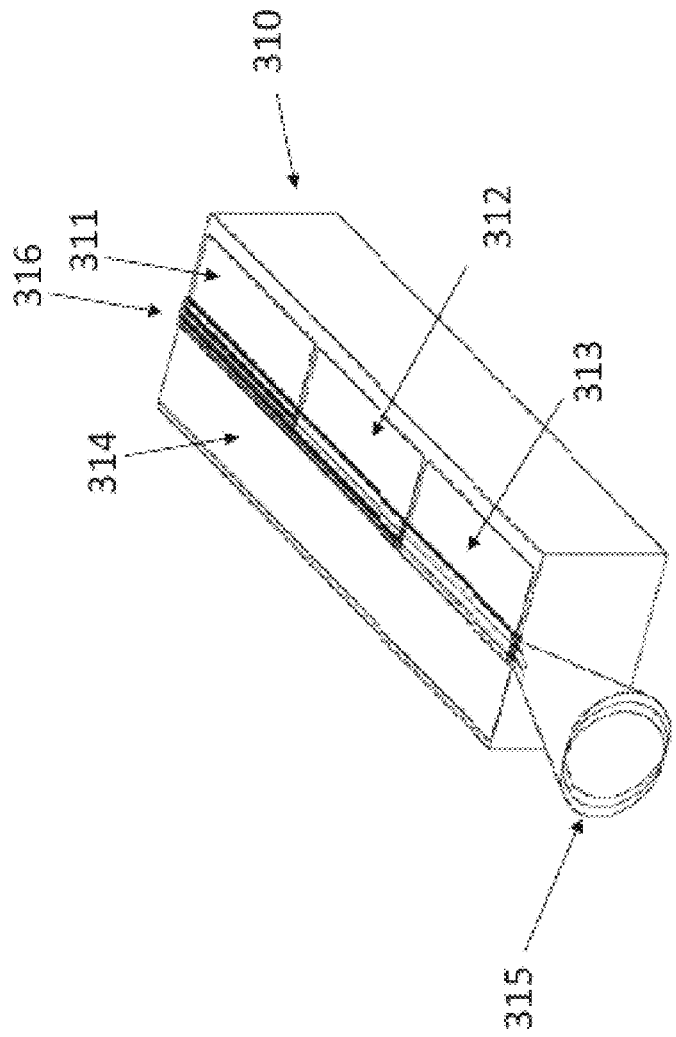
FIG. 29 is a drawing of a RGB laser chip according to an embodiment of this invention.

FIG. 29 is a drawing of a RGB laser chip fabricated using the selective area bonding process as according to an embodiment. Three laser dice 316 are bonded to a carrier wafer 310 and processed with laser features (ridges, passivation, electrical contacts, etc.) such that the laser ridges are parallel. The dice are electrically isolated from the carrier wafer material. A common bottom contact 314 is shared between the die while individual top-side electrical contacts 311, 312 and 313 are provided such that the laser devices on each die can be operated individually. The emission cones 315 of the laser devices on each of the die overlap substantially, deviating only lateral by a distance less than or equal to the total width spanned by the laser dice. In this drawing the laser chip has been singulated from the original carrier wafer.

Figure 30:
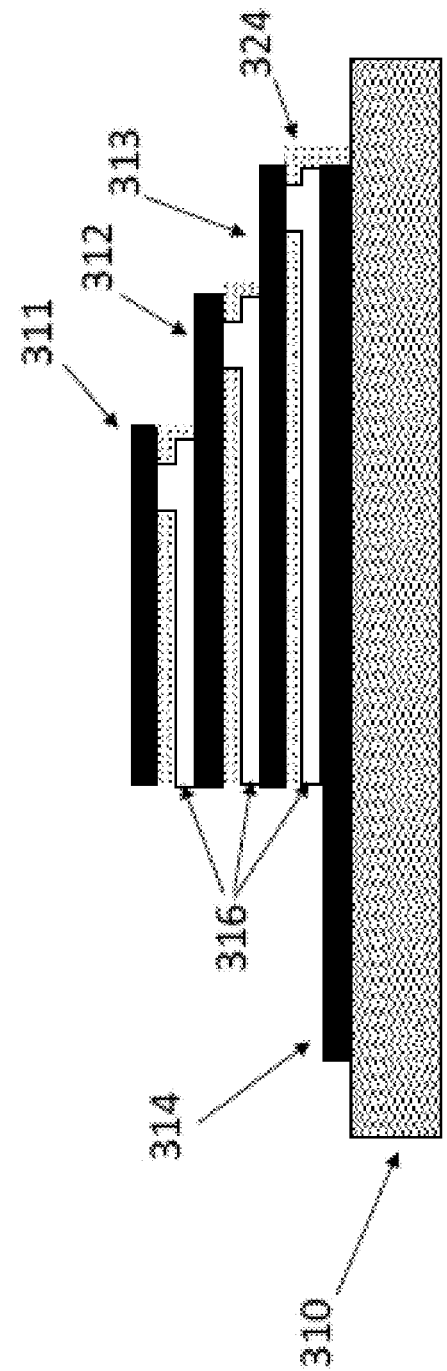
FIG. 30 is a drawing of a RGB laser chip according to an embodiment of this invention.

FIG. 30 is a drawing of a RGB laser chip fabricated using the selective area bonding according to an embodiment. Three laser dice 316 are bonded to a carrier wafer 310 and processed with laser features (ridges, passivation, electrical contacts, etc.) such that the laser ridges are parallel. The dice are electrically isolated from the carrier wafer material. The top-side electrical contacts 311, 312 and 313 for each die are used as the bonding layer for the next die such that the die are overlaid. Passivation layers 324 are used to separate the bulk of the laser die from the top-side electrical contacts such that current can only pass through the etched laser ridge. In this configuration, there is no electrode common to all laser die, but rather the anode for one die acts as the cathode for the next. Due to overlaying the laser die, the ridges can be placed close together. As shown, the ridges do not overlap, but it should be recognized that other configurations are possible. For example, the ridges could be aligned laterally to within the tolerances of the lithographic process.

Figure 31:
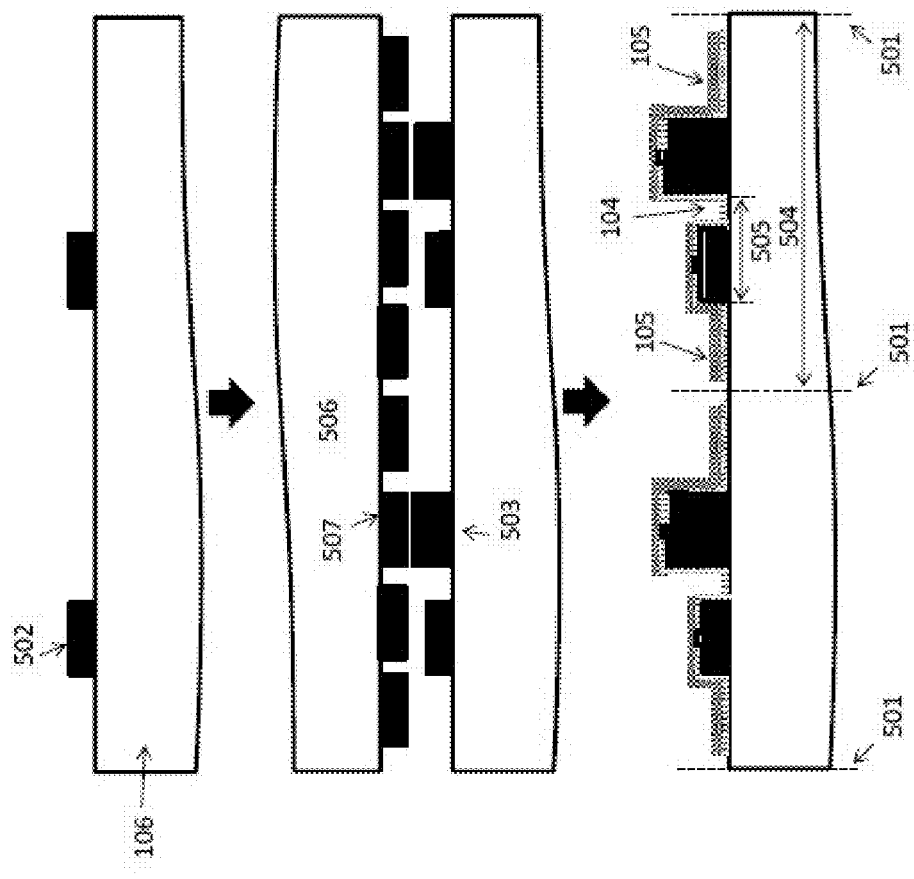
FIG. 31 is a schematic diagram of the process for bonding dice from multiple epitaxial wafers to the same carrier wafer according to an embodiment of this invention.

FIG. 31 shows a schematic of the cross section of a carrier wafer during various steps in a process that achieves this. Die 502 from a first epitaxial wafer is transferred to a carrier wafer 106 using the methods described above. A second set of bond pads 503 are then deposited on the carrier wafer and are made with a thickness such that the bonding surface of the second pads is higher than the top surface of the first set of transferred die 502. This is done to provide adequate clearance for bonding of the die from the second epitaxial wafer. A second substrate 506 which might contain die of a different color, dimensions, materials, and other such differences is then used to transfer a second set of die 507 to the carrier. Finally, the laser ridges are fabricated and passivation layers 104 are deposited followed by electrical contact layers 105 that allow each dice to be individually driven. The die transferred from the first and second substrates are spaced at a pitch 505 which is smaller than the second pitch of the carrier wafer. The chip or device is singulated along lines 501 to provide a device pitch 504. This process can be extended to transfer of die from any number of substrates, and to the transfer of any number of laser devices per dice from each substrate.

Figure 32:
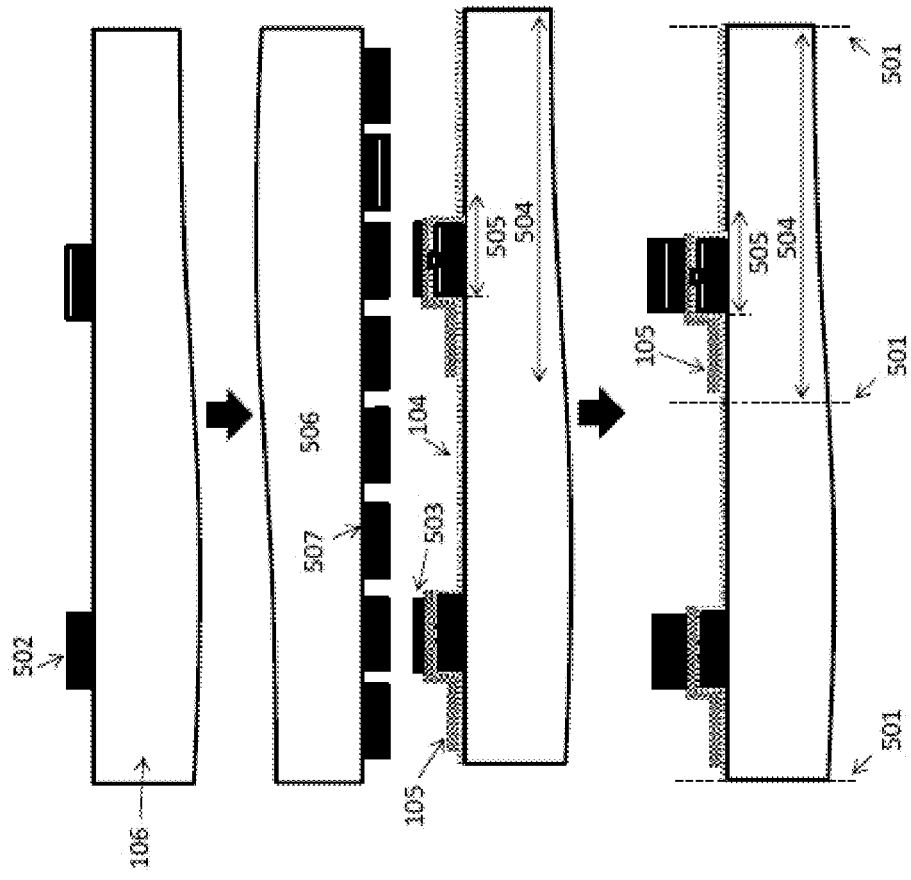
FIG. 32 is a schematic diagram of the process for bonding dice from multiple epitaxial wafers to the same carrier wafer according to an embodiment of this invention.

FIG. 32 shows a schematic of the cross section of a carrier wafer during various steps in a process that achieves this. Die 502 from a first epitaxial wafer is transferred to a carrier wafer 106 using the methods described above. Laser ridges, passivation layers 104 and ridge electrical contacts 105 are fabricated on the die. Subsequently bond pads 503 are deposited overlaying the ridge electrical contacts. A second substrate 506 which might contain die of a different color, dimensions, materials, and other such differences is then used to transfer a second set of die 507 to the carrier at the same pitch as the first set of die. Laser ridges, passivation layers and ridge electrical contacts can then be fabricated on the second set of die. Subsequent die bond and laser device fabrication cycles can be carried out to produce, in effect, a multi-terminal device consisting of an arbitrary number of laser die and devices.

Figure 33:
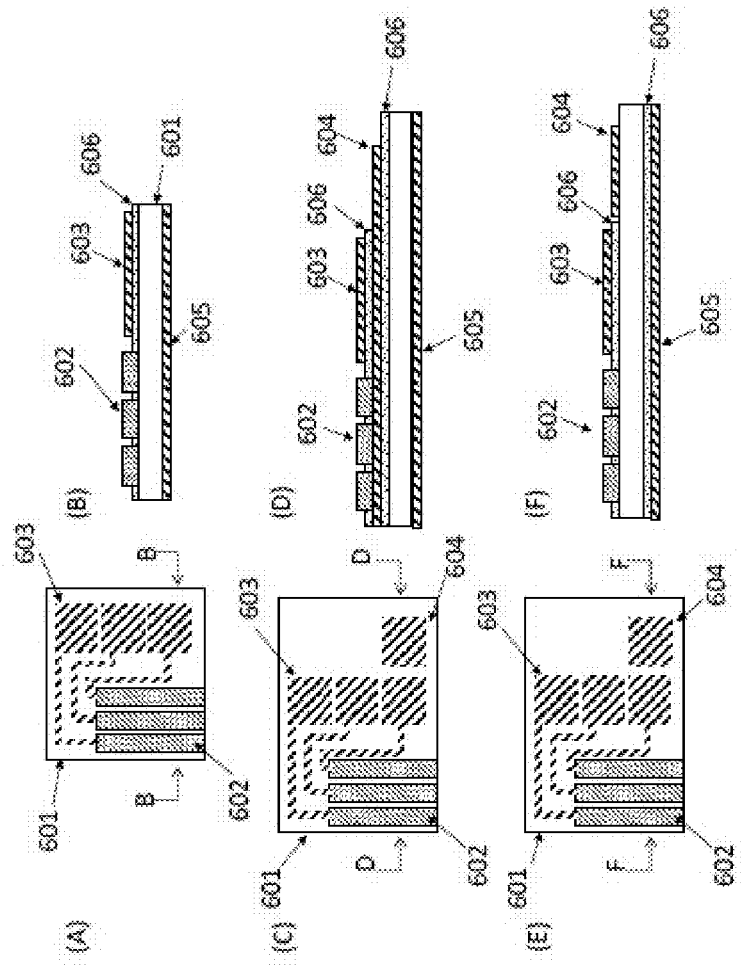
FIG. 33 shows schematic diagrams of layouts for laser chips containing multiple die which will be individually addressable according to embodiments of this invention.

FIG. 33 shows schematics of the layout of three multi-die laser chips according to embodiments of this invention. Layout A and accompanying cross-section B show a laser chip comprised by a singulated piece of a carrier wafer 601, three laser die 602 transferred from epitaxial substrates, and metal traces and pads 603 for electrically connecting to the die. Layout A has the die bonded directly to the carrier wafer, which is both conductive and which forms a common electrode connected to a metal pad 605 on the backside of the carrier wafer. A passivating layer 606 is used to isolate the metal traces and pads 603 which contact the laser ridges and form the second electrode of the laser devices. The ridge side contacts are separate and electrically isolated such that the laser devices may be run independently. Layout C and accompanying cross-section D show a similar structure, however the laser die are bonded to a metal layer 604 which is electrically isolated from the carrier wafer by passivation layers 606. A bond pad 605 is overlaid on the backside of the carrier wafer, providing a means to attach the laser chip to a submount, heat sink, printed circuit board or any other package. In this structure, the carrier wafer need not be conductive. Layout E and accompanying cross section F show a similar structure as layout C, however the carrier wafer is conductive and serves as a common electrode for the laser mesas. A passivation layer is deposited between the carrier and the backside bond pad 605 to electrically isolate the chip from the submount, heat sink, circuit board or other package type it is installed into.

Figure 34:
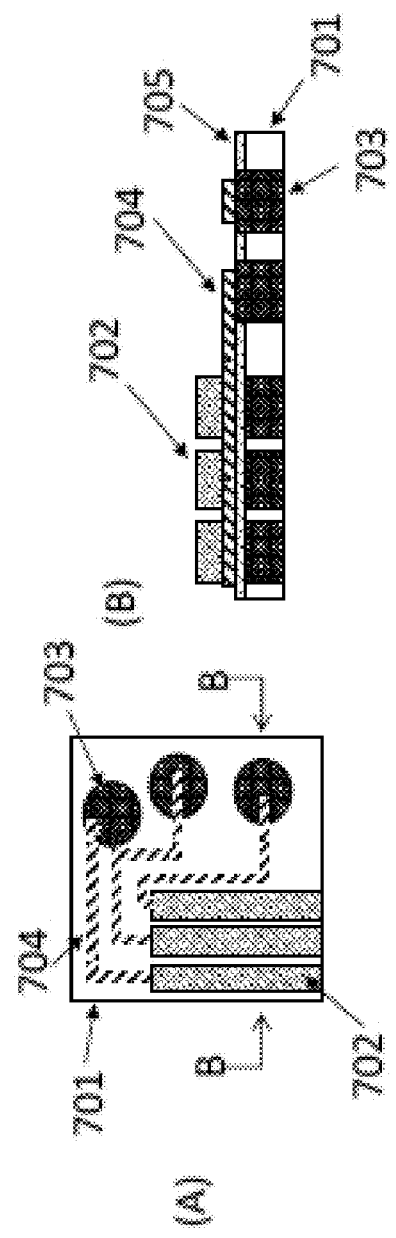
FIG. 34 shows schematic diagrams of the layout for laser chips including metallic through vias containing multiple die which will be individually addressable according to an embodiment of this invention.

FIG. 34 shows schematics of the layout of a multi-die laser chips according to an embodiment of this invention. Layout A and accompanying cross-section B show a laser chip comprised by a singulated piece of a carrier wafer 701, three laser die 702 transferred from epitaxial substrates, and metal traces and conductive through vias 703 for electrically connecting to the die. The through vias penetrate through the carrier wafer and may be covered by bond pads which are not shown. The laser die are bonded to the carrier via a common electrode 704, however the ridge side contacts to the laser devices are electrically isolated from the common electrode metal and are connected to through vias that are isolated from the common electrode. A passivation layer 705 isolates the laser die and common electrode from metal filled through vias located beneath the die which provide a region higher thermal conductivity beneath the dies to facilitate heat extraction, but which are electrically isolated from laser die. In this embodiment, the carrier wafer must be electrically insulating.

Figure 35:
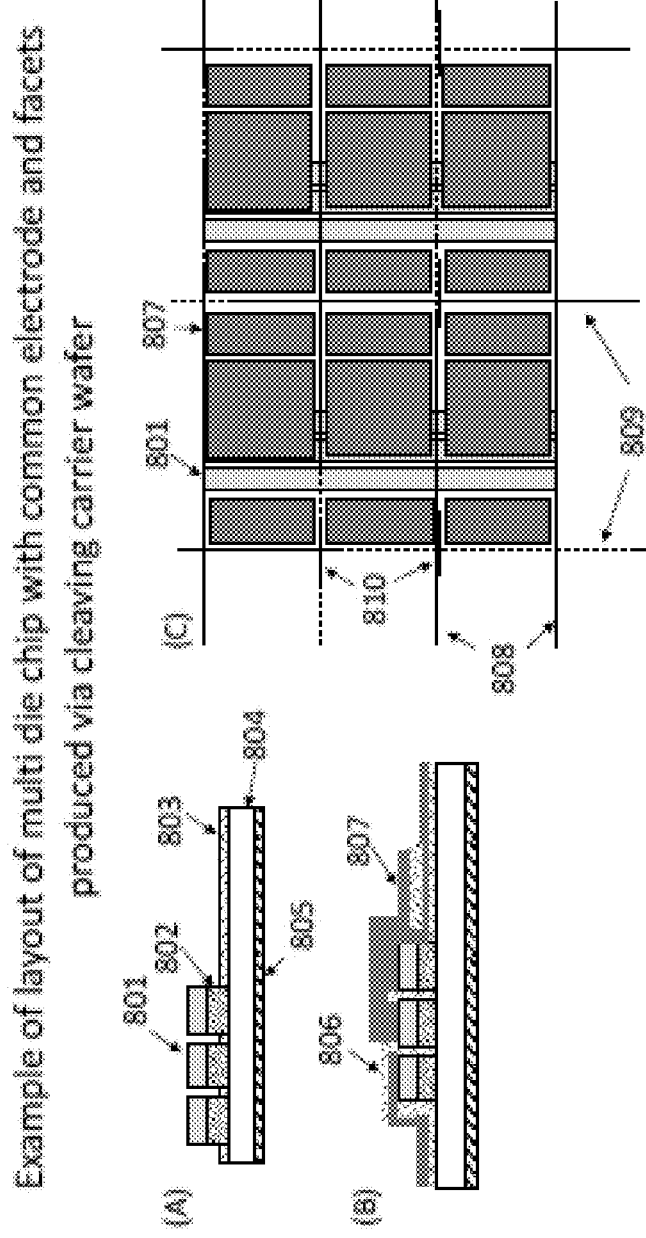
FIG. 35 shows schematic diagrams of the layout for laser chips containing multiple die which will be individually addressable according to embodiments of this invention.

FIG. 35 shows schematics of the layout and fabrication of a multi-die laser chip according to an embodiment of this invention. Layout A shows the chip after bonding of the die, but before singulation and fabrication of the laser devices. Laser die 801 are bonded to the carrier wafer 804 via bond pads 802. The carrier wafer is electrically conductive and acts as a common electrode. A bond pad 805 is overlaid on the backside of the carrier wafer to provide a means of attaching the chip to a heat sink, submount or package, as well as to provide a means of electrically connecting to the device. A passivation layer 803 separates the carrier wafer from conductive layers 807 that make electrical contact to devices on individual laser die. A second passivation layer 806 is overlaid on the die and a conductive layer is overlaid on the second passivation layer to provide an electrically isolated electrical contact to the middle die. This arrangement allows bond pads to be formed which connect to the entire length of the laser ridge while being wide enough to be accessible with wire bonds. Plan view C shows part of the array of these devices fabricated on a carrier wafer. Lines 808 and 809 show the locations of cleaves used to singulate the carrier wafer into individual laser chips as well as form the front and back facets of the laser devices. Laser skip scribes 810 are used to provide guides for the cleaves. This configuration would require a single crystal carrier wafer in order to guide the cleave.

Figure 36:
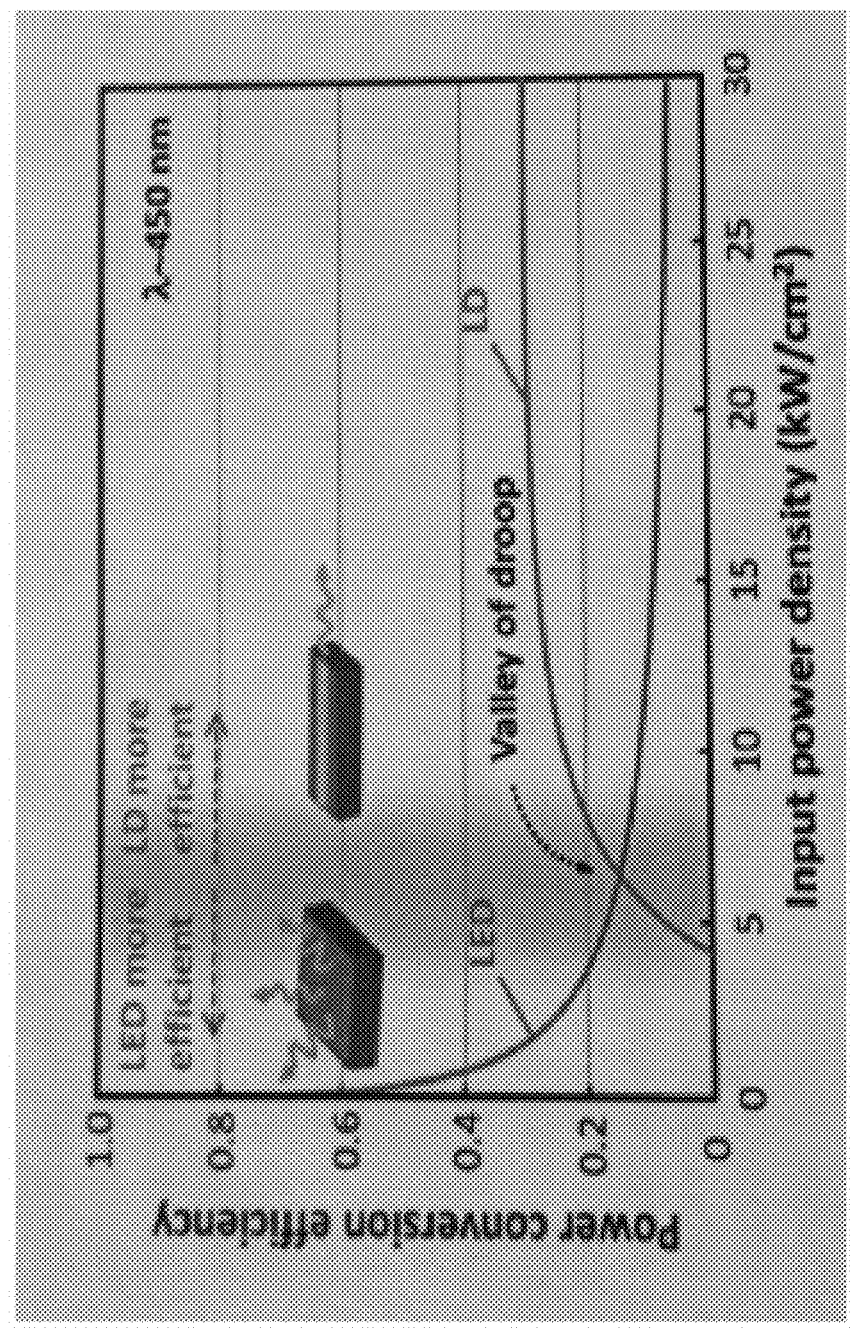
FIG. 36 schematically depicts the energy conversion efficiency vs input power density for GaN-based Light Emitting Diodes (LEDs) and Laser Diodes (LDs) in an example.

FIG. 36 schematically depicts the energy conversion efficiency vs. input power density for GaN-based Light Emitting Diodes (LEDs) and Laser Diodes (LD) in an example. The typical operation regime for laser diodes is much higher than for LEDs, indicating that the output power density for laser diodes can be much higher than for LEDs. Note that this figure was taken from reference 2.

Figure 37:
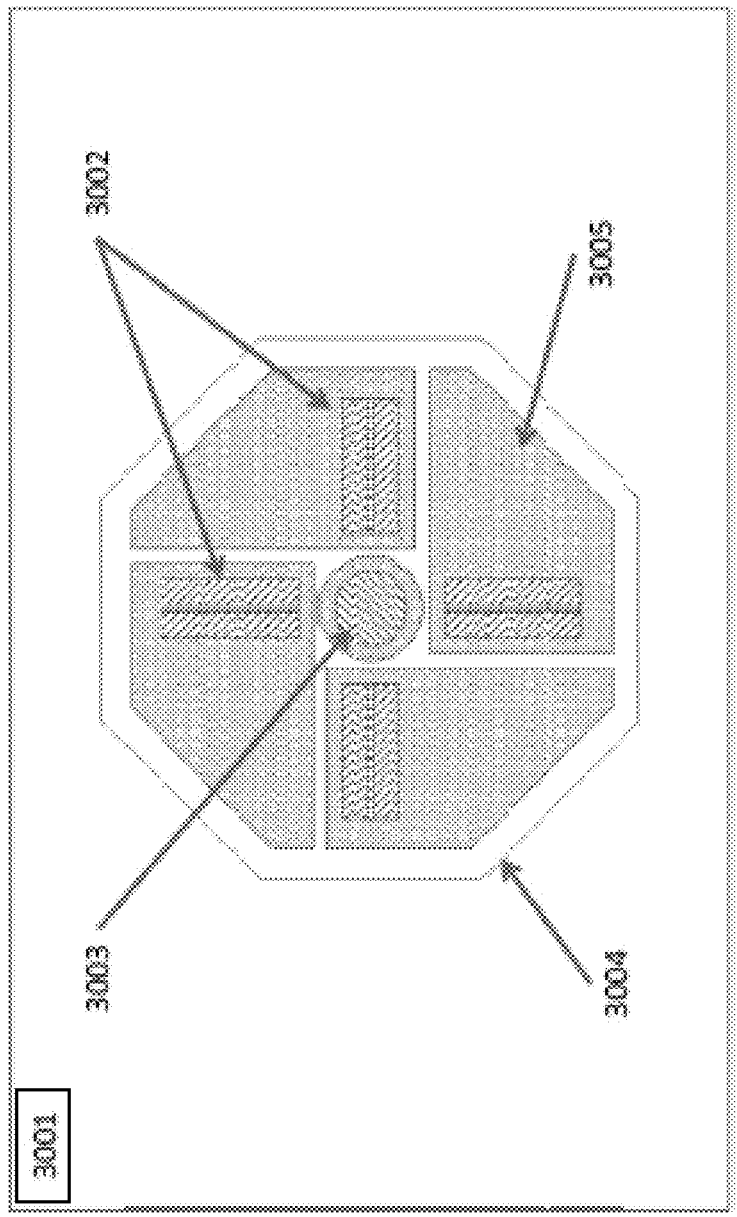
FIG. 37 schematically depicts an example of the present invention.

FIG. 37 schematically depicts an example of the present invention. An integrated, low-cost laser-based light module (3001) is composed of one or more blue laser diodes (3002) and a wavelength conversion element (3003), attached to a common substrate (3004). Metallic traces (3005) enable electrical interconnections and thermal connection to the common substrate.

Figure 38:
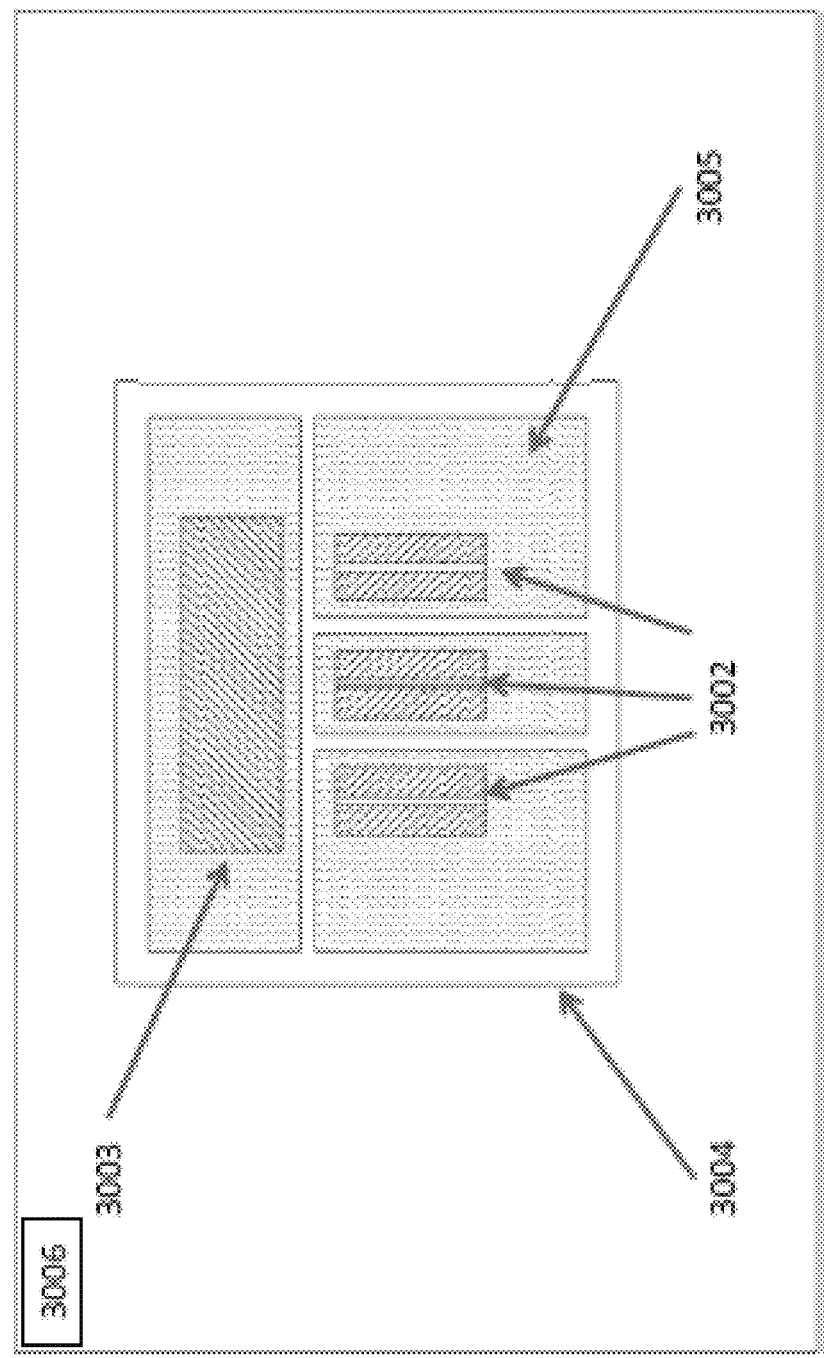
FIG. 38 schematically depicts an alternative example of the present invention.

FIG. 38 schematically depicts an alternative example of the present invention. An integrated, low-cost laser-based light module (3006) is composed of one or more blue laser diodes (3002) and a wavelength conversion element (3003), attached to a common substrate (3004). Metallic traces (3005) enable electrical interconnections and thermal connection to the common substrate.

Figure 39:
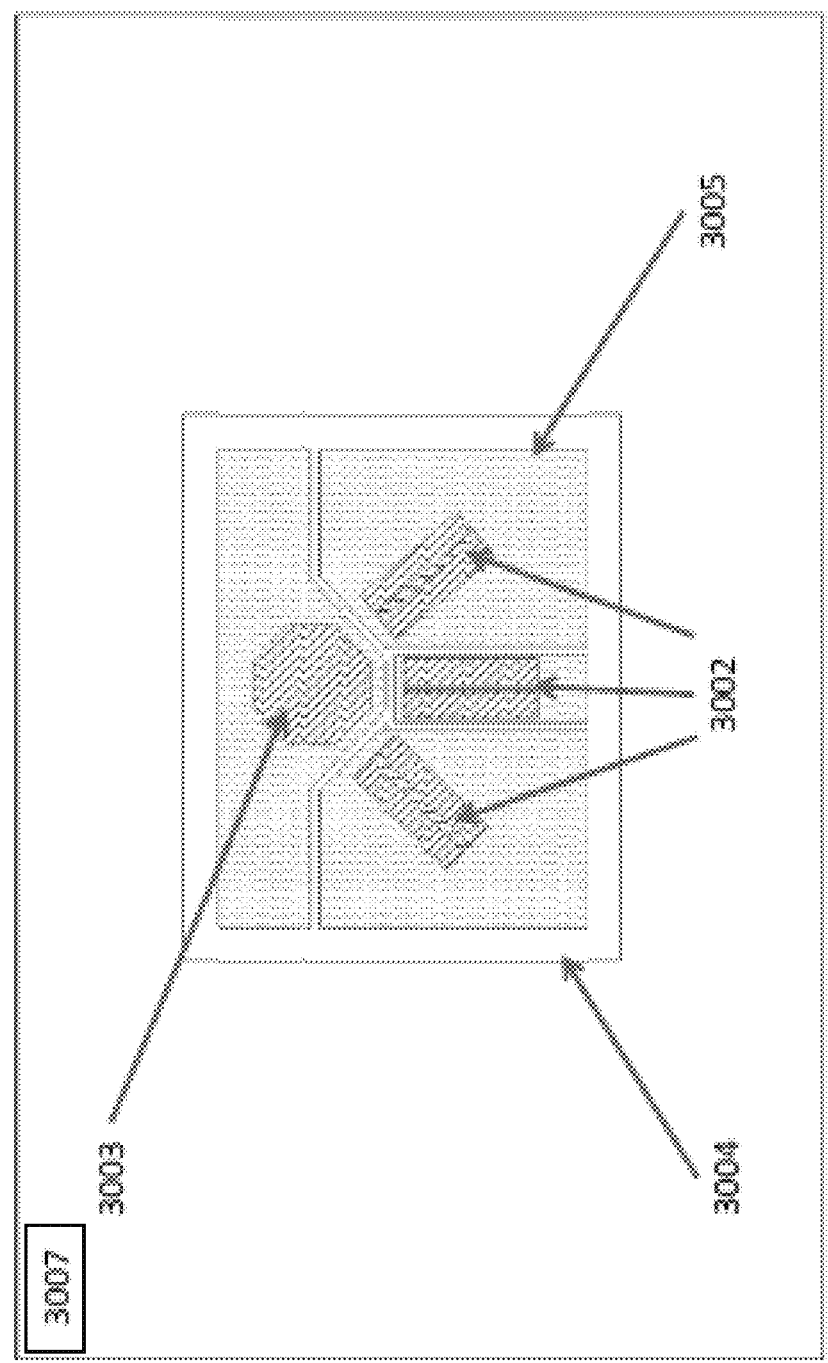
FIG. 39 schematically depicts an alternative example of the present invention.

FIG. 39 schematically depicts an alternative example of the present invention. An integrated, low-cost laser-based light module (3007) is composed of one or more blue laser diodes (3002) and a wavelength conversion element (3003), attached to a common substrate (3004). Metallic traces (3005) enable electrical interconnections and thermal connection to the common substrate.

Figure 40:
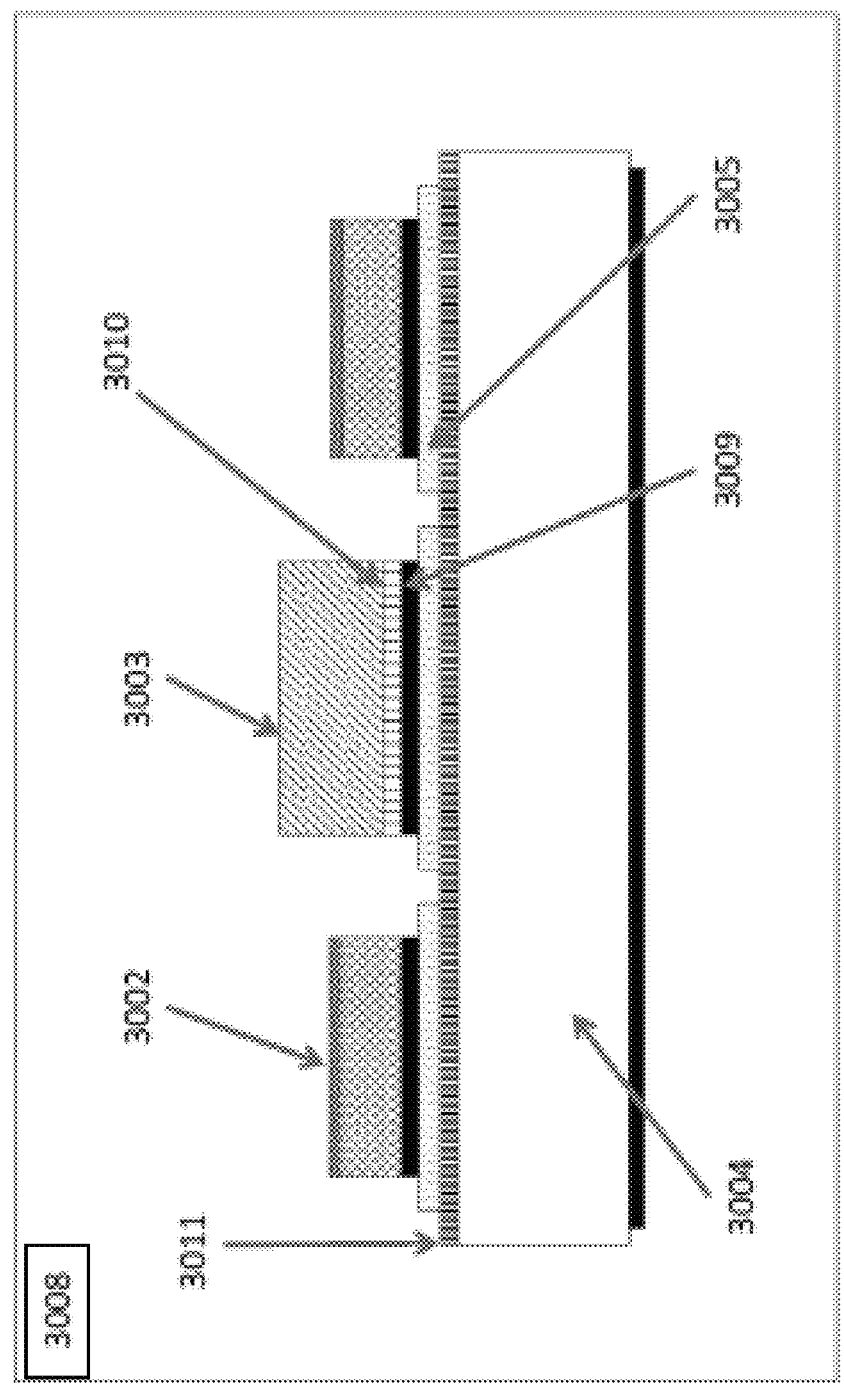
FIG. 40 is a schematic cross-sectional view of the integrated, low-cost laser-based light module in an example.

FIG. 40 is a schematic cross-sectional view of the integrated, low-cost laser-based light module (3008) in an example. One or more blue laser diodes (3002) and a wavelength conversion element (3003), attached to a common substrate (3004). Metallic traces (3005) enable electrical interconnections. Thermally and electrically conducting attach materials (3009) are used to attach both the laser diodes and the wavelength conversion element to the common substrate (3004). An optional reflective element (3010) may be inserted between the wavelength conversion element and the attach material. An optional electrically insulating layer (3011) may be applied to the common substrate if the common substrate is electrically conductive.

Figure 41:
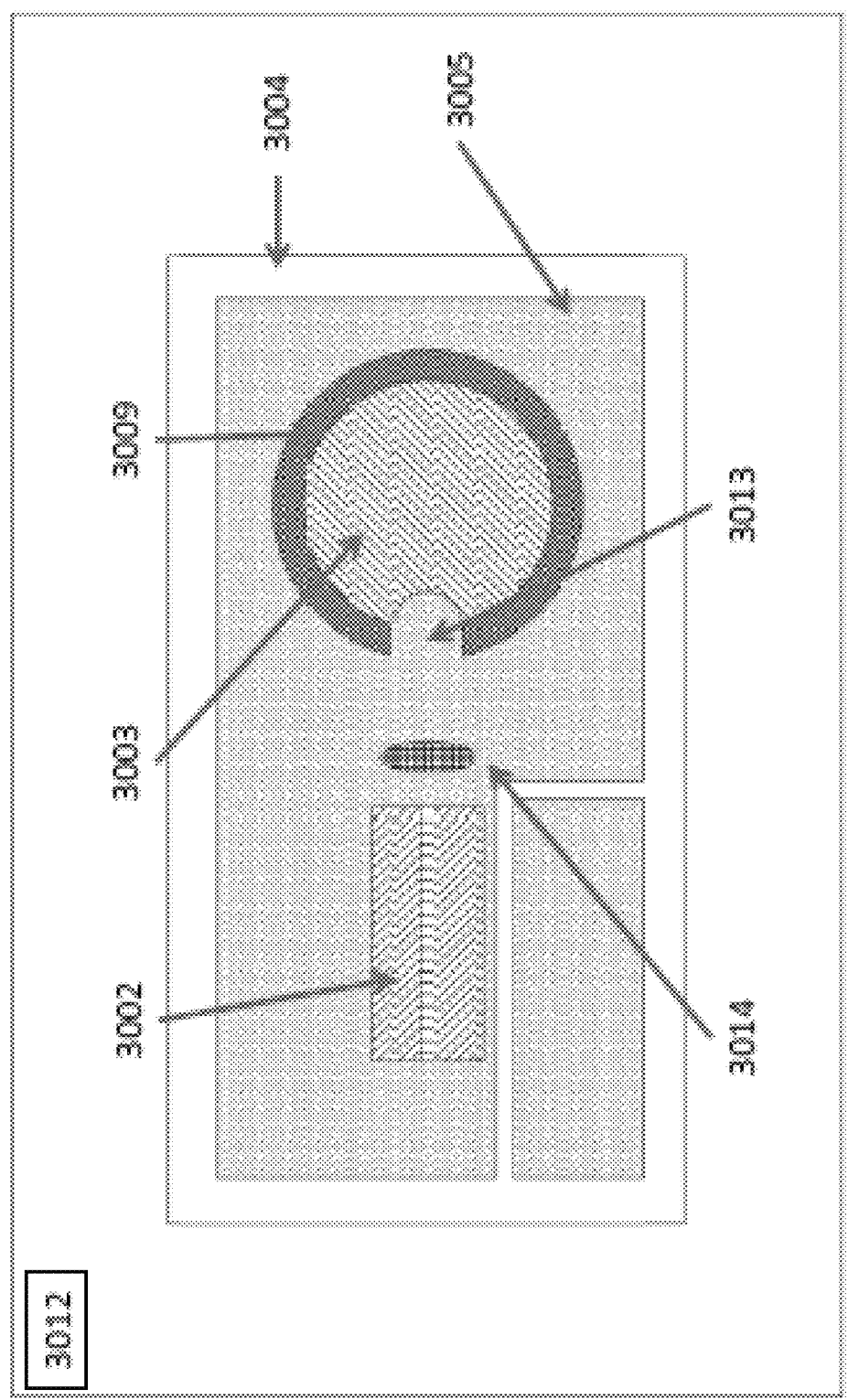
FIG. 41 schematically depicts an example where the light from the one or more blue laser diodes are coupled into the wavelength conversion element through a geometric feature.

FIG. 41 schematically depicts an example where the light from the one or more blue laser diodes (3002) are coupled into the wavelength conversion element (3003) through a geometric feature (3013). An optional optical element (3014) may be utilized to improve the coupling efficiency. An optional optically reflecting element (3009) may be attached to the sides of the wavelength conversion element, with a concomitant geometric feature aligned to the feature (3013).

Figure 42:
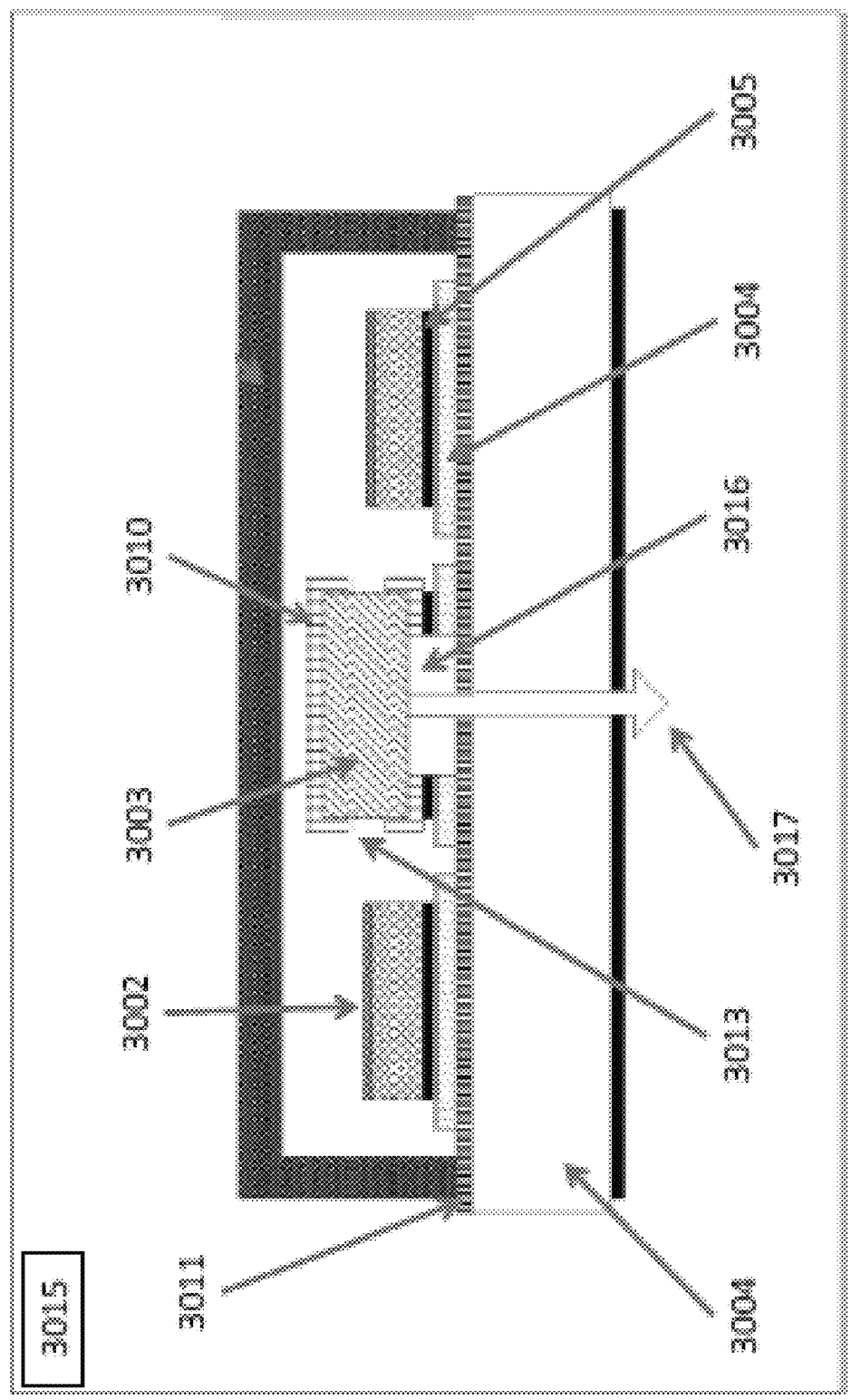
FIG. 42 schematically depicts an alternative of the integrated, low-cost laser-based light module in an alternative example of the present invention.

FIG. 42 schematically depicts an alternative example of the integrated, low-cost laser-based light module (3015), where the common substrate (3004) is optically transparent. The light from the one or more blue laser diodes (3002) are coupled into the wavelength conversion element (3003) through apertures (3013) in an optional reflective element (3010) which covers the majority of the exposed surfaces of the wavelength conversion element. An optical exit aperture (3016) allows light to be emitted downward through the transparent common substrate, as depicted by the arrow (3017).

Figure 43:
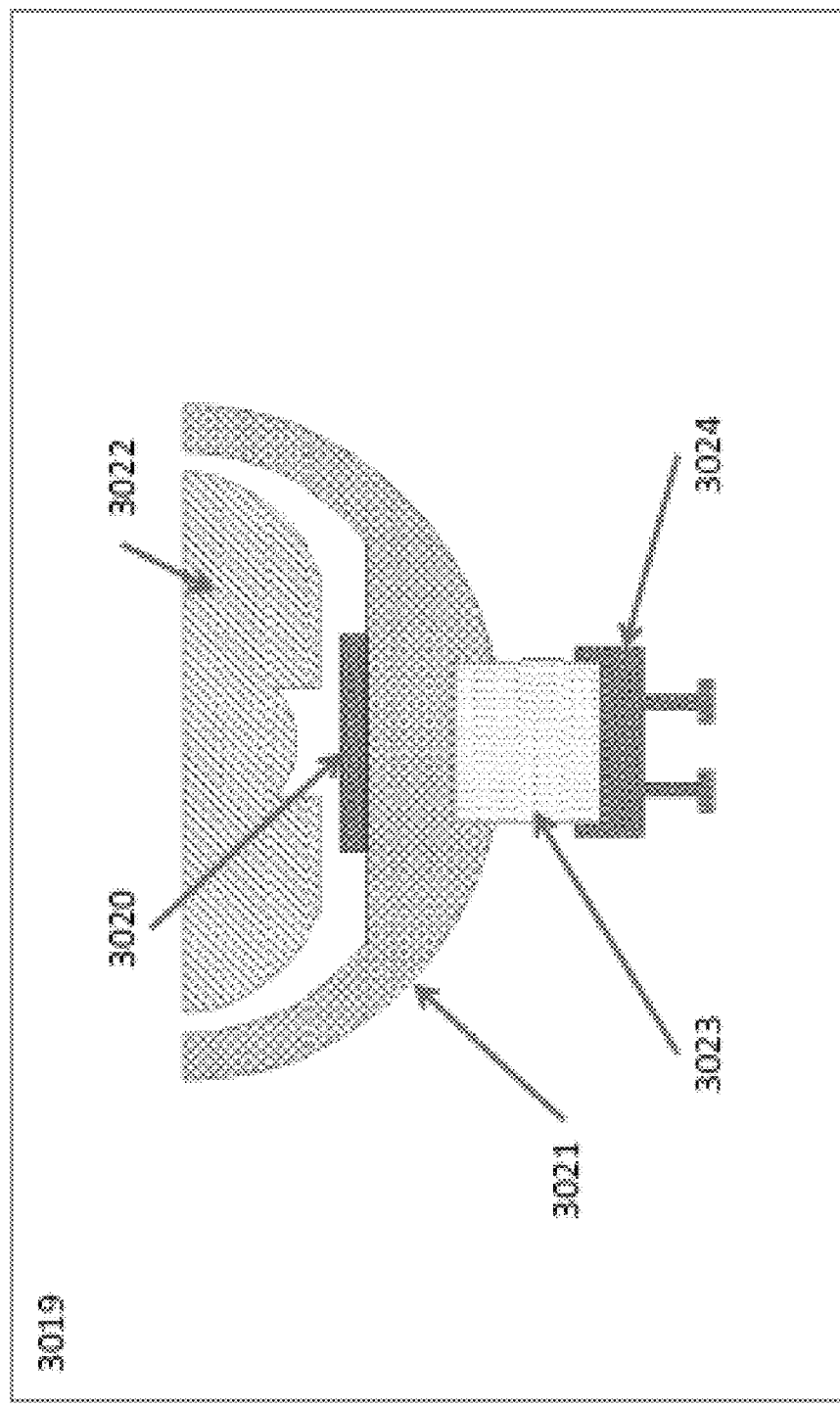
FIG. 43 schematically depicts an integrated lighting apparatus in an example of the present invention.

FIG. 43 schematically depicts an integrated lighting apparatus (3019) which includes one or more integrated low-cost, laser-based light sources (3020), a heat sink (3021), and an optional optical element for shaping or modifying the spectral content of the exiting beam (3022), and an optional integrated electronic power supply (3023) and an optional electronic connection element (3024) in an example.

As further background for the reader, gallium nitride and related crystals are difficult to produce in bulk form. Growth technologies capable of producing large area boules of GaN are still in their infancy, and costs for all orientations are significantly more expensive than similar wafer sizes of other semiconductor substrates such as Si, GaAs, and InP. While large area, free-standing GaN substrates (e.g. with diameters of two inches or greater) are available commercially, they are more costly than the more conventional, silicon, sapphire, SiC, InP and GaAs substrates.

Given the high cost of gallium and nitrogen containing substrates, the difficulty in scaling up wafer size, and the inefficiencies inherent in the processing of small wafers, it becomes extremely desirable to maximize utilization of substrates and epitaxial material. In the fabrication of lateral cavity laser diodes, it is typically the case that minimum die length is determined by the laser cavity length, but the minimum die width is determined by other device components such as wire bonding pads or considerations such as mechanical area for die handling in die attach processes. That is, while the laser cavity length limits the laser die length, the laser die width is typically much larger than the laser cavity width. Since the GaN substrate and epitaxial material are only critical in and near the laser cavity region this presents a great opportunity to invent novel methods to form only the laser cavity region out of these relatively expensive materials and form the bond pad and mechanical structure of the chip from a lower cost material. Typical dimensions for laser cavity widths are about 1-30 μm, while wire bonding pads are ~100 μm wide. This means that if the wire bonding pad width restriction and mechanical handling considerations were eliminated from the GaN chip dimension between >3 and 100 times more laser diode die could be fabricated from a single epitaxial wafer. This translates to a >3 to 100 times reduction in epitaxy and substrate costs. In conventional device designs, the relatively large bonding pads are mechanically supported by the epitaxy wafer, although they make no use of the material properties of the semiconductor beyond structural support.

In an example, the present invention is a method of transferring the semiconductor material comprising a laser diode from the substrate on which it was epitaxially grown to a second substrate, i.e. a carrier wafer. This method allows for one or more AlInGaN or AlInGaP laser devices to be transferred to a carrier wafer. The transfer of the laser devices from their original substrates to a carrier wafer offers several advantages. The first is maximizing the number of GaN laser devices which can be fabricated from a given epitaxial area on a gallium and nitrogen containing substrate by spreading out the epitaxial material on a carrier wafer such that the wire bonding pads or other structural elements are mechanically supported by relatively inexpensive carrier wafer, while the light emitting regions remain fabricated from the necessary epitaxial material. This will drastically reduce the chip cost in all gallium and nitrogen based laser diodes.

Another advantage is integration of multiple aspects of the optoelectronic device normally provided by components other than the laser diodes into the carrier wafer. For example, the carrier wafer material could be chosen such that it could serve as both a mechanical carrier for laser device material as well as a submount providing a thermally conductive but electrically isolating connection to the laser device package and heat sink. This is a key advantage, in that the resulting part, after singulation of individual chips from the carrier wafer, is a fully functional laser light emitting device. Typically submounts are patterned with a solder pad that connects to a wire bond pad. In this sense, the laser die on submount is a simple laser package that provides mechanical support and electrical access to the laser device and can be considered the fundamental building block of any laser based light source. By combining the functions of the carrier wafer and the submount this invention avoids relatively expensive pick-and-place and assembly steps as well as the cost of a separate submount.

Another advantage is in enabling most of the device fabrication steps to be carried out on die transferred to a carrier wafer. Because the carrier wafer size is arbitrary it is possible to choose carrier sizes large enough to allow bonding die from multiple substrates to the same carrier wafer such that the cost of each processing step during fabrication of the laser devices is shared among vastly more devices, thereby reducing fabrication costs considerably. Moreover, encapsulation steps can be carried out directly on the carrier wafer, allowing for the fabrication of environmentally sealed laser chips using parallel processing methods. The resulting device, either encapsulated or not, would be a laser device in a true chip-scale package.

Another advantage is that this invention transfers the epitaxial material comprising the laser device from the substrate without destroying the substrate, thereby allowing the substrate to be reclaimed and reused for the growth of more devices. In the case when the substrate can be reclaimed many times, the effective substrate cost quickly approaches the cost of reclaim rather than the cost of the original substrate. For devices such as GaN laser diodes, where substrates are both small and expensive relative to more mature compound semiconductor materials, these advantages can lead to dramatic reductions in the cost of fabricating a laser device.

In brief, embodiments of the invention involve an optoelectronic device wafer composed of device layers overlying the surface region of a substrate wafer. The substrate material can be GaN, sapphire, SiC, Si, and GaAs, but can be others. The optoelectronic device layers are separated from the substrate by one or more layers designed to be selectively removable either by dry etching, wet etching or decomposition due to laser irradiation. A bonding material is deposited on the surface of the optoelectronic device layers. A bonding material is also deposited either as a blanket coating or patterned on a carrier wafer. Standard lithographic processes are used to mask the device wafer which is then etched with either dry or wet etch processes to open vias that expose the sacrificial layer. A selective etch process is used to remove the sacrificial layer while leaving the optoelectronic device layers intact. In the case where the selective removal process is a wet etch, a protective passivation layer can be employed to prevent the device layers from being exposed to the etch when the etch selectivity is not perfect. The selective removal undercuts the device layers.

Special features of the mask may be used which attach to the undercut device layers, but which are too large to themselves be undercut, or which due to the design of the mask contain regions where the sacrificial layers are not removed or these features may be composed of metals or dielectrics that are resistant to the etch. These features act as anchors, preventing the undercut device layers from detaching from the substrate. This partial attachment to the substrate can also be achieved by incompletely removing the sacrificial layer, such that there is a tenuous connection between the undercut device layers and the substrate which can be broken during bonding. The surfaces of the bonding material on the carrier wafer and the device wafer are then brought into contact and a bond is formed which is stronger than the attachment of the undercut device layers to the anchors or remaining material of the sacrificial layers. After bonding, the separation of the carrier and device wafers transfers the device layers to the carrier wafer.

This invention enables fabrication of laser die at very high density on a substrate. This high density being greater than what is practical for a laser device built using current fabrication processes. Laser die are transferred to a carrier wafer at a larger pitch (e.g. lower density) than they are found on the substrate. The carrier wafer can be made from a less expensive material, or one with material properties that enable using the carrier as a submount or the carrier wafer can be an engineered wafer including passivation layers and electrical elements fabricated with standard lithographic processes. Once transferred, the die can be processed into laser devices using standard lithographic processes. The carrier wafer diameter can be chosen such that laser die from multiple gallium and nitrogen containing substrates can be transferred to a single carrier and processed into laser devices in parallel using standard lithographic processes.

In a specific embodiment, the gallium nitride substrate member is a bulk GaN substrate characterized by having a polar crystalline surface region, but can be others. In a specific embodiment, the bulk nitride GaN substrate comprises nitrogen and has a surface dislocation density between about $10E5$ $cm^{-2}$ and about $10E7$ $cm^{-2}$ or below $10E5$ $cm^{-2}$. The nitride crystal or wafer may comprise $Al_xIn_yGa_{1-x-y}N$, where $0 \leq x, y, x+y \leq 1$. In one specific embodiment, the nitride crystal comprises GaN. In one or more embodiments, the GaN substrate has threading dislocations, at a concentration between about $10E5$ $cm^{-2}$ and about $10E8$ $cm^{-2}$, in a direction that is substantially orthogonal or oblique with respect to the surface. As a consequence of the orthogonal or oblique orientation of the dislocations, the surface dislocation density is between about $10E5$ $cm^{-2}$ and about $10E7$ $cm^{-2}$ or below about $10E5$ $cm^{-2}$. In a specific embodiment, the device can be fabricated on a slightly off-cut polar substrate.

The substrate typically is provided with one or more of the following epitaxially grown elements, but is not limiting:

an n-GaN cladding region with a thickness of about 50 nm to about 6000 nm with a Si or oxygen doping level of about $5E16$ $cm^{-3}$ to about $1E19$ $cm^{-3}$ an InGaN region of a high indium content and/or thick InGaN layer(s) or Super SCH region;

a higher bandgap strain control region overlying the InGaN region;

optionally, an SCH region overlying the InGaN region;

quantum well active region layers comprised of one to five about 1.0-5.5 nm InGaN quantum wells separated by about 1.5-15.0 nm GaN or InGaN barriers optionally, a p-side SCH layer comprised of InGaN with molar a fraction of indium of between about 1% and about 10% and a thickness from about 15 nm to about 250 nm an electron blocking layer comprised of AlGaN with molar fraction of aluminum of between about 5% and about 20% and thickness from about 10 nm to about 15 nm and doped with Mg.

a p-GaN cladding layer with a thickness from about 400 nm to about 1000 nm with Mg doping level of about $5E17$ $cm^{-3}$ to about $1E19$ $cm^{-3}$ a p++-GaN contact layer with a thickness from about 20 nm to about 40 nm with Mg doping level of about $1E20$ $cm^{-3}$ to about $1E21$ $cm^{-3}$ Typically each of these regions is formed using at least an epitaxial deposition technique of metal organic chemical vapor deposition (MOCVD), molecular beam epitaxy (MBE), or other epitaxial growth techniques suitable for GaN growth. The active region can include one to about twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with about 2-10 quantum wells. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where 0≤w, x, y, z, w+x, y+z≤1, where w<u, y and/or x>v, z so that the bandgap of the well layer(s) is less than that of the barrier layer(s) and the n-type layer. The well layers and barrier layers may each have a thickness between about 1 nm and about 15 nm. In another embodiment, the active layer comprises a double heterostructure, with an InGaN or AlwInxGa1-w-xN layer about 10 nm to about 100 nm thick surrounded by GaN or $Al_yIn_zGa_{1-y-z}N$ layers, where w<u, y and/or x>v, z. The composition and structure of the active layer are chosen to provide light emission at a preselected wavelength. The active layer may be left undoped (or unintentionally doped) or may be doped n-type or p-type.

The active region can also include an electron blocking region, and a separate confinement heterostructure. In some embodiments, an electron blocking layer is preferably deposited. The electron-blocking layer may comprise $Al_s$-$In_tGa_{1-s-t}N$, where 0≤s, t, s+t≤1, with a higher bandgap than the active layer, and may be doped p-type or the electron blocking layer comprises an AlGaN/GaN super-lattice structure, comprising alternating layers of AlGaN and GaN. Alternatively, there may be no electron blocking layer. As noted, the p-type gallium nitride structure, is deposited above the electron blocking layer and active layer(s). The p-type layer may be doped with Mg, to a level between about 10E16 cm-3 and about 10E22 cm-3, and may have a thickness between about 5 nm and about 1000 nm. The outermost 1-50 nm of the p-type layer may be doped more heavily than the rest of the layer, so as to enable an improved electrical contact.

FIG. 4 is a simplified schematic cross-sectional diagram illustrating a state of the art GaN laser diode structure. This diagram is merely an example, which should not unduly limit the scope of the claims herein. One of ordinary skill in the art would recognize other variations, modifications, and alternatives in light of the present disclosure. As shown, the laser device includes gallium nitride substrate 203, which has an underlying n-type metal back contact region 201. In an embodiment, the metal back contact region is made of a suitable material such as those noted below and others. Further details of the contact region can be found throughout the present specification and more particularly below.

In an embodiment, the device also has an overlying n-type gallium nitride layer 205, an active region 207, and an overlying p-type gallium nitride layer structured as a laser stripe region 211. Additionally, the device also includes an n-side separate confinement heterostructure (SCH) 206, p-side guiding layer or SCH 208, p-AlGaN EBL 209, among other features. In an embodiment, the device also has a p++ type gallium nitride material 213 to form a contact region. In an embodiment, the p++ type contact region has a suitable thickness and may range from about 10 nm to about 50 nm, or other thicknesses. In an embodiment, the doping level can be higher than the p-type cladding region and/or bulk region. In an embodiment, the p++ type region has doping concentration ranging from about $10^{19}$ to $10^{21}$ $Mg/cm^3$, and others. The p++ type region preferably causes tunneling between the semiconductor region and overlying metal contact region. In an embodiment, each of these regions is formed using at least an epitaxial deposition technique of metal organic chemical vapor deposition (MOCVD), molecular beam epitaxy (MBE), or other epitaxial growth techniques suitable for GaN growth. In an embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ $cm^{-3}$ and about $10^{20}$ $cm^{-3}$.

The device has a laser stripe region formed overlying a portion of the off-cut crystalline orientation surface region. As example, FIG. 3 is a is a simplified schematic diagram of polar c-plane laser diode with the cavity aligned in the m-direction with cleaved or etched mirrors. The laser stripe region is characterized by a cavity orientation substantially in anm-direction, which is substantially normal to an a-direction, but can be others such as cavity alignment substantially in the a-direction. The laser strip region has a first end 107 and a second end 109 and is formed on an m-direction on a {0001} gallium and nitrogen containing substrate having a pair of cleaved mirror structures, which face each other. The first cleaved facet comprises a reflective coating and the second cleaved facet comprises no coating, an antireflective coating, or exposes gallium and nitrogen containing material. The first cleaved facet is substantially parallel with the second cleaved facet. The first and second cleaved facets are provided by a scribing and breaking process according to an embodiment or alternatively by etching techniques using etching technologies such as reactive ion etching (RIE), inductively coupled plasma etching (ICP), or chemical assisted ion beam etching (CAIBE), or other method. The first and second mirror surfaces each comprise a reflective coating. The coating is selected from silicon dioxide, hafnia, and titania, tantalum pentoxide, zirconia, including combinations, and the like. Depending upon the design, the mirror surfaces can also comprise an anti-reflective coating.

In a specific embodiment, the method of facet formation includes subjecting the substrates to a laser for pattern formation. In a preferred embodiment, the pattern is configured for the formation of a pair of facets for one or more ridge lasers. In a preferred embodiment, the pair of facets face each other and are in parallel alignment with each other. In a preferred embodiment, the method uses a UV (355 nm) laser to scribe the laser bars. In a specific embodiment, the laser is configured on a system, which allows for accurate scribe lines configured in one or more different patterns and profiles. In one or more embodiments, the laser scribing can be performed on the back-side, front-side, or both depending upon the application. Of course, there can be other variations, modifications, and alternatives.

In a specific embodiment, the method uses backside laser scribing or the like. With backside laser scribing, the method preferably forms a continuous line laser scribe that is perpendicular to the laser bars on the backside of the GaN substrate. In a specific embodiment, the laser scribe is generally about 15-20 um deep or other suitable depth. Preferably, backside scribing can be advantageous. That is, the laser scribe process does not depend on the pitch of the laser bars or other like pattern. Accordingly, backside laser scribing can lead to a higher density of laser bars on each substrate according to a preferred embodiment. In a specific embodiment, backside laser scribing, however, may lead to residue from the tape on one or more of the facets. In a specific embodiment, backside laser scribe often requires that the substrates face down on the tape. With front-side laser scribing, the backside of the substrate is in contact with the tape. Of course, there can be other variations, modifications, and alternatives.

Laser scribe Pattern: The pitch of the laser mask is about 200 um, but can be others. In an embodiment the method uses a 170 um scribe with a 30 um dash for the 200 um pitch. In a preferred embodiment, the scribe length is maximized or increased while maintaining the heat affected zone of the laser away from the laser ridge, which is sensitive to heat.

Laser scribe Profile: A saw tooth profile generally produces minimal facet roughness. It is believed that the saw tooth profile shape creates a very high stress concentration in the material, which causes the cleave to propagate much easier and/or more efficiently.

In a specific embodiment, the method of facet formation includes subjecting the substrates to mechanical scribing for pattern formation. In a preferred embodiment, the pattern is configured for the formation of a pair of facets for one or more ridge lasers. In a preferred embodiment, the pair of facets face each other and are in parallel alignment with each other. In a preferred embodiment, the method uses a diamond tipped scribe to physically scribe the laser bars, though as would be obvious to anyone learned in the art a scribe tipped with any material harder than GaN would be adequate. In a specific embodiment, the laser is configured on a system, which allows for accurate scribe lines configured in one or more different patterns and profiles. In one or more embodiments, the mechanical scribing can be performed on the back-side, front-side, or both depending upon the application. Of course, there can be other variations, modifications, and alternatives.

In a specific embodiment, the method uses backside scribing or the like. With backside mechanical scribing, the method preferably forms a continuous line scribe that is perpendicular to the laser bars on the backside of the GaN substrate. In a specific embodiment, the laser scribe is generally about 15-20 um deep or other suitable depth. Preferably, backside scribing can be advantageous. That is, the mechanical scribe process does not depend on the pitch of the laser bars or other like pattern. Accordingly, backside scribing can lead to a higher density of laser bars on each substrate according to a preferred embodiment. In a specific embodiment, backside mechanical scribing, however, may lead to residue from the tape on one or more of the facets. In a specific embodiment, backside mechanical scribe often requires that the substrates face down on the tape. With front-side mechanical scribing, the backside of the substrate is in contact with the tape. Of course, there can be other variations, modifications, and alternatives.

It is well known that etch techniques such as chemical assisted ion beam etching (CAIBE), inductively coupled plasma (ICP) etching, or reactive ion etching (RIE) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide (SiO2), silicon nitride (SixNy), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, ICP, RIE and/or other techniques. The etched facet surfaces must be highly vertical of between about 87 and about 93 degrees or between about 89 and about 91 degrees from the surface plane of the wafer. The etched facet surface region must be very smooth with root mean square roughness values of less than about 50 nm, 20 nm, 5 nm, or 1 nm. Lastly, the etched must be substantially free from damage, which could act as nonradiative recombination centers and hence reduce the COMD threshold. CAIBE is known to provide very smooth and low damage sidewalls due to the chemical nature of the etch, while it can provide highly vertical etches due to the ability to tilt the wafer stage to compensate for any inherent angle in etch.

The laser stripe is characterized by a length and width. The length ranges from about 50 microns to about 3000 microns, but is preferably between about 10 microns and about 400 microns, between about 400 microns and about 800 microns, or about 800 microns and about 1600 microns, but could be others. The stripe also has a width ranging from about 0.5 microns to about 50 microns, but is preferably between about 0.8 microns and about 2.5 microns for single lateral mode operation or between about 2.5 um and about 35 um for multi-lateral mode operation, but can be other dimensions. In a specific embodiment, the present device has a width ranging from about 0.5 microns to about 1.5 microns, a width ranging from about 1.5 microns to about 3.0 microns, a width ranging from about 3.0 microns to about 35 microns, and others. In a specific embodiment, the width is substantially constant in dimension, although there may be slight variations. The width and length are often formed using a masking and etching process, which are commonly used in the art.

The laser stripe is provided by an etching process selected from dry etching or wet etching. The device also has an overlying dielectric region, which exposes a p-type contact region. Overlying the contact region is a contact material, which may be metal or a conductive oxide or a combination thereof. The p-type electrical contact may be deposited by thermal evaporation, electron beam evaporation, electroplating, sputtering, or another suitable technique. Overlying the polished region of the substrate is a second contact material, which may be metal or a conductive oxide or a combination thereof and which comprises the n-type electrical contact. The n-type electrical contact may be deposited by thermal evaporation, electron beam evaporation, electroplating, sputtering, or another suitable technique.

Given the high gallium and nitrogen containing substrate costs, difficulty in scaling up gallium and nitrogen containing substrate size, the inefficiencies inherent in the processing of small wafers, and potential supply limitations it becomes extremely desirable to maximize utilization of available gallium and nitrogen containing substrate and overlying epitaxial material. In the fabrication of lateral cavity laser diodes, it is typically the case that minimum die size is determined by device components such as the wire bonding pads or mechanical handling considerations, rather than by laser cavity widths. Minimizing die size is critical to reducing manufacturing costs as smaller die sizes allow a greater number of devices to be fabricated on a single wafer in a single processing run. The current invention is a method of maximizing the number of devices which can be fabricated from a given gallium and nitrogen containing substrate and overlying epitaxial material by spreading out the epitaxial material onto a carrier wafer via a die expansion process.

With respect to AlInGaAsP laser devices, these devices include a substrate made of GaAs or Ge, but can be others. As used herein, the term "substrate" can mean the bulk substrate or can include overlying growth structures such as arsenic or phosphorus containing epitaxial region, or functional regions such as n-type AlGaAs, combinations, and the like. The devices have material overlying the substrate composed of GaAs, AlAs, AlGaAs, InGaAS, InGaP, AlInGaP, AlInGaAs or AlInGaAsP. Typically each of these regions is formed using at least an epitaxial deposition technique of metal organic chemical vapor deposition (MOCVD), molecular beam epitaxy (MBE), or other epitaxial growth techniques suitable for AlInGaAsP growth. In general these devices have an n-type and p-type conducting layer which may form part of a n-type cladding layer or p-type cladding layer, respectively, with lower refractive index than the light emitting active region. The n-cladding layers can be composed of an alloy of AlInGaAsP containing aluminum. The devices contain an active region which emits light during operation of the device. The active region may have one or more quantum wells of lower bandgap than surrounding quantum barriers. Separate confinement heterostructures (SCHs) may be included with refractive index higher than the cladding layers to improve confinement of the optical modes. SCHs and quantum wells are typically composed of InGaP, AlInGaP or InGaAsP, but may be other materials.

The device has a laser stripe region formed overlying a portion of surface region. The laser strip region has a first end and a second end, having a pair of cleaved mirror structures, which face each other. The first cleaved facet comprises a reflective coating and the second cleaved facet comprises no coating, an antireflective coating, or exposes As or P containing material. The first cleaved facet is substantially parallel with the second cleaved facet. The first and second cleaved facets are provided by a scribing and breaking process according to an embodiment or alternatively by etching techniques using etching technologies such as reactive ion etching (RIE), inductively coupled plasma etching (ICP), or chemical assisted ion beam etching (CAIBE), or other method. The first and second mirror surfaces each comprise a reflective coating. The coating is selected from silicon dioxide, hafnia, and titania, tantalum pentoxide, zirconia, including combinations, and the like. Depending upon the design, the mirror surfaces can also comprise an anti-reflective coating.

In a specific embodiment, the method of facet formation includes subjecting the substrates to a laser for pattern formation. In a preferred embodiment, the pattern is configured for the formation of a pair of facets for one or more ridge lasers. In a preferred embodiment, the pair of facets face each other and are in parallel alignment with each other. In a preferred embodiment, the method uses a UV (355 nm) laser to scribe the laser bars. In a specific embodiment, the laser is configured on a system, which allows for accurate scribe lines configured in one or more different patterns and profiles. In one or more embodiments, the laser scribing can be performed on the back-side, front-side, or both depending upon the application. Of course, there can be other variations, modifications, and alternatives.

In a specific embodiment, the method uses backside laser scribing or the like. With backside laser scribing, the method preferably forms a continuous line laser scribe that is perpendicular to the laser bars on the backside of the substrate. In a specific embodiment, the laser scribe is generally about 15-20 um deep or other suitable depth. Preferably, backside scribing can be advantageous. That is, the laser scribe process does not depend on the pitch of the laser bars or other like pattern. Accordingly, backside laser scribing can lead to a higher density of laser bars on each substrate according to a preferred embodiment. In a specific embodiment, backside laser scribing, however, may lead to residue from the tape on one or more of the facets. In a specific embodiment, backside laser scribe often requires that the substrates face down on the tape. With front-side laser scribing, the backside of the substrate is in contact with the tape. Of course, there can be other variations, modifications, and alternatives.

In a specific embodiment, the method of facet formation includes subjecting the substrates to mechanical scribing for pattern formation. In a preferred embodiment, the pattern is configured for the formation of a pair of facets for one or more ridge lasers. In a preferred embodiment, the pair of facets face each other and are in parallel alignment with each other. In a preferred embodiment, the method uses a diamond tipped scribe to physically scribe the laser bars, though as would be obvious to anyone learned in the art a scribe tipped with any material harder than GaN would be adequate. In a specific embodiment, the laser is configured on a system, which allows for accurate scribe lines configured in one or more different patterns and profiles. In one or more embodiments, the mechanical scribing can be performed on the back-side, front-side, or both depending upon the application. Of course, there can be other variations, modifications, and alternatives.

In a specific embodiment, the method uses backside scribing or the like. With backside mechanical scribing, the method preferably forms a continuous line scribe that is perpendicular to the laser bars on the backside of the substrate. In a specific embodiment, the laser scribe is generally about 15-20 um deep or other suitable depth. Preferably, backside scribing can be advantageous. That is, the mechanical scribe process does not depend on the pitch of the laser bars or other like pattern. Accordingly, backside scribing can lead to a higher density of laser bars on each substrate according to a preferred embodiment. In a specific embodiment, backside mechanical scribing, however, may lead to residue from the tape on one or more of the facets. In a specific embodiment, backside mechanical scribe often requires that the substrates face down on the tape. With front-side mechanical scribing, the backside of the substrate is in contact with the tape. Of course, there can be other variations, modifications, and alternatives.

It is well known that etch techniques such as chemical assisted ion beam etching (CAIBE), inductively coupled plasma (ICP) etching, or reactive ion etching (RIE) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide (SiO2), silicon nitride (SixNy), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, ICP, RIE and/or other techniques. The etched facet surfaces must be highly vertical of between about 87 and about 93 degrees or between about 89 and about 91 degrees from the surface plane of the wafer. The etched facet surface region must be very smooth with root mean square roughness values of less than about 50 nm, 20 nm, 5 nm, or 1 nm. Lastly, the etched must be substantially free from damage, which could act as nonradiative recombination centers and hence reduce the COMD threshold. CAIBE is known to provide very smooth and low damage sidewalls due to the chemical nature of the etch, while it can provide highly vertical etches due to the ability to tilt the wafer stage to compensate for any inherent angle in etch.

The laser stripe is characterized by a length and width. The length ranges from about 50 microns to about 3000 microns, but is preferably between about 10 microns and about 400 microns, between about 400 microns and about 800 microns, or about 800 microns and about 1600 microns, but could be others. The stripe also has a width ranging from about 0.5 microns to about 50 microns, but is preferably between about 0.8 microns and about 2.5 microns for single lateral mode operation or between about 2.5 um and about 35 um for multi-lateral mode operation, but can be other dimensions. In a specific embodiment, the width is substantially constant in dimension, although there may be slight variations. The width and length are often formed using a masking and etching process, which are commonly used in the art.

The laser stripe is provided by an etching process selected from dry etching or wet etching. The device also has an overlying dielectric region, which exposes a p-type contact region. Overlying the contact region is a contact material, which may be metal or a conductive oxide or a combination thereof. The p-type electrical contact may be deposited by thermal evaporation, electron beam evaporation, electroplating, sputtering, or another suitable technique. Overlying the polished region of the substrate is a second contact material, which may be metal or a conductive oxide or a combination thereof and which comprises the n-type electrical contact. The n-type electrical contact may be deposited by thermal evaporation, electron beam evaporation, electroplating, sputtering, or another suitable technique.

This invention requires selective removal of one or more of the epitaxial layers to allow lift-off of the laser device layers. All of the epitaxial layers in the typical device structures described above are typically of use in the final device such that none may be removed from the structure. A sacrificial layer in most cases must be added to the epitaxial structure. This layer is one that has the properties of a) can be etched selectively relative to the adjacent layers in the epitaxial structure, b) can be grown in such a way that it does not induce defects in the device layers that negatively impact performance, and c) can be grown between the functional device layers and the substrate such that selective removal of the sacrificial layer will result in undercutting of the device layers. In some embodiments the sacrificial layer will be a layer that would be normally found in the epitaxial structure. For example, when using laser lift-off to selectively remove material in an optoelectronic device grown on sapphire, the sacrificial layer might be the nitride material adjacent to the sapphire epitaxial surface. In some embodiments the sacrificial layer might be produced by selectively modifying a portion of a layer normally found in the device. For example, one might induce a n-type GaN layer to be selectively etchable at a specific depth via a well-controlled ion implantation process.

One embodiment for the fabrication of undercut GaN based laser diodes is depicted in FIG. 6. This embodiment uses a bandgap selective photo-electrical chemical (PEC) etch to undercut an array of mesas etched into the epitaxial layers. The preparation of the epitaxy wafer is shown in FIG. 6. This process requires the inclusion of a buried sacrificial region, which can be PEC etched selectively by bandgap. For GaN based optoelectronic devices, InGaN quantum wells have been shown to be an effective sacrificial region during PEC etching.[1,2] The first step depicted in FIG. 6 is a top down etch to expose the sacrificial layers, followed by a bonding metal deposition as shown in FIG. 6. With the sacrificial region exposed a bandgap selective PEC etch is used to undercut the mesas. In one embodiment, the bandgaps of the sacrificial region and all other layers are chosen such that only the sacrificial region will absorb light, and therefor etch, during the PEC etch. Another embodiment of the invention uses a sacrificial region with a higher bandgap than the active region such that both layers are absorbing during the bandgap PEC etching process. In this embodiment, the active region can be prevented from etching during the bandgap selective PEC etch using an insulating protective layer on the sidewall, as shown in FIG. 8. The first step depicted in FIG. 8 is an etch to expose the active region of the device. This step is followed by the deposition of a protective insulating layer on the mesa sidewalls, which serves to block PEC etching of the active region during the later sacrificial region undercut PEC etching step. A second top down etch is then performed to expose the sacrificial layers and bonding metal is deposited as shown in FIG. 8. With the sacrificial region exposed a bandgap selective PEC etch is used to undercut the mesas. At this point, the selective area bonding process shown in FIG. 7 is used to continue fabricating devices. In another embodiment the active region is exposed by the dry etch and the active region and sacrificial regions both absorb the pump light. A conductive path is fabricated between the p-type and n-type cladding surrounding the active region. As in a solar cell, carriers are swept from the active region due to the electric field in the depletion region. By electrically connecting the n-type and p-type layers together holes can be continually swept from the active region, slowing or preventing PEC etching.

Undercut AlInGaAsP based laser diodes can be produced in a manner similar to GaN based laser diodes. There are a number of wet etches that etch some AlInGaAsP alloys selectively.[7] In one embodiment, an AlGaAs or AlGaP sacrificial layer could be grown clad with GaAs etch stop layers. When the composition of $Al_xGa_{1-x}As$ and $Al_xGa_{1-x}P$ is high (x>0.5) AlGaAs can be etched with almost complete selectivity (i.e. etch rate of AlGaAs>1E6 times that of GaAs) when etched with HF. InGaP and AlInP with high InP and AlP compositions can be etched with HCl selectively relative to GaAs. GaAs can be etched selectively relative to AlGaAs using $C_6H_8O_7:H_2O_2:H_2O$. There are a number of other combinations of sacrificial layer, etch-stop layer and etch chemistry which are widely known to those knowledgeable in the art of micromachining AlInGaAsP alloys.

In one embodiment, the AlInGaAsP device layers are exposed to the etch solution which is chosen along with the sacrificial layer composition such that only the sacrificial layers experience significant etching. The active region can be prevented from etching during the compositionally selective etch using an etch resistant protective layer, such as like silicon dioxide, silicon nitride, metals or photoresist among others, on the sidewall, as shown in FIG. 8. The first step depicted in FIG. 8 is an etch to expose the active region of the device. This step is followed by the deposition of a protective insulating layer on the mesa sidewalls, which serves to block etching of the active region during the later sacrificial region undercut etching step. A second top down etch is then performed to expose the sacrificial layers and bonding metal is deposited as shown in FIG. 8. With the sacrificial region exposed a compositionally selective etch is used to undercut the mesas. At this point, the selective area bonding process shown in FIG. 7 is used to continue fabricating devices. The device layers should be separated from the sacrificial layers by a layer of material that is resistant to etching. This is to prevent etching into the device layers after partially removing the sacrificial layers.

A top down view of one preferred embodiment of the die expansion process is depicted in FIG. 5. The starting materials are patterned epitaxy and carrier wafers. Herein, the 'epitaxy wafer' or 'epitaxial wafer' is defined as the original gallium and nitrogen containing wafer on which the epitaxial material making up the active region was grown, while the 'carrier wafer' is defined as a wafer to which epitaxial layers are transferred for convenience of processing. The carrier wafer can be chosen based on any number of criteria including but not limited to cost, thermal conductivity, thermal expansion coefficients, size, electrical conductivity, optical properties, and processing compatibility. The patterned epitaxy wafer is prepared in such a way as to allow subsequent selective release of bonded epitaxy regions. The patterned carrier wafer is prepared such that bond pads are arranged in order to enable the selective area bonding process. These wafers can be prepared by a variety of process flows, some embodiments of which are described below. In the first selective area bond step, the epitaxy wafer is aligned with the pre-patterned bonding pads on the carrier wafer and a combination of pressure, heat, and/or sonication is used to bond the mesas to the bonding pads. The bonding material can be a variety of media including but not limited to metals, polymers, waxes, and oxides. Only epitaxial die which are in contact with a bond bad on the carrier wafer will bond. Sub-micron alignment tolerances are possible on commercial die bonders. The epitaxy wafer is then pulled away, breaking the epitaxy material at a weakened epitaxial release layer such that the desired epitaxial layers remain on the carrier wafer. Herein, a 'selective area bonding step' is defined as a single iteration of this process. In the example depicted in FIG. 5, one quarter of the epitaxial die are transferred in this first selective bond step, leaving three quarters on the epitaxy wafer. The selective area bonding step is then repeated to transfer the second quarter, third quarter, and fourth quarter of the epitaxial die to the patterned carrier wafer. This selective area bond may be repeated any number of times and is not limited to the four steps depicted in FIG. 5. The result is an array of epitaxial die on the carrier wafer with a wider die pitch than the original die pitch on the epitaxy wafer. The die pitch on the epitaxial wafer will be referred to as pitch 1, and the die pitch on the carrier wafer will be referred to as pitch 2, where pitch 2 is greater than pitch 1. At this point standard laser diode processes can be carried out on the carrier wafer. Side profile views of devices fabricated with state of the art methods and the methods described in the current invention are depicted in FIG. 1 and FIG. 2, respectively. The device structure enabled by the current invention only contains the relatively expensive epitaxy material where the optical cavity requires it, and has the relatively large bonding pads and/or other device components resting on a carrier wafer. Typical dimensions for laser ridge widths and bonding pads are <about 30 µm and >about 100 µm, respectively, allowing for three or more times improved epitaxy usage efficiency with the current invention.

Gold-gold metallic bonding is used as an example in this work, although a wide variety of oxide bonds, polymer bonds, wax bonds etc. are potentially suitable. Submicron alignment tolerances are possible using commercial available die bonding equipment. The carrier wafer is patterned in such a way that only selected mesas come in contact with the metallic bond pads on the carrier wafer. When the epitaxy substrate is pulled away the bonded mesas break off at the weakened sacrificial region, while the un-bonded mesas remain attached to the epitaxy substrate. This selective area bonding process can then be repeated to transfer the remaining mesas in the desired configuration. This process can be repeated through any number of iterations and is not limited to the two iterations depicted in FIG. 7. The carrier wafer can be of any size, including but not limited to about 2 inch, 3 inch, 4 inch, 6 inch, 8 inch, and 12 inch. After all desired mesas have been transferred, a second bandgap selective PEC etch can be optionally used to remove any remaining sacrificial region material to yield smooth surfaces. At this point standard laser diode processes can be carried out on the carrier wafer. Another embodiment of the invention incorporates the fabrication of device components on the dense epitaxy wafers before the selective area bonding steps. In the embodiment depicted in FIG. 9 the laser ridge, sidewall passivation, and contact metal are fabricated on the original epitaxial wafer before the die expansion process. This process flow is given for example purposes only and is not meant to limit which device components can be processed before the die expansion process. This work flow has potential cost advantages since additional steps are performed on the higher density epitaxial wafer before the die expansion process. A detailed schematic of this process flow is depicted in FIG. 9.

In another embodiment of the invention individual PEC undercut etches are used after each selective bonding step for etching away the sacrificial release layer of only bonded mesas. Which epitaxial die get undercut is controlled by only etching down to expose the sacrificial layer of mesas which are to be removed on the current selective bonding step. The advantage of this embodiment is that only a very coarse control of PEC etch rates is required. This comes at the cost of additional processing steps and geometry constrains.

In another embodiment of the invention the bonding layers can be a variety of bonding pairs including metal-metal, oxide-oxide, soldering alloys, photoresists, polymers, wax, etc.

In another embodiment of the invention the sacrificial region is completely removed by PEC etching and the mesa remains anchored in place by any remaining defect pillars. PEC etching is known to leave intact material around defects which act as recombination centers.[2,3] Additional mechanisms by which a mesa could remain in place after a complete sacrificial etch include static forces or Van der Waals forces. In one embodiment the undercutting process is controlled such that the sacrificial layer is not fully removed. The remaining thin strip of material anchors the device layers to the substrate as shown in FIG. 7.

In another embodiment of the invention a shaped sacrificial region expose mesa is etched to leave larger regions (anchors) near the ends of each epitaxy die. Bonding metal is placed only on the regions of epitaxy that are to be transferred. A selective etch is then performed such that the epitaxy die to be transferred is completely undercut while the larger regions near the end are only partially undercut. The intact sacrificial regions at the ends of the die provide mechanical stability through the selective area bonding step. As only a few nanometers of thickness will be undercut, this geometry should be compatible with standard bonding processes. After the selective area bonding step, the epitaxy and carrier wafers are mechanically separated, cleaving at the weak points between the bond metal and intact sacrificial regions. Example schematics of this process are depicted in FIGS. 10 and 11. Alternatively, the mechanical separation can be realized with sawing. As an example, a diamond saw blade could be used. After the desired number of repetitions is completed, state of the art laser diode fabrication procedures can be applied to the die expanded carrier wafer.

In another embodiment the anchors are positioned either at the ends or sides of the undercut die such that they are connected by a narrow undercut region of material. FIG. 10 shows this configuration as the "peninsular" anchor. The narrow connecting material 304 is far from the bond metal and is design such that the undercut material cleaves at the connecting material rather than across the die. This has the advantage of keeping the entire width of the die undamaged, which would be advantageous. In another embodiment, geometric features are added to the connecting material to act as stress concentrators 305 and the bond metal is extended onto the narrow connecting material. The bond metal reinforces the bulk of the connecting material. Adding these features increases the control over where the connection will cleave. These features can be triangles, circles, rectangles or any deviation that provides a narrowing of the connecting material or a concave profile to the edge of the connecting material.

In another embodiment the anchors are of small enough lateral extent that they may be undercut, however a protective coating is used to prevent etch solution from accessing the sacrificial layers in the anchors. This embodiment is advantageous in cases when the width of the die to be transferred is large. Unprotected anchors would need to be larger to prevent complete undercutting, which would reduce the density of die and reduce the utilization efficiency of epitaxial material.

In another embodiment, the anchors are located at the ends of the die and the anchors form a continuous strip of material that connects to all or a plurality of die. This configuration is advantageous since the anchors can be patterned into the material near the edge of wafers or lithographic masks where material utilization is otherwise poor. This allows for utilization of device material at the center of the pattern to remain high even when die sizes become large.

In another embodiment the anchors are formed by depositing regions of an etch-resistant material that adheres well to the epitaxial and substrate material. These regions overlay a portion of the laser die and some portion of the structure that will not be undercut during the etch. These regions form a continuous connection, such that after the laser die is completely undercut they provide a mechanical support preventing the laser die from detaching from the substrate. For example, a laser die with a length of about 1.2 mm and a width of about 40 micrometers is etched such that the sacrificial region is exposed. Metal layers are then deposited on the top of the laser die, the sidewall of the laser die and the bottom of the etched region surrounding the die such that a continuous connection is formed. As an example, the metal layers could comprise about 20 nm of titanium to provide good adhesion and be capped with about 500 nm of gold, but of course the choice of metal and the thicknesses could be others. The length of laser die sidewall coated in metal is about 1 nm to about 40 nm, with the upper thickness being less than the width of the laser die such that the sacrificial layer is etched completely in the region near the metal anchor where access to the sacrificial layer by etchant will be limited.

The use of metal anchors as shown in FIGS. 11*a*, 11*b*, and 11*c* have several advantages over the use of anchors made from the epitaxial device material. The first is density of the transferrable mesas on the donor epitaxial wafer. Anchors made from the epitaxial material must be large enough to not be fully undercut by the selective etch, or they must be protected somehow with a passivating layer. The inclusion of a large feature that is not transferred will reduce the density of mesas in one or more dimensions on the epitaxial device wafer. The use of metal anchors is preferable because the anchors are made from a material that is resistant to etch and therefore can be made with small dimensions that do not impact mesa density. The second advantage is that it simplifies the processing of the mesas because a separate passivating layer is no longer needed to isolate the active region from the etch solution. Removing the active region protecting layer reduces the number of fabrication steps while also reducing the size of the mesa required.

In an example, the mesa is first produced via deposition of a patterned mask and an etch such that the etch exposes a highly n-type doped layer beneath the sacrificial layer. The highly n-type doped layer is doped to a carrier concentration of between 1E18 and 1E20 cm-3. The highly n-type layer is incorporated into the structure during epitaxial growth and allows for a highly ohmic and low resistance electrical contact between the cathode metal and the n-type cladding. At the top of the mesa is a p-contact layer consisting of a highly p-type doped GaN, InGaN or AlInGaN layer which provides for an ohmic and low resistance electrical contact between the anode metal and the p-type cladding. The p-contact metal can be one or more of Ni, Pd, Pt, Ag among other metals. The p-contact can also be formed using a transparent conducting oxide (TCO) such as ZnO or zinc oxide alloyed with one or more of Cd, Mg, Al, Ga, In. Other possible transparent conductive oxides include indium tin oxide (ITO) and gallium oxide, among others. The p-contact metal or TCO can be deposited either before or after etching of the mesa. The cathode metal stack is then deposited, and consists of a first layer of a metal that will form a good electrical contact to n-type material. This would include Ti, Al and Ni among others. The cathode metal stack may also include metal layer specifically for promoting adhesion. The final layer in the cathode stack should be one or more of Au, Pt or Pd among other metals that promote efficient transfer of electrons into the etch solution. Most preferably the cathode metal is Pt as this provides the fastest etch rates. In a particular embodiment, the thick gold bond metal on top of the mesa, the metal anchors connecting the bond metal to the cathode metal and the cathode metal stack are deposited in one step. This has the advantage of reducing the number of steps required to fabricate the device, however a compromise is made in the selective etch because while gold is the ideal metal for forming the metal-metal thermo-compressive bond during mesa transfer, the gold is a less preferred cathode metal than platinum and will result in lower etch rates for any given cathode area.

In a particular embodiment, the cathode metal stack also includes metal layers intended to increase the strength of the metal anchors. For example the cathode metal stack might consist of 100 nm of Ti to promote adhesion of the cathode metal stack and provide a good electrical contact to the n-type cladding. The cathode metal stack could then incorporate a layer of tungsten, which has an elastic modulus on the order of four times higher than gold.

Incorporating the tungsten would reduce the thickness of gold required to provide enough mechanical support to retain the mesas after they are undercut by the selective etch.

In another embodiment of the invention, the release of the epitaxial layers is accomplished by means other than PEC etching, such as laser lift off.

In another embodiment the anchors are fabricated from metal, silicon nitride or some other material resistant to the selective etch. This embodiment has the advantage over the partially undercut anchors in that the anchor is not undercut and therefore can be much smaller than the extent of lateral etching. This enables much denser patterning of dice on the substrate.

In an embodiment, laser device epitaxy material is fabricated into a dense array of undercut mesas on a substrate containing device layers. This pattern pitch will be referred to as the 'first pitch'. The first pitch is often a design width that is suitable for fabricating each of the epitaxial regions on the substrate, while not large enough for completed laser devices, which often desire larger non-active regions or regions for contacts and the like. For example, these mesas would have a first pitch ranging from about 5 microns to about 30 microns or to about 50 microns. Each of these mesas is a 'die'.

In an example, these die are then transferred to a carrier wafer at a second pitch such that the second pitch on the carrier wafer is greater than the first pitch on the substrate. In an example, the second pitch is configured with the die to allow each die with a portion of the carrier wafer to be a laser device, including contacts and other components. For example, the second pitch would be about 100 microns to about 200 microns or to about 300 microns but could be as large at about 1-2 mm or greater in the case where a large chip is desired for ease of handling. For example, in the case where the carrier is used as a submount, the second pitch should be greater than about 1 mm to facilitate the pick and place and die-attach processes. The second die pitch allows for easy mechanical handling and room for wire bonding pads positioned in the regions of carrier wafer in-between epitaxy mesas, enabling a greater number of laser diodes to be fabricated from a given gallium and nitrogen containing substrate and overlying epitaxy material. Side view schematics of state of the art and die expanded laser diodes are shown in FIG. 1 and FIG. 2. Typical dimensions for laser ridge widths and the widths necessary for mechanical and wire bonding considerations are from about 1 μm to about 30 μm and from about 100 μm to about 300 μm, respectively, allowing for large potential improvements in gallium and nitrogen containing substrate and overlying epitaxy material usage efficiency with the current invention. In particular, the present invention increases utilization of substrate wafers and epitaxy material through a selective area bonding process to transfer individual die of epitaxy material to a carrier wafer in such a way that the die pitch is increased on the carrier wafer relative to the original epitaxy wafer. The arrangement of epitaxy material allows device components which do not require the presence of the expensive gallium and nitrogen containing substrate and overlying epitaxy material often fabricated on a gallium and nitrogen containing substrate to be fabricated on the lower cost carrier wafer, allowing for more efficient utilization of the gallium and nitrogen containing substrate and overlying epitaxy material.

In another embodiment of the invention the laser facets are produced by cleaving processes. If a suitable carrier wafer is selected it is possible to use the carrier wafer to define cleaving planes in the epitaxy material. This could improve the yield, quality, ease, and/or accuracy of the cleaves.

In another embodiment of the invention the laser facets are produced by etched facet processes. In the etched facet embodiment a lithographically defined mirror pattern is etched into the gallium and nitrogen to form facets. The etch process could be a dry etch process selected from inductively coupled plasma etching (ICP), chemically assisted ion beam etching (CAIBE), or reactive ion etching (RIE) Etched facet process can be used in combination with the die expansion process to avoid facet formation by cleaving, potentially improved yield and facet quality.

In another embodiment of the invention the laser die are also characterized by a third pitch characterizing their spacing on the substrate parallel to the laser ridge. The third pitch is often a design width that is suitable for fabricating each of the laser die into laser devices. For example, a substrate containing lasers with laser cavities about 1 mm in length may have laser die fabricated at a third pitch of about 1.05 mm to about 2 mm, but preferably the third pitch is less than about 10% longer than the laser cavities fabricated on the laser die.

In an example, these die are then transferred to a carrier wafer at a second and fourth pitch where the second pitch is greater than the first pitch and the fourth pitch is greater than the third pitch. Laser facets are produced by an etched facet process as described above. The increase in distance between the laser die due to the fourth pitch allows for easy integration of elements in front of the laser facets while the second die pitch allows for easy mechanical handling and room for wire bonding pads positioned in the regions of carrier wafer in-between epitaxy mesas, enabling a greater number of laser diodes to be fabricated from substrate and overlying epitaxy material. FIG. 13 shows a schematic of the transfer process including both a second and fourth pitch on the carrier wafer.

In another embodiment of the invention die singulation is achieved by cleaving processes which are assisted by the choice of carrier wafer. For example, if a silicon or GaAs carrier wafer is selected there will be a system of convenient cubic cleave planes available for die singulation by cleaving. In this embodiment there is no need for the cleaves to transfer to the epitaxy material since the die singulation will occur in the carrier wafer material regions only.

In another embodiment of the invention bar and die singulation is achieved with a sawing process. Sawing is a well-established process used for the singulation of LEDs and other semiconductor devices. For example, DISCO saws can be used. DISCO's dicing saws cut semiconductor wafers (Si, GaAs, etc.), glass, ceramic, and a wide variety of other materials at a level of precision measured in micrometers.

In another embodiment of the invention any of the above process flows can be used in combination with the wafer tiling. As an example, about 7.5 mm by about 18 mm substrates can be tiled onto about a 2 inch carrier wafer, allowing topside processing and selective area bonding to be carried out on multiple epitaxy substrates in parallel for further cost savings.

In another embodiment of the invention the substrate wafer is reclaimed after the selective area bond steps through a re-planarization and surface preparation procedure. The epitaxy wafer can be reused any practical number of times.[6]

In an example, the present invention provides a method for increasing the number of gallium and nitrogen containing laser diode devices which can be fabricated from a given epitaxial surface area; where the gallium and nitrogen containing epitaxial layers overlay gallium and nitrogen containing substrates. The epitaxial material comprises of at least the following layers: a sacrificial region which can be selectively etched using a bandgap selective PEC etch, an n-type cladding region, an active region comprising of at least one active layer overlying the n-type cladding region, and a p-type cladding region overlying the active layer region. The gallium and nitrogen containing epitaxial material is patterned into die with a first die pitch; the die from the gallium and nitrogen containing epitaxial material with a first pitch is transferred to a carrier wafer to form a second die pitch on the carrier wafer; the second die pitch is larger than the first die pitch.

In an example, each epitaxial die is an etched mesa with a pitch of between about 1 μm and about 10 μm wide or between about 10 micron and about 50 microns wide and between about 50 and about 3000 μm long. In an example, the second die pitch on the carrier wafer is between about 100 microns and about 200 microns or between about 200 microns and about 300 microns. In an example, the second die pitch on the carrier wafer is between about 2 times and about 50 times larger than the die pitch on the epitaxy wafer. In an example, semiconductor laser devices are fabricated on the carrier wafer after epitaxial transfer. In an example, the semiconductor devices contain GaN, AlN, InN, InGaN, AlGaN, InAlN, and/or InAlGaN. In an example, the gallium and nitrogen containing material are grown on a polar plane. In an example, one or multiple laser diode cavities are fabricated on each die of epitaxial material. In an example, device components, which do not require epitaxy material are placed in the space between epitaxy die.

In another embodiment of the invention the carrier wafer is another semiconductor material, a metallic material, or a ceramic material. Some potential candidates include silicon, gallium arsenide, sapphire, silicon carbide, diamond, gallium nitride, AlN, polycrystalline AlN, indium phosphide, germanium, quartz, copper, gold, silver, aluminum, stainless steel, or steel.

In common laser packages like the TO canister, the laser device is indirectly attached to the body of the package which is itself soldered or otherwise attached to a heat sink with a method providing high thermal conductivity. To prevent shorting of the laser diode to the package a submount is provided between the laser diode material and the package. The submount is a thin layer of material that is both a good thermal conductor and electrically insulating. Submount materials include aluminum nitride, sapphire (Al2O3), beryllium oxide and chemical vapor deposited diamond which offer good thermal conductivity but low electrical conductivity.

In another embodiment of the invention the carrier wafer material is chosen such that it has similar thermal expansion properties to group-III nitrides, high thermal conductivity and is available as large area wafers compatible with standard semiconductor device fabrication processes. The carrier wafer is then processed with structures enabling it to also act as the submount for the laser device. In some embodiments the facets of laser devices may be formed by bonding the laser dice to a carrier wafer that cleaves easily. By aligning the laser dice such that the intended plane of the facet is coplanar with an easily cleaved plane of the single-crystal carrier wafer. Mechanical or laser scribes can then be used, as described above, to guide and initiate the cleave in the carrier wafer such that it is located properly with respect to the laser die and carrier wafer patterns. Zincblende, cubic and diamond-lattice crystals work well for cleaved carriers with several sets of orthogonal cleavage planes (e.g. [110], [001], etc.). Singulation of the carrier wafers into individual die can be accomplished either by sawing or cleaving. In the case of singulation using cleaving the same cleavage planes and techniques can be used as described for facet formation. This embodiment offers a number of advantages. By combining the functions of the carrier wafer and submount the number of components and operations needed to build a packaged device is reduced, thereby lowering the cost of the final laser device significantly. Selection of the carrier wafer with high thermal conductivity (e.g. greater than about 150 K/mW) allows for the use of full thickness carrier wafers (e.g. >about 300 microns) with low thermal resistance, therefore no thinning of the carrier wafer is required. In another embodiment of the invention bar and die singulation is achieved with a sawing process. Sawing is a well-established process used for the singulation of LEDs and other semiconductor devices.

In an example, SiC is used as both a carrier and a submount. SiC is available in wafer diameters up to about 150 mm from multiple vendors with high thermal conductivities ranging from about 360-490 W/mK depending on the crystal polytype and impurities. FIG. 12 shows a schematic of the cross section of a SiC wafer 402 used as both a carrier wafer and a submount. Before transfer of the laser device material the SiC wafer is fabricated with a bonding layer 401 for attachment to the laser device package. The opposing face of the SiC wafer is fabricated with a thin, electrically insulating layer 403, electrically conductive traces and wire-bond pads 405 and an electrically conductive bonding media 108. The laser device material is then transferred to the carrier via previously described processes. Electrical isolation layers 408 are fabricated on the wafer using standard lithographic processes and electrical contacts and wire bond pads 407 are made to the top-side of the laser device. The electrical isolation layers are important to insure that the laser devices are electrically isolated from the laser package or heat sink, which is typically grounded to the rest of the laser system. The passivation layers can be located either between the carrier and the epitaxial die or on the side of the carrier wafer that is bonded to the package or heat sink. The individual dice can be singulated from the SiC wafer and packaged. SiC wafers are available in many polytypes including the hexagonal 4H and 6H as well as the cubic 3C. The high thermal conductivity of SiC allows for using commercially available SiC wafers as submounts without thinning. In some embodiments the insulating layer 403 is placed between the SiC substrate 402 and the bonding layer 401. This allows for the SiC wafer to be used to electrically access the die or to act as a common electrode for many die.

In one embodiment, laser dice are transferred to a carrier wafer such that the distance between die is expanded in both the transverse (i.e. normal to the laser ridge direction) as well as parallel to the laser cavities. This can be achieved, as shown in FIG. 13, by spacing bond pads on the carrier wafer with larger pitches than the spacing of laser die on the substrate. It should be noted that while technically feasible to use cleaved facets in such a configuration, etched facets would be a simpler process to implement. This is due to the need for the transferred die to be of finite length in all directions, such that cleaved facets would result in the expanded area in front of the die being removed during the cleaving process.

In another embodiment of the invention laser dice from a plurality of epitaxial wafers are transferred to the carrier wafer such that each design width on the carrier wafer contains dice from a plurality of epitaxial wafers. When transferring die at close spacings from multiple epitaxial wafers, it is important for the untransferred die on the epitaxial wafer to not inadvertently contact and bond to die already transferred to the carrier wafer. To achieve this, die from a first epitaxial wafer are transferred to a carrier wafer using the methods described above. A second set of bond pads are then deposited on the carrier wafer and are made with a thickness such that the bonding surface of the second pads is higher than the top surface of the first set of transferred die. This is done to provide adequate clearance for bonding of the die from the second epitaxial wafer. A second substrate which might contain die of a different color, dimensions, materials, and other such differences is then used to transfer a second set of die to the carrier. Finally, the laser ridges are fabricated and passivation layers are deposited followed by electrical contact layers that allow each dice to be individually driven. The die transferred from the first and second substrates are spaced at a pitch which is smaller than the second pitch of the carrier wafer. This process can be extended to transfer of die from any number of substrates, and to the transfer of any number of laser devices per dice from each substrate.

In some embodiments, multiple laser die are transferred to a single carrier wafer and placed within close proximity to each other. Dice in close proximity are preferably within one millimeter of each other, more preferably within about 200 micrometers of each other and most preferably within about 50 microns of each other. The die are also bonded such that when laser cavities and facets are fabricated the optical axes of the emitted laser beams are aligned to each other to less than about 5 degrees and more preferably less than about 1 degree and most preferably less than about 0.5 degrees. This has the advantage of simplifying the optical elements needed to couple laser light from laser devices fabricated on the several laser dice into the same system elements, e.g. lenses, fiber optic cables, etc.

As an example, laser die from a red emitting AlInGaAsP laser device wafer (emitting at a wavelength between 600 and 700 nm, but preferably between 620 and 670 nm), a green emitting GaN laser device wafer (emitting at a wavelength between 500 and 600 nm, but preferably between 510 and 550 nm) and a blue emitting GaN laser device wafer (emitting at a wavelength between 400 and 500 nm, but preferably between 430 and 470 nm) could be transferred to a single carrier wafer. Laser cavities, mirrors and electrical contacts could be processed on the die and carrier wafer using standard lithographic processes with structures similar to those described above such that laser devices on each dice are individually addressable and can be driven separately. Facets would be fabricated either with a dry etch process (e.g. RIE, ICP or CAIBE) or by cleaving the carrier wafer. After singulation, the resulting laser chip would have an effective emitter size similar to a standard laser diode device (i.e. less than about 200 microns) and would allow for red-green-blue color mixing. Such an RGB laser chip would greatly simplify the design and fabrication of a laser light source for projection and display applications. The laser devices would all be aligned to each other and closely spaced (i.e. within about 10-100 microns), thereby reducing fabrication cost by removing both the need to provide separate optical elements such as lenses and to separately align all emitters with the system optics.

In another embodiment, multiple die from multiple epitaxial wafers are transferred to the same carrier wafer with the laser die overlaid. FIG. 31 shows a schematic of the cross section of a carrier wafer during various steps in a process that achieves this. Die 502 from a first epitaxial wafer is transferred to a carrier wafer 106 using the methods described above. Laser ridges, passivation layers 104 and ridge electrical contacts 105 are fabricated on the die. Subsequently bond pads 503 are deposited overlaying the ridge electrical contacts. A second substrate 506 which might contain die of a different color, dimensions, materials, and other such differences is then used to transfer a second set of die 507 to the carrier at the same pitch as the first set of die. Laser ridges, passivation layers and ridge electrical contacts can then be fabricated on the second set of die. Subsequent die bond and laser device fabrication cycles can be carried out to produce, in effect, a multi-terminal device consisting of an arbitrary number of laser die and devices.

As an example, FIG. 33 shows various ways that three dice from the same or different substrates can be individually addressed electrically such that laser devices fabricated on each dice can be operated independently. FIGS. 33 (A) and (B) show a plan view and cross section of a single repeat unit on the carrier wafer, here called a "chip". Three electrically conductive bond pads 602 are provided for bonding dice from one or more substrates. The bond pads are connected electrically via the conductive carrier wafer to a common electrode that also serves as a bond pad for soldering to a submount, heat sink or otherwise integrating into a system. Top side electrical contacts are deposited and are extended from the laser dice to wire-bond pads 603 located in an area of the chip not containing laser dice. The metal traces and pads are isolated from the carrier wafer by an insulating layer 606. FIGS. 33 (C) and (D) show a similar chip where the bottom-side electrical contact is made from a conductive layer 604 deposited on the front side of the chip. In this example the topside electrical connections and chips are isolated by insulating layers 606 from each other as well as the carrier wafer and the bond pad on the bottom of the chip is only used for mounting and providing good thermal conductivity. FIGS. 33 (E) and (F) show a similar chip where the laser dice are connected to a common electrode on their bottom sides via the carrier wafer. In this configuration electrical access to the carrier wafer is made through a top-side wire-bond pad 604 rather than through the bottom side of the carrier wafer.

As an example, FIG. 35 shows a similar configuration of multiple laser dice transferred to a carrier wafer. FIG. 35 (A) shows a cross section of one laser chip after transfer of the lase dice 801. In this example the laser dice are longer than the laser chips with boundaries 808 and 809. Electrical contact layers 807 (shown in FIG. 35 (B)) are deposited along with electrically insulating layers 806 intended to prevent shorting of the electrical contact layers using standard lithographic techniques. A laser scriber or mechanical scribe is used as described previously to produce scribe marks 810 that initiate and guide the cleave. In this figure the scribe marks are "skip scribe marks" formed with a laser scribing tool. In other embodiments the scribes can be formed mechanically and can be formed on the back of the carrier wafer using either skip or continuous scribing. The laser chips are then cleaved into bars along the direction 808 while simultaneously forming the front and back facets of the laser cavity. The laser chips are then singulated along the direction 809 using cleaving, sawing, through-wafer laser scribing or some other like method.

In one embodiment, the multiple laser dice are bonded to a carrier wafer consisting of an insulating material and containing metal-filled through vias. FIG. 34 shows a schematic of this configuration. The through vias under the laser dice are isolated electrically from the dice by a thin insulating layer 705. Electrical contact is made via a similar set of conductive and insulating layers deposited and patterned using standard lithographic techniques. This embodiment makes it possible to produce a chip that can be attached to a package via a surface mount process, which for low power parts, where thermal considerations are not as important, would allow for integration of laser chips directly onto printed circuit boards.

In some embodiments, multiple laser die are transferred to a single carrier wafer and placed within close proximity to each other. Dice in close proximity are preferably within one millimeter of each other, more preferably within 200 micrometers of each other and most preferably within 50 microns of each other. The die are also bonded such that when laser cavities and facets are fabricated the optical axes of the emitted laser beams are aligned to each other to less than 5 degrees and more preferably less than 1 degree and most preferably less than 0.5 degrees. This has the advantage of simplifying the optical elements needed to couple laser light from lase devices fabricated on the several laser dice into the same system elements, e.g. MEMS mirror arrays, fiber optic cables, etc.

As an example, laser speckle is a phenomenon that produces a spatial variation in the brightness of a laser spot projected on a surface. Laser light is coherent, and as such when it is reflected off of a rough surface such as a projection screen the height variation in the surface of the screen can lead to spatially varying constructive and destructive interference in the laser light. This property is not desirable in systems like laser based projectors, where images formed by direct projection of a laser light will have degraded image quality. Laser speckle can be reduced by combining several laser devices into a single source. This is particularly advantageous in single mode devices where the spectral width of the laser is narrow. Several laser devices emitting at similar wavelengths (i.e. wavelength differences as large as 50 nm and as small as 1 nm) can be transferred to the same laser chip on a carrier wafer. Because laser die can be transferred from different substrates and placed in close proximity (within 10-100 microns) on the carrier wafer it is possible to select substrates such that the transferred die differ in wavelength by a desired amount while retaining a laser device—the laser chip—which functions equivalently to a single laser emitter. For example, an RGB chip consisting of six laser die could be fabricated. Two of the die would be lasers emitting blue light at peak wavelengths of 440 and 450 nm. Two of the die would emit green light at peak wavelengths of 515 and 525 nm. Two of the die would emit red light at peak wavelengths of 645 and 655 nm. As would be obvious to someone skilled in the art, wavelength pairs could be chosen to vary both the apparent color of each of the red, green and blue laser pairs while also varying the amount of speckle reduction; and increased separation in wavelength leads to an increased reduction in laser speckle.

As an example, laser die from a red emitting AlInGaAsP laser device wafer, a green emitting GaN laser device wafer and a blue emitting GaN laser device wafer could be transferred to a single carrier wafer. Laser cavities, mirrors and electrical contacts could be processed on the die and carrier wafer using standard lithographic processes with structures similar to those described above such that laser devices on each dice are individually addressable and can be driven separately. Facets would be fabricated either with a dry etch process (e.g. RIE, ICP or CAIBE) or by cleaving the carrier wafer. After singulation, the resulting laser chip would have an effective emitter size similar to a standard laser diode device (i.e. less than 200 microns) and would allow for red-green-blue color mixing. Multiple laser die for each color could be transferred from multiple substrates, allowing for engineering of the speckle of each color. Such an RGB laser chip would greatly simplify the design and fabrication of a laser light source for projection and display applications. The laser devices would be in close proximity (i.e. within 10-100 microns) leading to the need for smaller optics. The laser devices would all be aligned to each other, thereby reducing fabrication cost by removing the need to separately align all emitters with the system optics.

An example of a red, green and blue light emitting optoelectronic device of this kind is shown in FIG. 29 for laser die. This RGB laser chip consists of a carrier wafer 310, which can be composed of a number of different materials. Bonded to the carrier are three laser die 316, which each have a single laser device structure fabricated into them. The laser die are bonded to the carrier p-side down, and the bond pads form a common p-electrode 314. Electrical passivation layers (e.g. silicon dioxide, silicon nitride or the like) are deposited selectively using a lithographic process and separate n-electrodes 311, 312 and 313 are subsequently deposited. FIG. 29 shows a single laser chip after singulation, however due to the nature of the bonding process, many laser chips can be fabricated in parallel on carrier wafers of arbitrary size. The choice of the carrier wafer material is dependent on the application. In some embodiments, where optical powers for the laser devices are low (below 100 mW), Si may be chosen as the carrier wafer due to the availability of large-diameter, low-cost Si wafers. In embodiments where emitted power is large (e.g. greater than 1 W) and the thermal resistance of the device must be kept low to ensure high efficiencies, SiC would be an appropriate carrier wafer material due to the high thermal conductivity of SiC.

In some embodiments, the RGB laser or SLED chip is formed by bonding the optoelectronic die such that they partially or fully overlay one another. Such a configuration is shown in FIG. 30 for laser die. Here the ridge-side electrical contact also forms part or all of the bonding layer for the next laser die. By including passivating layers such as silicon dioxide, silicon nitride or the like current can be restricted to flow only through the ridges. This laser chip configuration can be operated as a multi-terminal device without current matching between the laser devices. This configuration has the advantage of allowing for the laser ridges to be spaced very closely in the lateral direction, and though shown in FIG. 29 with ridges that do not overlap other configurations are possible, including ones where the ridges overlay one another. For example, in a low power device with 2 micron wide ridges and 5 micron tolerances on lateral alignment of the lithographic process, it would be possible for the emitters to span a total lateral distance of less than 16 microns, or roughly 10% of a typical GaN laser die. In the same low power device, with epi die thicknesses of 2 microns and bonding layer thickness of 1 micron the vertical span of the RGB emitter would be only 8 microns total. It is unlikely that this configuration would be used for a high power part as it would be difficult to extract heat efficiently from the upper most die.

Embodiments of this invention facilitate the production of laser devices at extremely low costs relative to traditional production methods. FIG. 14 shows the process flow and material inputs for a traditional laser diode fabrication process. A substrate is provided. A laser device is grown epitaxially on the substrate. The wafer is then processed on both the epitaxial, i.e. front, and back sides to produce the laser diode ridge and electrical contacts. The wafer is then thinned to facilitate cleaving. The thinning process consumes most of the substrate, converting it into slurry. The thinned wafer is then cleaved perpendicular to the laser ridges to produce front and back facets, and the resulting linear array, or "bar", of laser devices can then be tested for quality assurance purposes and multiple bars can be stacked for coating of facets with highly reflective or anti-reflective coatings depending on the application of the laser. Finally, the laser devices are singulated from the bar and attached to a submount, which provides an electrically insulating platform for the die to sit on, allows electrical access to the substrate side of the laser device, and which is soldered or otherwise adhered to the laser packaging or heat sink.

In the traditional work flow, laser devices are processed on the epitaxial wafers at a density fixed not by the size of the laser ridge, but by the area of material needed to handle and electrically connect to the device. This results in relatively high processing costs per device, as the number of devices per wafer, especially on commercially available GaN substrates which tend to be small, is low. Moreover, after singulation of laser devices a serial pick and place process followed by a bonding process must be carried out twice; once to bond the laser die to a submount and a second time to bond the submount to the laser package.

The improved fabrication process enabled by this invention is shown in FIG. 15. A substrate is provided, which can be either a virgin substrate or one reclaimed after previous use. The epitaxial layers are grown on the substrate and then processed into die for transfer. Because the die can be bonded to a carrier at a larger pitch than they are found on the substrate, the number of die that can be prepared on the substrate is quite large. This reduces the cost of processing per die. FIG. 16 shows the number of devices that can be processed on substrate of various dimensions. The ridge length is assumed to be 1 mm, and the pitch between ridges is varied from about 50 to about 3000 microns. Practically, the pitch cannot be much smaller than about 100-150 microns as the die must be large enough to both handle and support wire bonds. As an example, on a 1 inch diameter substrate using a standard work flow, with die pitches on the order of about 150 microns nearly 3400 devices can be made. Using this epi transfer process die pitches can be shrunk to about 50 microns or less, with die width determined by the laser ridge width. As an example, for a 1 inch diameter substrate using the epi transfer work flow, with die pitches on the order of about 50 microns, over 10000 die can be made per wafer. This reduces both the cost per die for process as well as the cost per die for the epitaxial process and substrate.

When the die are transferred to a carrier wafer a certain fraction of die are transferred in each bonding step. This fraction is determined by the relative sizes of the pitch of die on the substrate (i.e. first pitch) and the pitch on the carrier (i.e. second pitch). FIG. 17 shows several examples of bonding configurations for small substrates on a 100 mm diameter round carrier wafer. This is one example of bonding configurations where the carrier wafer is not fully populated with die, though it is possible to fill the carrier more completely. For example, die from limited regions of a substrate could be bonded at the edge of the carrier, with the unbonded region of the substrate extending off the edge of the carrier. As another example, the carrier could be partially populated with mesas, and then a second set of bond pads could be patterned on the carrier with a larger thickness than the first set of bond pads, thereby providing clearance to bond in the unoccupied positions between the original bonds.

This also has a positive benefit on the cost of processing. FIG. 18 shows a table of the number of devices that can be transferred to a 100 mm diameter carrier wafer. It is assumed that the die pitch on the substrate is about 50 microns, and the die pitch on the carrier, i.e. the second pitch, is varied. It can be seen that number of devices that can be processed in parallel on a 100 mm diameter carrier when transferred from 1 inch diameter wafers is approximately 30000 when the second pitch is 150 microns. This is 10 times as high as the number of devices that can be processed on a 1 inch diameter substrate with about a 150 micron pitch. In this example, the second pitch is about 3 times as large as the first pitch, making it possible to make three transfers from the substrate to the carrier. In this example all of the die from more than one substrate could be transferred to the carrier. In some embodiments, the second pitch is around 1 mm or larger, requiring more transfers than positions available on the carrier. In another embodiment the first and second pitch are such that the number of positions available on the substrate to bond too are equal to the number of mesas on the substrate.

Once the carrier wafer is populated with die, wafer level processing can be used to fabricate the die into laser devices. For example, in many embodiments the bonding media and die will have a total thickness of less than about 10 microns, making it possible to use standard photoresist, photoresist dispensing technology and contact and projection lithography tools and techniques to pattern the wafers. The aspect ratios of the features are compatible with deposition of thin films, such as metal and dielectric layers, using evaporators, sputter and CVD deposition tools. In some embodiments front facets could be protected with thick dielectric layers while and epoxy is dispensed overlaying the laser die and carrier chip, encapsulating the laser device and sealing it from contaminants and environmental factors that might degrade performance. Here, then, you would have a truly chip-scale laser package, fabricated on a wafer level using standard semiconductor manufacturing techniques and equipment, which, once singulated from the carrier wafer, would be ready to install in a laser light system.

Moreover, the substrate can be recycled by reconditioning the surface to an epi-ready state using a combination of one or more of lapping, polishing and chemical mechanical polishing. Substrate recycling would require removal of any variation in wafer height remaining from the transfer process. This removal would be achieved by lapping the wafer surface with abrasive slurry. The abrasive media would be one or more of silica, alumina, silicon carbide or diamond. Progressively smaller particle sizes would be used to first planarize the wafer surface and then remove subsurface damage to the crystal induced by the initial removal process. Initial particle sizes in the range of about 1-10 microns could be used, followed by about 0.1-100 micron. The final step would be a chemical mechanical polish (CMP), typically comprising of colloidal silica suspended in an aqueous solution. The CMP step would restore an "epi ready" surface typically characterized by low density of crystalline defects and low RMS (<about 10 nm) roughness. Final cleaning steps may include use of a surfactant to remove residual slurry as well as cleans to remove contaminants such as exposure to acidic solutions (for example HCl, HCl:HNO$_3$, HF and the like) and exposure to solvents (for example isopropanol, methanol and acetone). We estimate a substrate could be recycled more than 10 times without significant change in thickness. In some embodiments, the epitaxial layers include thick buffers that are subsequently removed by the recycling process, thereby leaving the net thickness of the substrate unchanged.

As an example, using basic assumptions about processing and material costs, such as recycling substrates 10 times and availability of large area (i.e. greater than 2 cm$^2$) GaN substrates) it can be shown that blue-light emitting, GaN-based laser device costs below $0.50 per optical Watt and could be as low as $0.10 per optical Watt by transferring die from 4.5 cm$^2$ GaN substrates to 200 mm SiC carriers. This price is highly competitive with state of the art light emitting diodes and could enable widespread penetration of laser light sources into markets currently served by LEDs such as general lighting.

In an example, the present invention discloses Integrated Low-cost Laser-based Light Sources based on integrated arrays of high-efficiency, low-cost blue laser diodes and densified wavelength-convertors, which are capable of producing source brightness levels which exceed that of LED-based sources, while maintaining the advantages of high energy efficiency and long product lifetimes expected from solid state lighting sources. Further, lighting systems based on Integrated Low-cost Laser-based Light Sources are disclosed, which provide product performance exceeding LED-based products.

In example, we discovered that conventional GaN-based solid state lighting sources and products are limited due to source brightness, defined as the light density per unit of solid angle. With consideration of the optical concept of etendue, it is well known that the brightness cannot be increased in an optical assembly; hence the brightness or intensity of a lighting system is limited by the brightness of the source. For GaN LED light sources, there is a well-known phenomenon known as "droop" where the energy efficiency drops rapidly with an increase in input power density. Due to the difference in carrier recombination mechanism between LEDs (spontaneous emission) and laser diodes (stimulated emission), this phenomenon of efficiency droop is not seen in GaN laser diodes. This is displayed in FIG. 36 where the energy conversion efficiency is schematically illustrated for GaN-based LEDs and laser diodes. It is clear that laser diodes can achieve significantly higher conversion efficiency than LEDs when operated at high power-density. Additionally, the light emission pattern from and LED is isotropic over the surface of the device, whereas for a laser diode, the light is emitted from a small exit facet in a well-defined coherent beam. The emitting area for a laser diode is several orders of magnitude smaller, resulting in source brightness, which is several orders of magnitude higher than for LEDs. This advantage in source brightness may be maintained through an optical system, e.g. a light bulb or fixture, resulting in an inherent advantage for laser diodes.

In an example, a brief summary of wavelength conversion materials such as phosphor has been provided below for LED in reference to laser diode. For LEDs, the phosphor is as large as or larger than the LED source. For laser diode modules, the phosphor size is independent of the die size, and may be pumped from several laser diode sources. For LEDs, the phosphor is located on or around the die. The thermal dissipation is poor, or directly through the LED die. For laser diodes the phosphor is adjacent or remote the die, enabling it to be well heat sunk, enabling high input power density. For LEDs, the phosphor emits back into the LED die resulting in significant efficiency and cost trade-off. For laser diode modules, the environment of the phosphor can be independently tailored to result in high efficiency with little or no added cost. Phosphor optimization for laser diode modules can include highly transparent, non-scattering, ceramic phosphor plates. Decreased temperature sensitivity can be determined by doping levels. A reflector can be added to the backside of a ceramic phosphor, reducing loss. The phosphor can be shaped to increase in-coupling and reduce back reflections. Of course, there can be additional variations, modifications, and alternatives.

In an example, the present invention provides a laser-based light module containing one or more low-cost laser diodes; one or more wavelength conversion elements; and a common substrate providing electrical and thermal connections between the laser diodes and the wavelength conversion element. In an example, the low-cost laser diodes are composed of epitaxial material which contains GaN, AlN, InN, InGaN, AlGaN, InAlGaN, AlInGaN, combinations thereof, and the like. In an example, the emission wavelength of the low-cost laser diode is in the range of 200 nm and 520 nm, among others.

In an example, the preferred emission wavelength of the low-cost laser diode is in the range of 440 nm and 460 nm. In an example, the wavelength conversion element is phosphor material. In an example, the wavelength conversion element is a phosphor, which contains garnet host material and a doping element. In an example, the wavelength conversion element is a phosphor, which contains a yttrium aluminum garnet host material and a rare earth doping element, and others. In an example, the wavelength conversion element is a phosphor which contains a rare earth doping element, selected from one or more of Ce, Nd, Er, Yb, Ho, Tm, Dy and Sm, combinations thereof, and the like. In an example, the wavelength conversion element is a high-density phosphor element. In an example, the wavelength conversion element is a high-density phosphor element with density greater than 90% of pure host crystal.

In an example, the light emitted from the one or more low-cost laser diodes is partially converted by the wavelength conversion element. In an example, the partially converted light emitted generated in the wavelength conversion element results in a color point, which is white in appearance.

In an example, the color point of the white light is located on the Planckian blackbody locus of points. In an example, the color point of the white light is located within du'v' of less than 0.010 of the Planckian blackbody locus of points. In an example, the color point of the white light is preferably located within du'v' of less than 0.03 of the Planckian blackbody locus of points.

In an example, the common substrate is a solid material with thermal conductivity greater than 100 W/m-K. In an example, the common substrate is preferably a solid material with thermal conductivity greater than 200 W/m-K. In an example, the common substrate is preferably a solid material with thermal conductivity greater than 400 W/m-K. In an example, the common substrate is preferably a solid material with electrical insulator with electrical resistivity greater than 1×10^6 ohm-cm. In an example, the common substrate is preferably a solid material with thin film material providing electrical 1×10^6 ohm-cm. In an example, the common substrate selected from one or more of Al2O3, AlN, SiC, BeO and diamond. In an example, the common substrate is preferably comprised of crystalline SiC. In an example, the common substrate is preferably comprised of crystalline SiC with a thin film of Si3N4 deposited onto the top surface. In an example, the common substrate contains metal traces providing electrically conductive connections between the one or more low-cost laser diodes. In an example, the common substrate contains metal traces providing thermally conductive connections between the one or more low-cost laser diodes and the common substrate.

In an example, the one or more low-cost laser diodes are attached to the metal traces on the common substrate with a solder material. In an example, the one or more low-cost laser diodes are attached to the metal traces on the common substrate with a solder material, preferably chosen from one or more of AuSn, AgCuSn, PbSn, or In.

In an example, the wavelength conversion material is attached to the metal traces on the common substrate with a solder material. In an example, the wavelength conversion material is attached to the metal traces on the common substrate with a solder material, preferably chosen from one or more of AuSn, AgCuSn, PbSn, or In.

In an example, the one or more low-cost laser diodes and the wavelength conversion material is attached to the metal traces on the common substrate with a similar solder material, preferably chosen from one or more of AuSn, AgCuSn, PbSn, or In. In an example, two or more low-cost laser diodes are attached to the common substrate with the diodes arranged in an electrically series manner. In an example, the wavelength conversion element contains an optically reflective material interposed between the wavelength conversion element and the thermally conductive connection to the metal traces on the common substrate.

In an example, the optically reflective material interposed between the wavelength conversion element and the thermally conductive connection to the metal traces on the common substrate has a reflectivity value of greater than 50%.

In an example the optically reflective material interposed between the wavelength conversion element and the thermally conductive connection to the metal traces on the common substrate has a reflectivity value of greater than 80%. In an example, the optically reflective material interposed between the wavelength conversion element and the thermally conductive connection to the metal traces on the common substrate has a reflectivity value of greater than 90%. In an example, the optical beam shaping elements are placed between the low-cost laser diodes and the wavelength conversion element.

In an example, the wavelength conversion element contains geometrical features aligned to each of the one or more low-cost laser diodes. In an example, the wavelength conversion element further contains an optically reflective material on the predominate portion of the edges perpendicular to the common substrate and one or more low-cost laser diodes, and where the geometrical features aligned to each of the low-cost laser diodes does not contain an optically reflective material. In an example, the common substrate is optically transparent. In an example, the wavelength conversion element is partially attached to the transparent common substrate. In an example, the wavelength converted light is directed through the common substrate. In an example, the wavelength converter contains an optically reflective material on at least the top surface. In an example, the one or more low-cost laser diodes and the wavelength conversion element are contained within a sealing element to reduce the exposure to the ambient environment. In an example, the one or more low-cost laser diodes and the wavelength conversion element are contained within a sealing element to reduce the exposure to the ambient environment.

In an example, the solid-state lighting element containing at least a laser-based light module has a beam shaping element. In an example, the beam shaping element provides an optical beam where greater than 80% of the emitted light is contained within an emission angle of 30 degrees. In an example, the beam shaping element provides an optical beam where greater than 80% of the emitted light is preferably contained within an emission angle of 10 degrees. In an example, the form is within the commonly accepted standard shape and size of existing MR, PAR and AR111 lamps. In an example, the solid-state lighting element further contains an integrated electronic power supply to electrically energize the laser-based light module. In an example, the solid-state lighting element further contains an integrated electronic power supply with input power within the commonly accepted standards. Of course, there can be other variations, modifications, and alternatives.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero). As used herein, the term substrate is associated with both GaN substrates as well as substrates on which can be grown epitaxially GaN, InGaN, AlGaN, or other Group III containing alloys or compositions that are used as starting materials. Such substrates include SiC, sapphire, silicon and germanium, among others. Substrate may also refer to substrates on which can be grown epitaxially GaAs, AlAs, InAs, GaP, AlP, InP, or other like Group III containing alloys or compositions that are used as starting materials. Such substrates include GaAs, GaP, Ge and Si, among others.

As used herein, the terms carrier or carrier wafer refer to wafer to which epitaxial device material is transferred. The carrier may be composed of a single material and be either single crystalline or polycrystalline. The carrier may also be a composite of multiple materials. For example, the carrier could be a silicon wafer of standard dimensions, or it could be composed of polycrystalline AlN.

As used herein, the term submount refers to material object to which a laser device is bonded in order to facilitate packaging, bonding to a heat sink and electrical contact. The submount is separate from the substrate, carrier wafer and package or heat sink.

As shown, the present device can be enclosed in a suitable package. Such package can include those such as in TO-38 and TO-56 headers. Other suitable package designs and methods can also exist, such as TO-9 or flat packs where fiber optic coupling is required and even non-standard packaging. In a specific embodiment, the present device can be implemented in a co-packaging configuration.

In other embodiments, the present laser device can be configured in a variety of applications. Such applications include laser displays, metrology, communications, health care and surgery, information technology, and others. As an example, the present laser device can be provided in a laser display such as those described in U.S. Ser. No. 12/789,303 filed May 27, 2010, which claims priority to U.S. Provisional Nos. 61/182,105 filed May 29, 2009 and 61/182,106 filed May 29, 2009, each of which is hereby incorporated by reference herein.

While the above is a full description of the specific embodiments, various modifications, alternative constructions and equivalents may be used. As an example, the packaged device can include any combination of elements described above, as well as outside of the present specification. As used herein, the term "substrate" can mean the bulk substrate or can include overlying growth structures such as a gallium and nitrogen containing epitaxial region, or functional regions such as n-type GaN, combinations, and the like. Additionally, the examples illustrates two waveguide structures in normal configurations, there can be variations, e.g., other angles and polarizations.

REFERENCES

1. Holder, C., Speck, J. S., DenBaars, S. P., Nakamura, S. & Feezell, D. Demonstration of Nonpolar GaN-Based Vertical-Cavity Surface-Emitting Lasers. *Appl. Phys. Express* 5, 092104 (2012).
2. Tamboli, A. Photoelectrochemical etching of gallium nitride for high quality optical devices. (2009). at <http://adsabs.harvard.edu/abs/2009PhDT . . . 68T>
3. Yang, B. MICROMACHINING OF GaN USING PHOTOELECTROCHEMICAL ETCHING. (2005).
4. Sink, R. Cleaved-Facet Group-III Nitride Lasers. (2000). at <http://siliconphotonics.ece.ucsb.edu/sites/default/files/publications/2000 Cleaved-Faced Group-III Nitride Lasers.PDF>
5. Bowers, J., Sink, R. & Denbaars, S. Method for making cleaved facets for lasers fabricated with gallium nitride and other noncubic materials. U.S. Pat. No. 5,985,687 (1999). at <http://www.google.com/patents?hl=en&lr=&vid=USPAT5985687&id=no8XAAAAEB AJ&oi=fnd&dq=Method+for+making+cleaved+facets+for+lasers+fabricated+with+galli um+nitride+and+other+noncubic+material s&printsec=ab stract>
6. Holder, C. O., Feezell, D. F., Denbaars, S. P. & Nakamura, S. Method for the reuse of gallium nitride epitaxial substrates. (2012).
7. Hjort, K. Jour. Micromech. Microeng. 6 (1996) 370-375

What is claimed is:

1. An intermediate device structure comprising:
   a gallium and nitrogen containing substrate having a surface region;
   an epitaxial material overlying the surface region, the epitaxial material comprising a release material, an active region comprising at least one quantum well layer, and an interface region overlying the active region;
   a plurality of dies each comprising the epitaxial material such that each pair of adjacent dies is separated by a first pitch, wherein a lateral width of a release region formed by the release material in each die is narrower than a lateral width of immediately adjacent layers above and below the release region to provide undercut regions bounding each side of the release region; and
   a carrier substrate having a plurality of bonding material regions thereon such that each pair of adjacent bonding material regions is separated by a second pitch;
   wherein the interface region associated with each of the plurality of dies is bonded to corresponding bonding material regions on the carrier substrate to provide bonded dies; and
   wherein the release material of the bonded dies is configured to release the bonded dies from the gallium and nitrogen containing substrate such that at least a pair of adjacent transferred dies is configured with the second pitch on the carrier substrate that is different from the first pitch.

2. The intermediate device structure of claim 1, wherein the second pitch is larger than the first pitch.

3. The intermediate device structure of claim 1, wherein the interface region is comprised of metal, a semiconductor, or an oxide; wherein the interface region comprises a contact material; and wherein the release material is selected from GaN, InGaN, AlInGaN, or AlGaN.

4. The intermediate device structure of claim 1, wherein each die is shaped as a mesa, and the first pitch is between 1 μm and 10 μm, or between 10 micron and 50 microns, or between 50 μm and 100 μm; and a length of each die is between 50 μm and 3000 μm; and wherein the second pitch on the carrier substrate is between 50 microns and 200 microns, or between 200 microns and 500 microns, or between 500 microns and 1000 microns, or greater than 1000 microns.

5. The intermediate device structure of claim 1, further comprising one or multiple laser diode cavities on each of the transferred dies.

6. The intermediate device structure of claim 1, wherein the carrier substrate has a larger diameter than the gallium and nitrogen containing substrate; and wherein the interface region is at least one of a metal-metal pairs, oxide-oxide pairs, spin-on-glass, soldering alloys, polymers, photoresists, or wax.

7. The intermediate device structure of claim 1, wherein the carrier substrate is selected from a silicon wafer, a gallium arsenide wafer, an indium phosphide wafer, a silicon carbide wafer, an aluminum nitride wafer, a sapphire wafer, a diamond wafer, or a gallium nitride wafer.

8. The intermediate device structure of claim 1, wherein each of the transferred dies comprises one or more components, the one or more components being selected from at least one of an electrical contact, a current spreading region, an optical cladding region, a laser ridge, a laser ridge passivation, or a pair of facets, either alone or in any combination.

9. The intermediate device structure of claim 1, further comprising a transparent conductive oxide (TCO) layer above and/or below the active region configured to provide an optical guiding effect.

10. The intermediate device structure of claim 1, further comprising a reflective metal such as silver, aluminum, or gold above and/or below the active region configured to provide an optical guiding effect.

11. An intermediate device structure comprising:
    a gallium and nitrogen containing substrate having a surface region;
    an epitaxial material overlying the surface region, the epitaxial material comprising a release material, an active region comprising at least one quantum well layer, a first transparent conductive oxide material, and an interface region overlying the active region;
    a plurality of dies each comprising the epitaxial material such that each pair of adjacent dies is separated by a first pitch; and
    a carrier substrate having a plurality of bonding material regions thereon such that each pair of adjacent bonding material regions is separated by a second pitch;
    wherein the interface region associated with each of the plurality of dies is bonded to corresponding bonding material regions on the carrier substrate to provide bonded dies; and
    wherein the release material of the bonded dies is configured to release the bonded dies from the gallium and nitrogen containing substrate such that at least a pair of adjacent transferred dies is configured with the second pitch on the carrier substrate that is different from the first pitch.

12. The intermediate device structure of claim 11, wherein the at least one quantum well layer is characterized by an internal polarization field; wherein the release material, the active region, and the interface region are characterized by a total thickness of less than 1.5 micron, less than 1 micron, or less than 0.5 micron.

13. The intermediate device structure of claim 11, wherein each die further comprises a ridge structure, a dielectric material overlying the ridge structure, and a second transparent conductive oxide material overlying an exposed portion of the ridge structure such that the active region is disposed between the first transparent conductive oxide material and the second conductive oxide material, and the first transparent conductive oxide material and the second conductive oxide material are configured to provide an optical guiding effect within the active region.

14. The intermediate device structure of claim 11, further comprising:
an n-type contact region overlying the release material;
a patterned transparent oxide region overlying a portion of the n-type contact region; and
a metal material overlying the patterned transparent oxide region; and wherein the patterned transparent oxide region is comprised of indium tin oxide or zinc oxide.

15. The intermediate device structure of claim 11, wherein each die further comprises a ridge structure, a dielectric material overlying the ridge structure, and a reflective n-contact overlying the ridge structure such that the active region is disposed between the first transparent conductive oxide material and the reflective n-contact, and the first transparent conductive oxide material and the reflective n-contact are configured to provide an optical guiding effect within the active region.

16. The intermediate device structure of claim 11, further comprising a second transparent conductive oxide material, wherein the active region is disposed between the first transparent conductive oxide material and the second transparent conductive oxide material, the first transparent conductive oxide material and the second transparent conductive oxide material configured to provide an optical guiding influence.

17. The intermediate device structure of claim 11, wherein the release material is configured as an anchor region.

18. The intermediate device structure of claim 11, wherein the interface region is comprised of metal, a semiconductor, or an oxide; wherein the interface region comprises a contact material; and wherein the release material is selected from GaN, InGaN, AlInGaN, or AlGaN.

* * * * *